United States Patent
Cheng et al.

(10) Patent No.: US 11,227,955 B2
(45) Date of Patent: Jan. 18, 2022

(54) SEMICONDUCTOR DEVICE AND METHOD OF MANUFACTURING THE SAME

(71) Applicant: Taiwan Semiconductor Manufacturing Co., Ltd., Hsinchu (TW)

(72) Inventors: Chao-Ching Cheng, Hsinchu (TW); Chun-Chieh Lu, Taipei (TW); Hung-Li Chiang, Taipei (TW); Tzu-Chiang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 66 days.

(21) Appl. No.: 16/578,389

(22) Filed: Sep. 22, 2019

(65) Prior Publication Data

US 2021/0091229 A1    Mar. 25, 2021

(51) Int. Cl.
*H01L 29/786* (2006.01)
*H01L 29/66* (2006.01)

(52) U.S. Cl.
CPC .. *H01L 29/78675* (2013.01); *H01L 29/66757* (2013.01); *H01L 29/78684* (2013.01)

(58) Field of Classification Search
CPC ......... H01L 29/78675; H01L 29/66757; H01L 29/78684
See application file for complete search history.

(56) References Cited

U.S. PATENT DOCUMENTS 6,410,373 B1 * 6/2002 Chang ............... H01L 29/66757
257/E21.413
2018/0197996 A1 * 7/2018 Liu .................... H01L 29/78642

* cited by examiner

*Primary Examiner* — Christine A Enad
(74) *Attorney, Agent, or Firm* — JCIPRNET

(57) ABSTRACT

A semiconductor device includes a substrate, a first poly-material pattern, a first conductive element, a first semiconductor layer, and a first gate structure. The first poly-material pattern is over and protrudes outward from the substrate, wherein the first poly-material pattern includes a first active portion and a first poly-material portion joined to the first active portion. The first conductive element is over the substrate, wherein the first conductive element includes the first poly-material portion and a first metallic conductive portion covering at least one of a top surface and a sidewall of the first poly-material portion. The first semiconductor layer is over the substrate and covers the first active portion of the first poly-material pattern and the first conductive element. The first gate structure is over the first semiconductor layer located within the first active portion.

12 Claims, 41 Drawing Sheets

US 11,227,955 B2

SEMICONDUCTOR DEVICE AND METHOD OF MANUFACTURING THE SAME

BACKGROUND

As the semiconductor devices keeps scaling down in size, the performance scalability of current semiconductor devices (e.g. silicon-based transistors) is reaching fundamental limits despite the implementation of various enhancement techniques. Alternative semiconductor materials, such as Ge and III-V semiconductor materials, are being considered, but the ultra-thin body performance scalability of these relatively costly materials remains a challenge.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
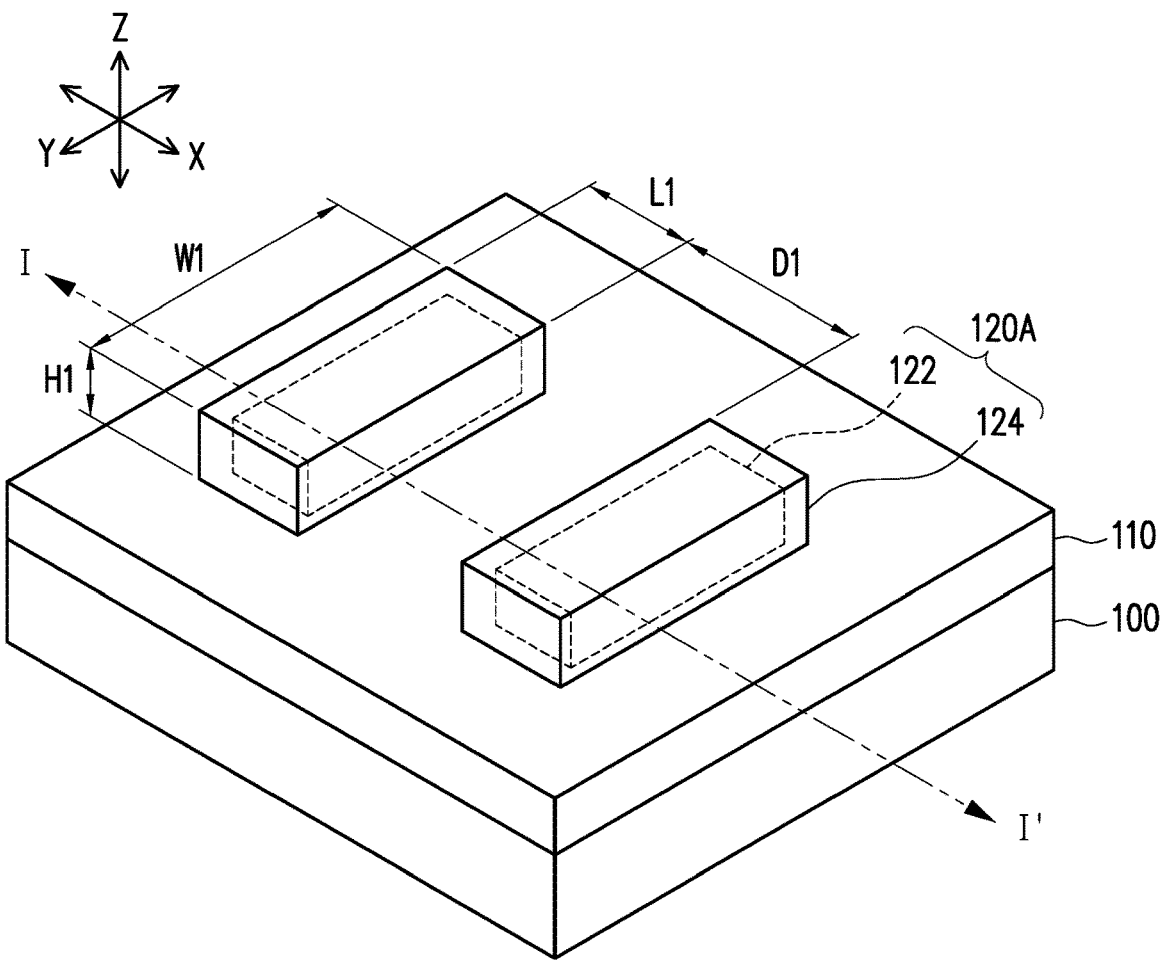
FIG. 1A to FIG. 1C are schematic perspective views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

The embodiments of the disclosure describe the exemplary manufacturing process of one or more transistors having a planar-like structure or a fin-like structure and incorporating 2-dimensional (2D) layered channel materials and the transistors fabricated there-from. In the disclosure, the transistors are referred to as semiconductor devices herein. The transistors may be formed on bulk silicon substrates in certain embodiments of the disclosure. Still, the transistors may be formed on a silicon-on-insulator (SOI) substrate as alternatives. Also, in accordance with the embodiments, the silicon substrate may include other conductive layers or other semiconductor elements, such as diodes, other types of transistors, or the like. The embodiments are not limited in this context. And, the embodiments are intended to provide further explanations but are not used to limit the scope of the disclosure.

Figure 2A:
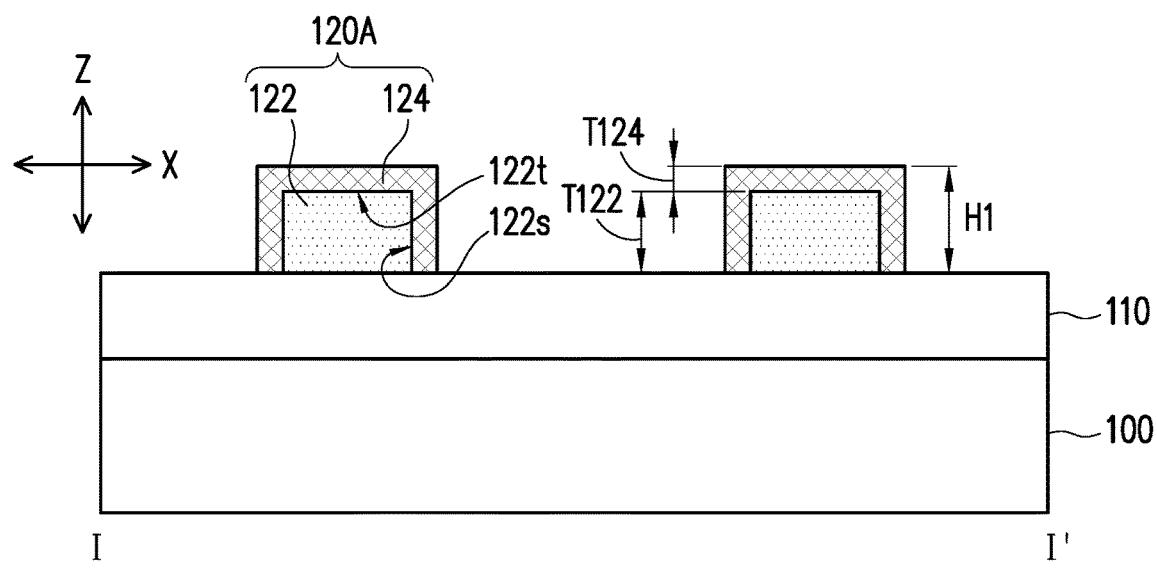
FIG. 2A to FIG. 2C are schematic cross-sectional views of various stages in a manufacturing method of a semiconductor device in accordance with some embodiments of the disclosure.
Figure 1B:
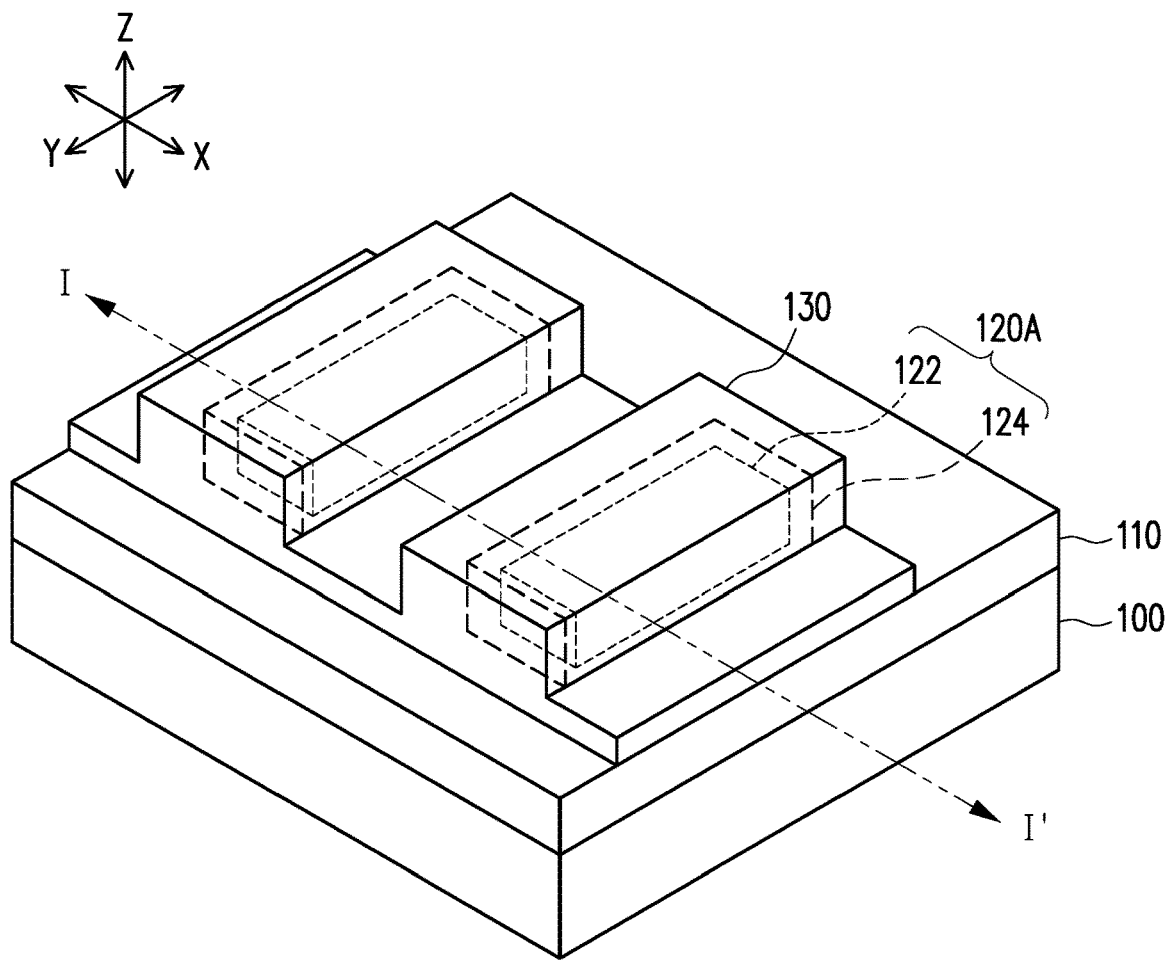
Figure 2B:
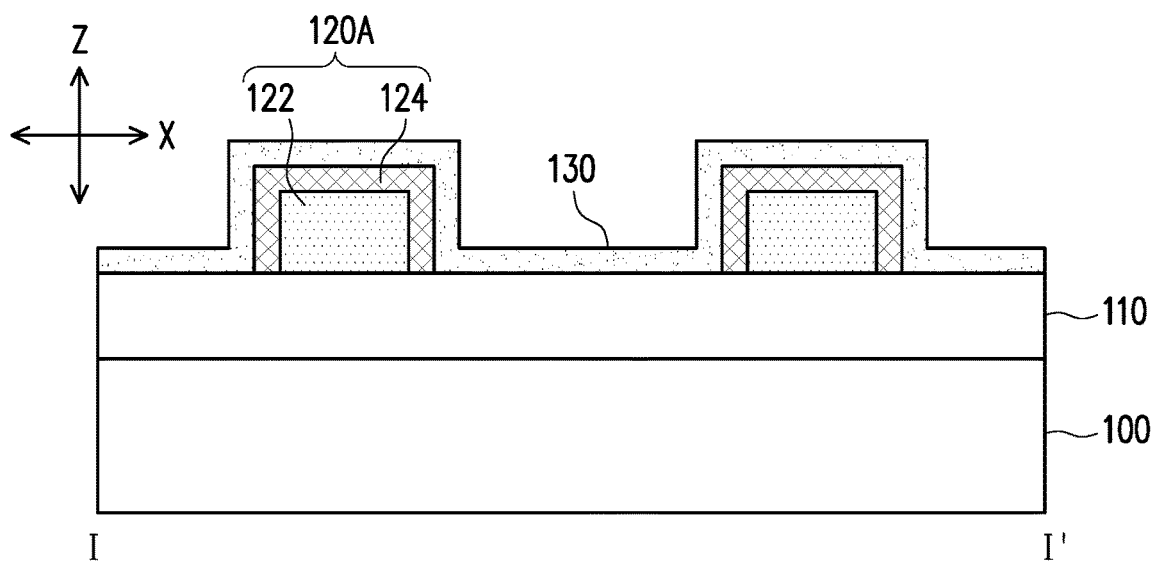
Figure 1C:
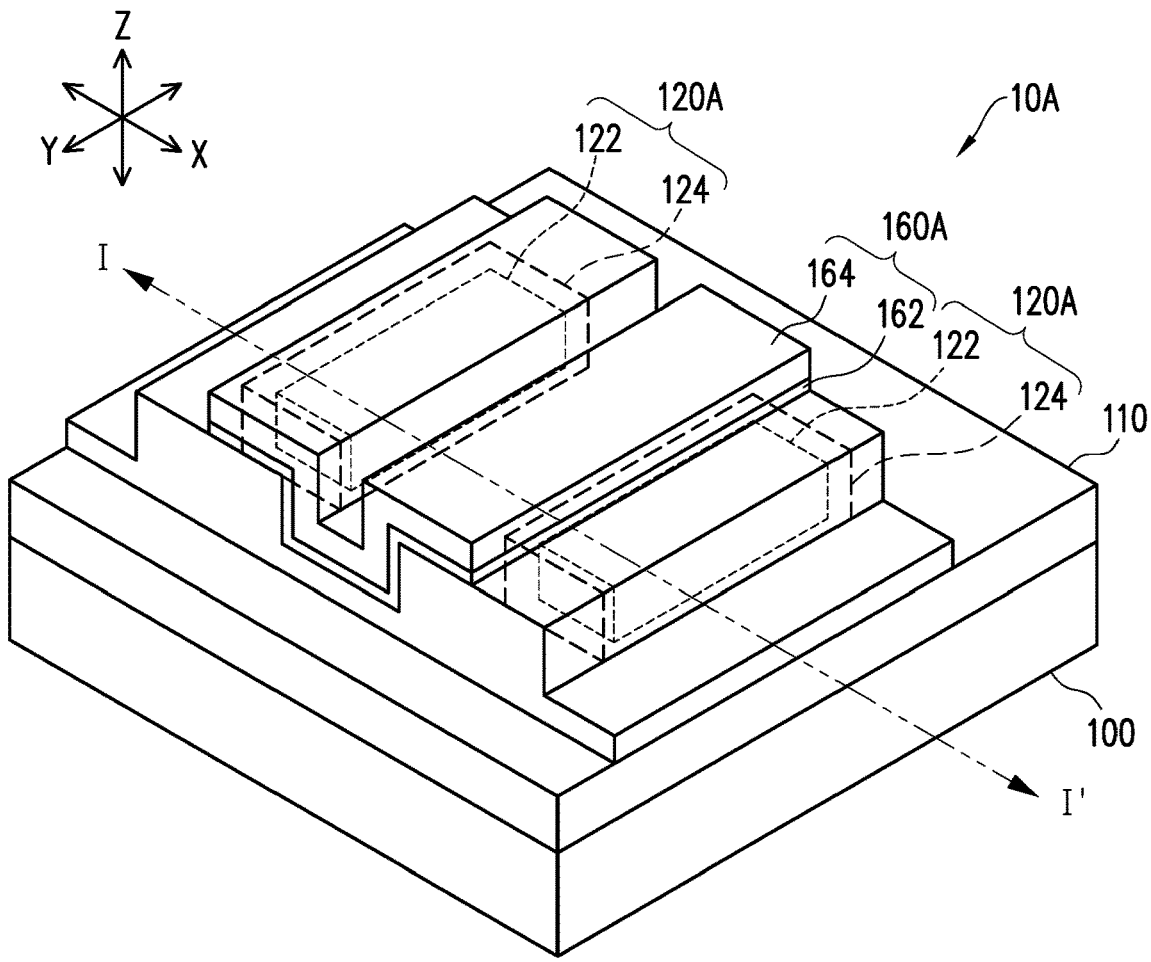
Figure 2C:
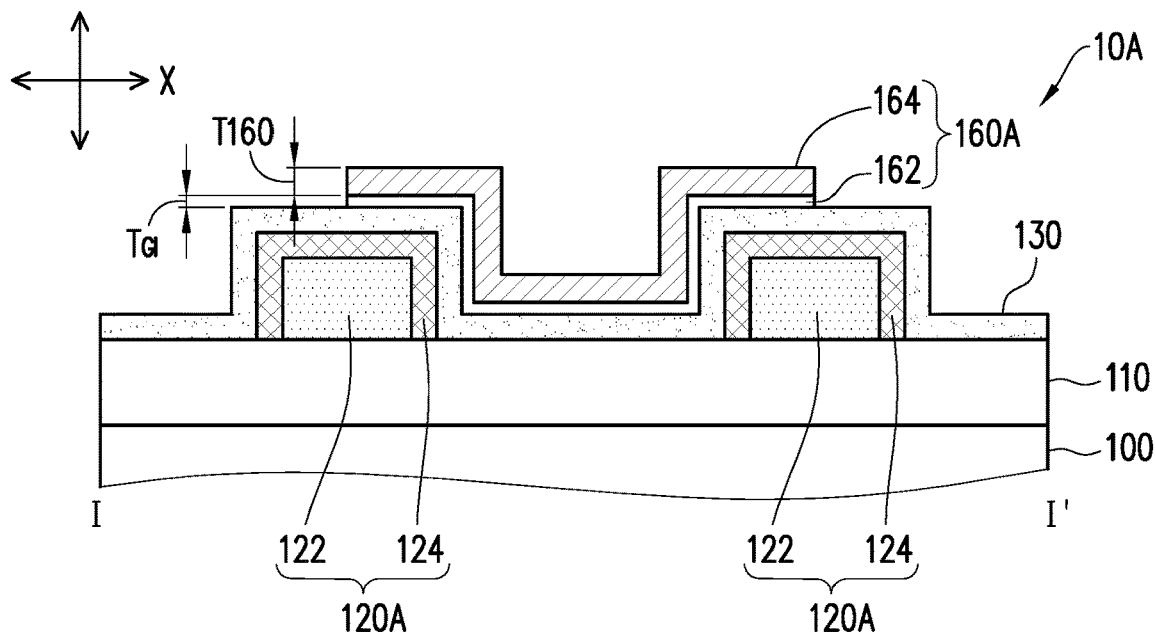
Figure 3:
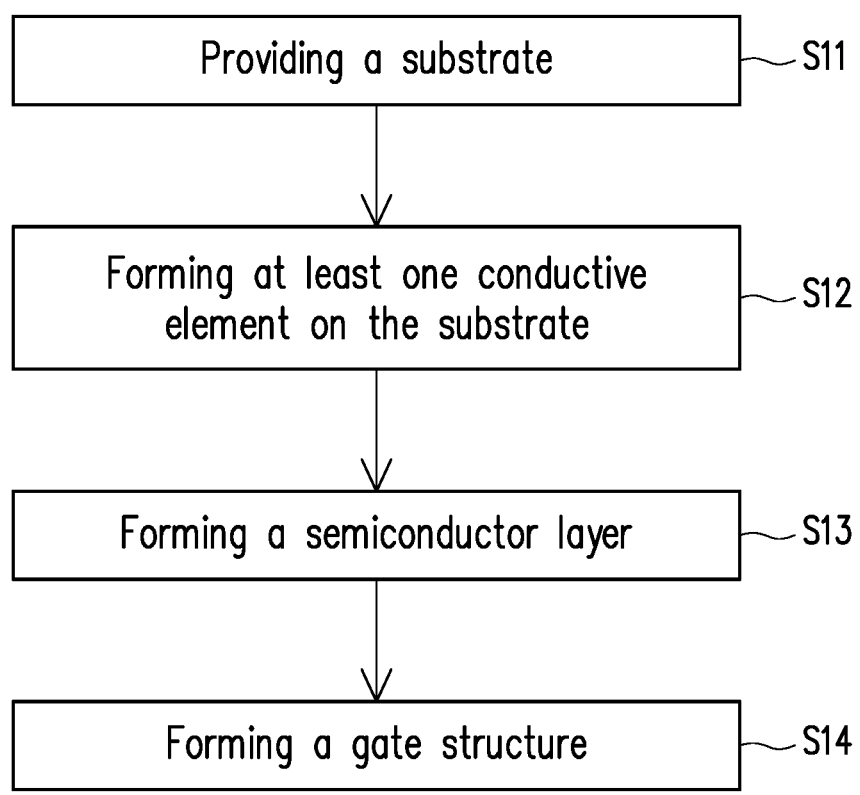
FIG. 3 is a flow chart illustrating a method of manufacturing a semiconductor device in accordance with some embodiments of the disclosure.
Figure 4A:
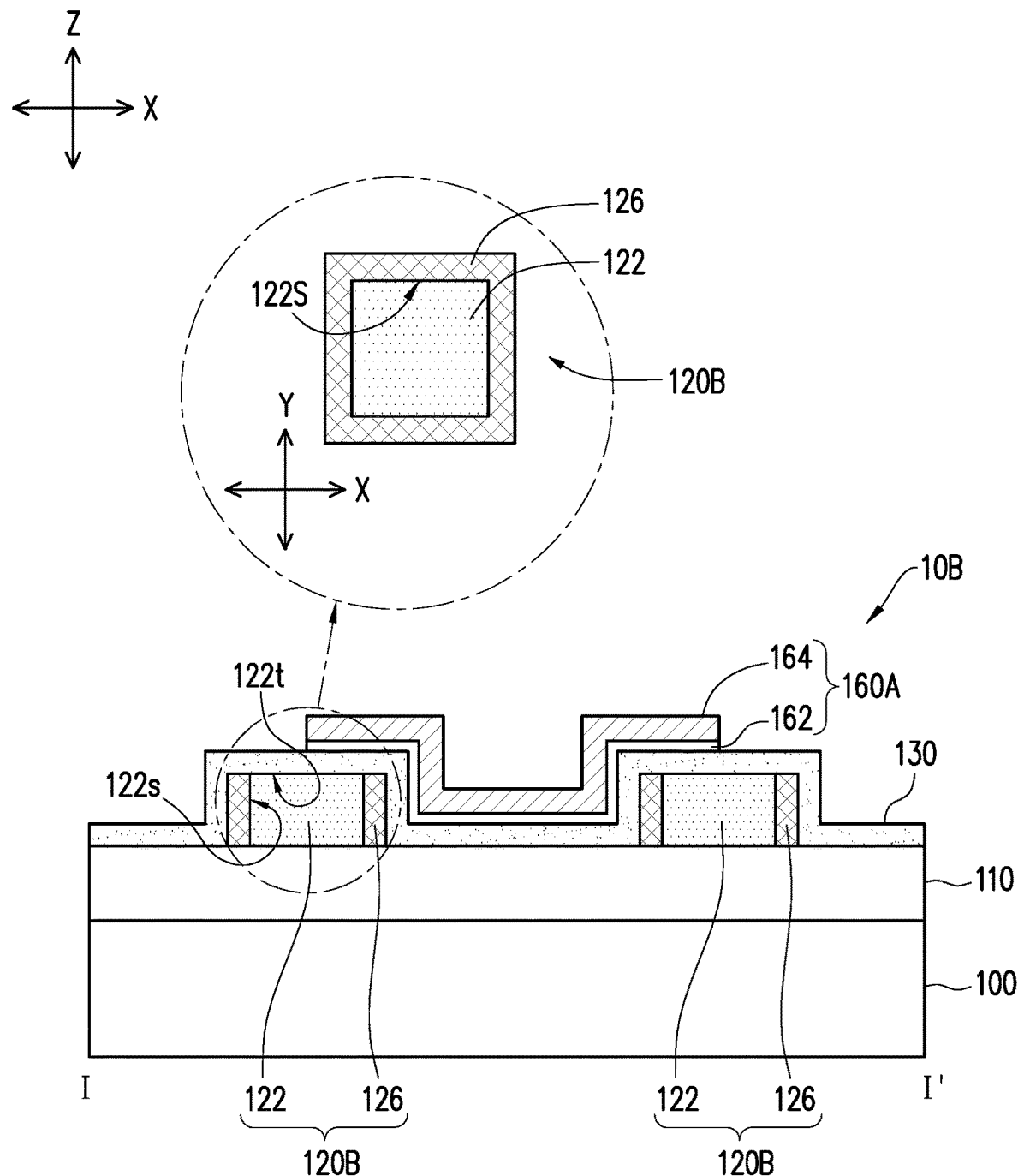
FIG. 4A to FIG. 4B are schematic cross-sectional views of a semiconductor device in accordance with some embodiments of the disclosure.
Figure 4B:
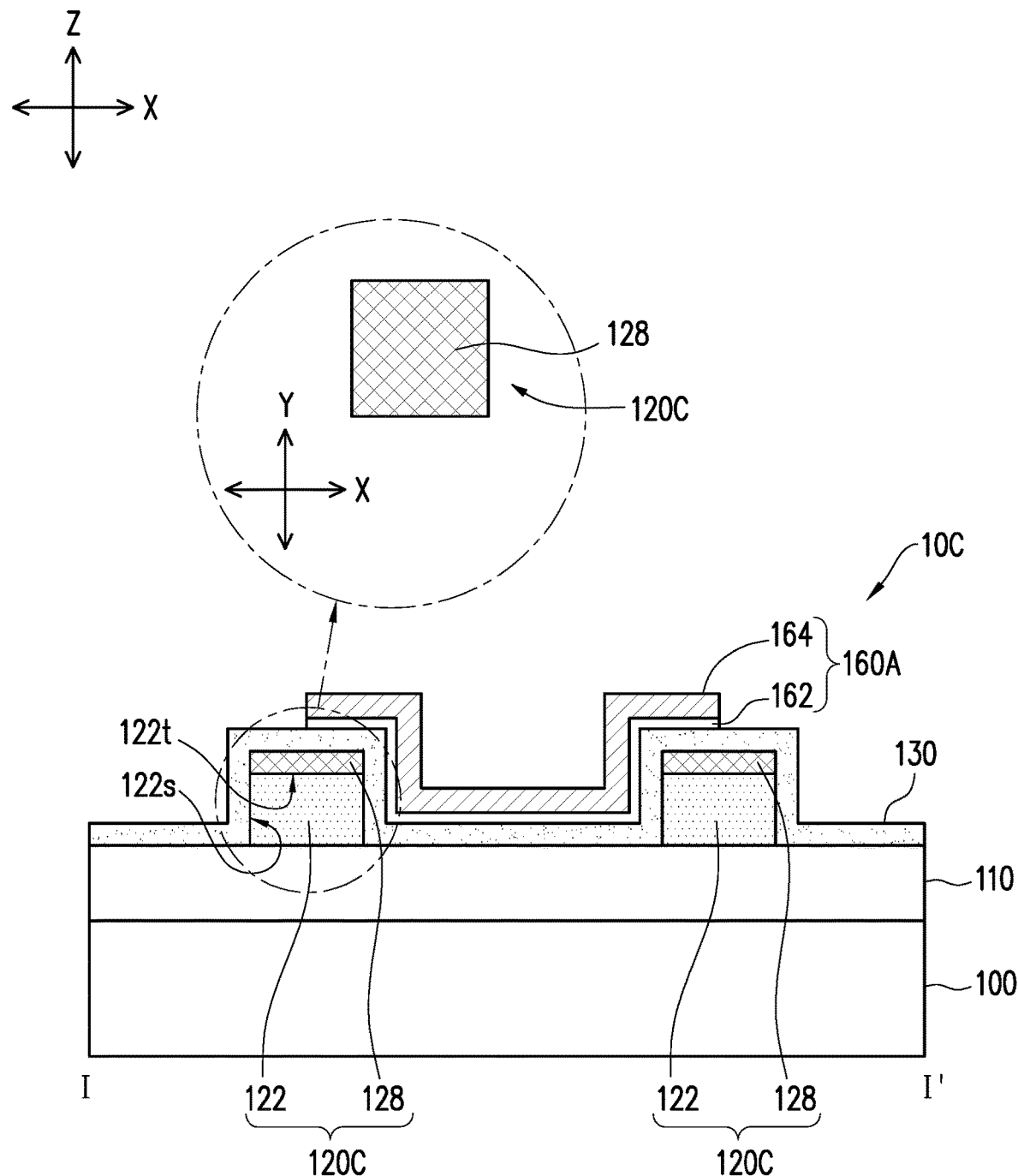

FIG. 1A to FIG. 1C are schematic perspective views of various stages in a manufacturing method of a semiconductor device 10A in accordance with some embodiments of the disclosure. FIG. 2A to FIG. 2C are schematic cross-sectional views of the semiconductor device 10A respectively taken along a cross-sectional line I-I' depicted in FIG. 1A to FIG. 1C. FIG. 3 is a flow chart illustrating a method of manufacturing a semiconductor device in accordance with some embodiments of the disclosure. FIG. 4A to FIG. 4B each are a schematic cross-sectional view of a semiconductor device in accordance with some embodiments of the disclosure. In FIG. 1A to FIG. 1C and FIG. 2A to FIG. 2C, one transistor (e.g. the semiconductor device 10A) is shown to represent plural transistors obtained following the manufacturing method, however the disclosure is not limited thereto. In other embodiments, more than one transistors are shown to represent plural transistors obtained following the manufacturing method.

Referring to FIG. 1A and FIG. 2A, in some embodiments, a substrate 100 is provided, in accordance with step S11 of FIG. 3. In some embodiments, the substrate 100 may be referred to as a semiconductor substrate. In certain embodiments, the substrate 100 includes a silicon (Si) substrate. For example, the silicon substrate may include a bulk silicon substrate, such as a bulk substrate of monocrystalline silicon, a doped silicon substrate, or an undoped silicon substrate, where the dopant of the doped silicon substrate may be an N-type dopant, a P-type dopant or a combination thereof depending on design requirements (e.g., p-type semiconductor substrate or n-type semiconductor substrate). The disclosure is not limited thereto. For example, the doped regions may be doped with p-type dopants, such as boron (B) or BF2; n-type dopants, such as phosphorus (P) or arsenic (As); and/or combinations thereof, where the doped regions may be configured for an n-type semiconductor device, or alternatively configured for a p-type semiconductor device.

In alternative embodiments, the substrate 100 may be made of some other suitable elemental semiconductors, such as diamond or germanium (Ge); a suitable compound semiconductor, such as gallium arsenide (GaAs), silicon carbide (SiC), indium arsenide (InAs), or indium phosphide (InP); or a suitable alloy semiconductor, such as silicon germanium carbide (SiGeC), gallium arsenic phosphide (GaAsP)), or gallium indium phosphide (GaInP). In further alternative embodiments, the substrate 100 may be made of some other suitable metal oxides, such as indium tin oxide (ITO) and indium zinc oxide (IZO). In other alternative embodiments, the substrate 100 may be made of non-conductive materials, such as a glass carrier or a sapphire wafer. The disclosure is not limited thereto.

As illustrated in FIG. 1A and FIG. 2A, in some embodiments, a dielectric layer 110 is formed on the substrate 100, where the substrate 100 is not accessibly revealed by the dielectric layer 110. In certain embodiments, the dielectric layer 110 may be a silicon oxide layer (e.g. $SiO_2$), a silicon nitride layer, a silicon oxy-nitride layer, or a dielectric layer formed by other suitable dielectric materials.

In alternative embodiments, the dielectric layer 110 may be a high dielectric constant (high-k) material layer, where high-k refers to a dielectric constant that is greater than the dielectric constant of $SiO_2$ (i.e., greater than 3.9). For example, the dielectric layer 110 may be made of $Al_2O_3$, $HfO_2$, or the like. In further alternative embodiments, the dielectric layer 110 may be a layer consisting of two-dimensional (2D) insulator materials. For example, the dielectric layer 110 may be made of hexagonal boron nitride (h-BN), BiCN, or the like. In some embodiments, the dielectric layer 110 may be formed by deposition or the like. The disclosure is not limited thereto. In some embodiments, the substrate 100 and the dielectric layer 110 may be together considered as a SOI substrate.

Continued on FIG. 1A and FIG. 2A, in some embodiments, at least one conductive element is disposed on the dielectric layer 110 and over the substrate 100, in accordance with step S12 of FIG. 3. For illustration purpose, the at least one conductive element includes two conductive elements 120A as shown in FIG. 1A and FIG. 2A. However, the disclosure is not limited thereto; in an alternative embodiment, the number of the at least one conductive element 120A may include one conductive element 120A or more than two conductive elements 120A. As shown in FIG. 1A and FIG. 2A, for example, the dielectric layer 110 is sandwiched between the substrate 100 and the conductive elements 120A along a direction Z.

In FIG. 1A, for example, the conductive elements 120A are arranged into a row along a direction X. In some embodiments, the conductive elements 120A each has a length L1 ranging approximately from 5 nm to 500 nm along the direction X, a width W1 ranging approximately from 50 nm to 500 nm along a direction Y, and a height H1 ranging approximately from 30 nm to 300 nm along the direction Z (e.g. a stacking direction of the substrate 100, the dielectric layer 110 and the conductive elements 120A). The direction X and the direction Y are different from each other, and the direction X and the direction Y each are perpendicular to the direction Z. In one embodiment, the direction X is perpendicular to the direction Y. In some embodiments, along the direction X, the two conductive elements 120A are spaced apart to each other with a distance D1 therebetween, where the distance D1 is approximately ranging from 5 nm to 10 µm. Due to the dielectric layer 110 is sandwiched between the substrate 100 and the conductive elements 120A along the direction Z, current leakage between the substrate 100 and the conductive elements 120A in the semiconductor device 10A can be suppressed.

However, the disclosure is not limited thereto; in alternative embodiments, the conductive elements 120A may be arranged into a row along the direction Y. In other words, the conductive elements 120A may be arranged into row(s) or column(s) on a X-Y plane depending on the demand or design layout.

In some embodiments, as shown in FIG. 2A, the conductive elements 120A each include an inner portion 122 and an outer portion 124 connecting the inner portion 122. For example, for each conductive element 120A, the outer portion 124 is located on the inner portion 122, where a top surface 122t and a sidewall 122s of the inner portion 122 are covered by the outer portion 124. That is, the inner portions 122 are at least partially covered by the outer portions 124, respectively, in certain embodiments. In some embodiments, one of the inner portions 122 is located between the dielectric layer 110 and one overlying outer portion 124. As shown in FIG. 1A and FIG. 2A, for each conductive element 120A, the inner portion 122 is electrically connected to the outer portion 124.

In some embodiments, the inner portions 122 each include a semiconductor pattern (e.g. in a form of a block). For example, the inner portions 122 may be made of polysilicon materials (such as doped polysilicon), poly-germanium materials (such as doped poly-germanium), poly-silicon-germanium materials (such as doped poly-silicon-germanium), or the like. For example, the dopant may include p-type dopants, such as boron (B) or BF2 or n-type dopants, such as phosphorus (P) or arsenic (As), and the doping concentration is approximately in a range of 1E20 $cm^{-3}$ to 1E22 $cm^{-3}$. If the concentration is lower than 1E20 $cm^{-3}$, the contact resistance becomes higher, which leads to performance degradation of the semiconductor device. If the concentration is higher than 1E22 $cm^{-3}$, the dopant diffuses into a channel region of the semiconductor device, which causes contamination issue(s) to the semiconductor device as well as the performance degradation. The inner portions 122 may be formed by deposition and patterning processes, in some embodiments. For example, the formation of the inner portions 122 may include, but not limited to, forming a blanket layer of a polysilicon material covering the dielectric layer 110 and patterning the polysilicon material blanket layer into separated and individual semiconductor patterns (blocks) to form the inner portions 122. The patterning process may include photolithography and/or etching processes. For example, the etching process may include a dry etching, a wet etching, and/or a combination thereof. The disclosure is not limited thereto. As shown in FIG. 1A, on the X-Y plane (e.g. a top plane view), a shape of the conductive elements 120A is a rectangular shape, for example. In some embodiments, on the X-Y plane (e.g. a plane view), the shape of the conductive elements 120A may be a triangular shape, a square shape, a pentagonal shape (see FIG. 2B, where only the conductive elements 120A, the semiconductor layer 130, and the gate structure 160A are shown), a polygonal shape, or the like. In some embodiments, a thickness T122 of the inner portions 122 is approximately ranging from 30 nm to 300 nm along the direction Z, as shown in FIG. 2A.

In some embodiments, the outer portions 124 each include a conductive layer (e.g. in a form of a segment). For example, the outer portions 124 may be made of a metal (M), a metal silicide ($MSi_x$), and/or a metal-germandie ($MGe_x$), where x is an integer greater than 0. For example, the metal (M) may include W, Mo, Pt, or the like. The outer portions 124 may be formed by deposition and patterning processes, in some embodiments. For example, the formation of the outer portions 124 may include, but not limited to, forming a blanket layer of a metal material conformally covering the inner portions 122 and patterning the metal blanket layer into separated and individual metal layers (segments) respectively corresponding to the inner portions 122 to form the outer portions 124. For example, as shown in FIG. 1A, each inner portion 122 is completely wrapped and covered by one outer portion 124. The patterning process may include photolithography and/or etching processes. For example, the etching process may include a dry etching, a wet etching, and/or a combination thereof. The disclosure is not limited thereto. In some embodiments, a thickness T124 of the outer portions 124 is approximately ranging from 1 nm to 100 nm. In the disclosure, the thickness T124 of the outer portions 124 is defined as a shortest distance measured from an outer surface of the inner portion 122 to an outer surface of the outer portion 124, where the outer surface of the outer portion 124 is substantially parallel to the outer surface of the inner portion 122, as shown in FIG. 2A. In some embodiments, the thickness T124 of the outer portions 124 is different from the thickness T122 of the inner portions 122. For example, the thickness T124 of the outer portions 124 is smaller than the thickness T122 of the inner portions 122, as shown in FIG. 2A.

Figure 5A:
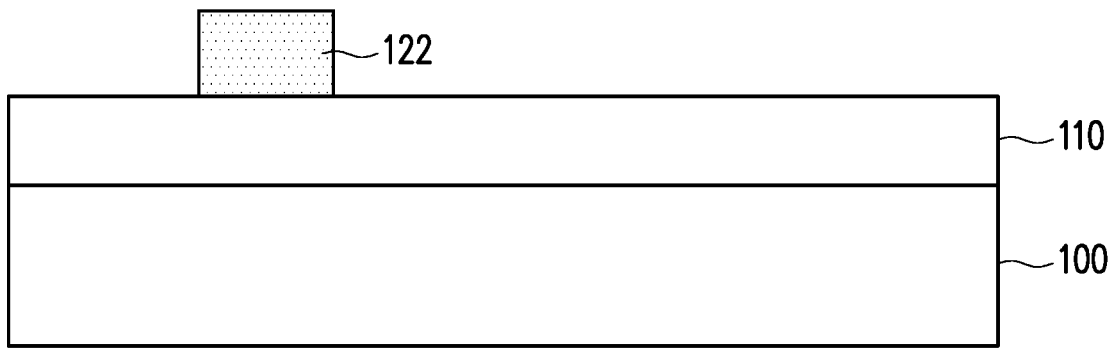
FIG. 5A to FIG. 5D are schematic cross-sectional views of various stages in a manufacturing method of a conductive element in accordance with some embodiments of the disclosure.
Figure 5B:
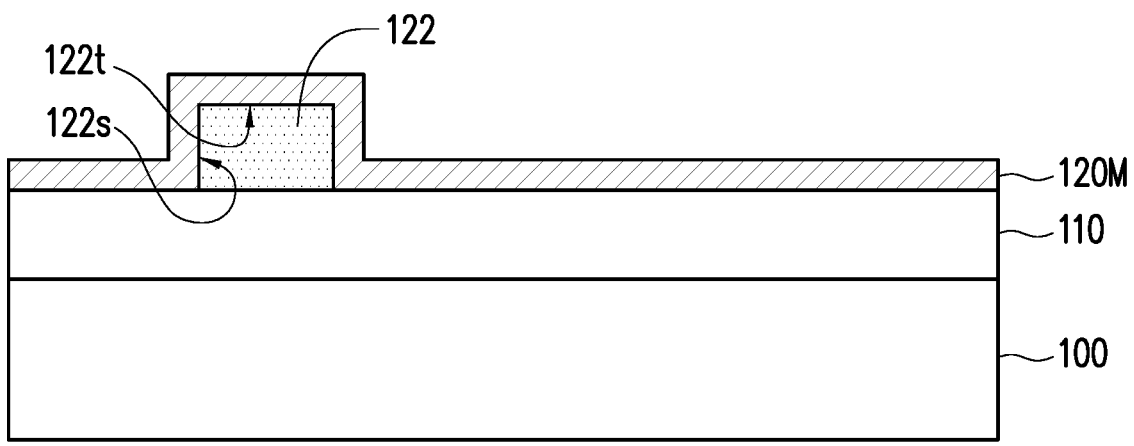
Figure 5C:
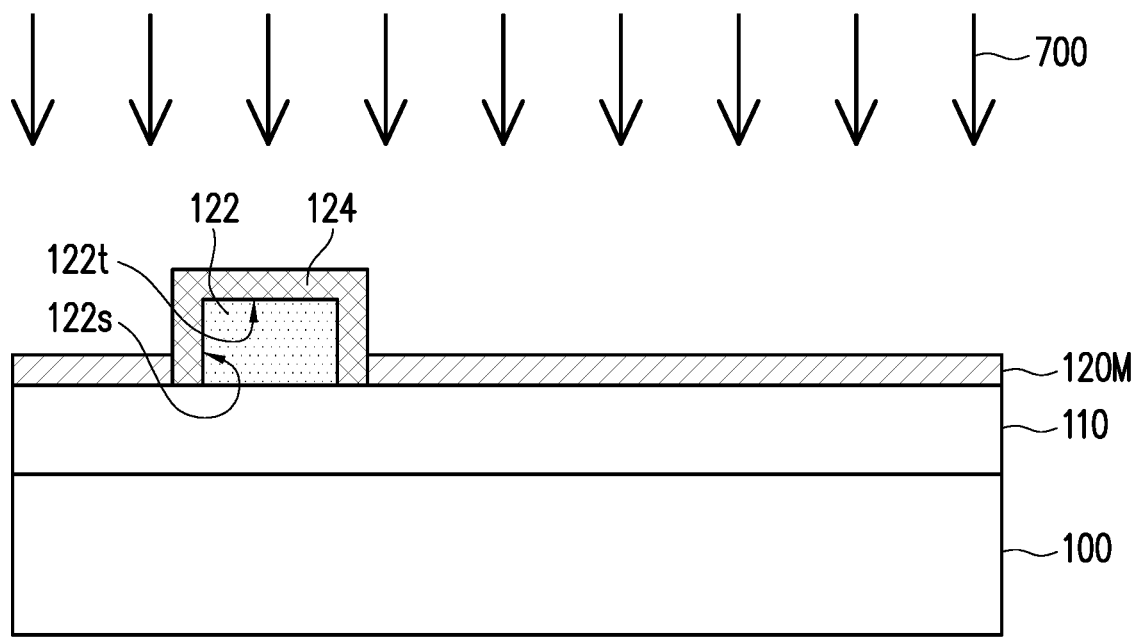
Figure 5D:
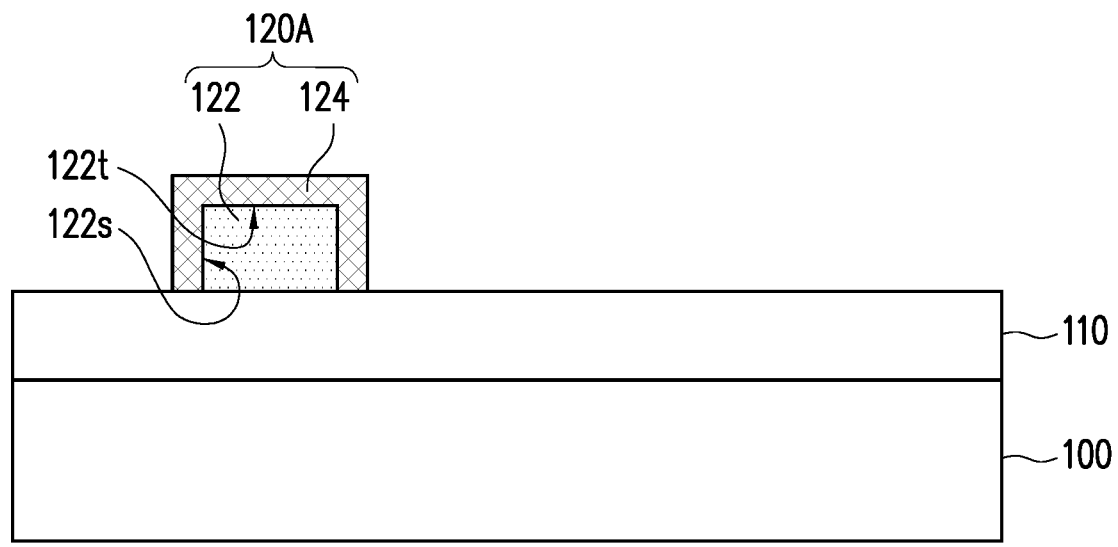
Figure 10:
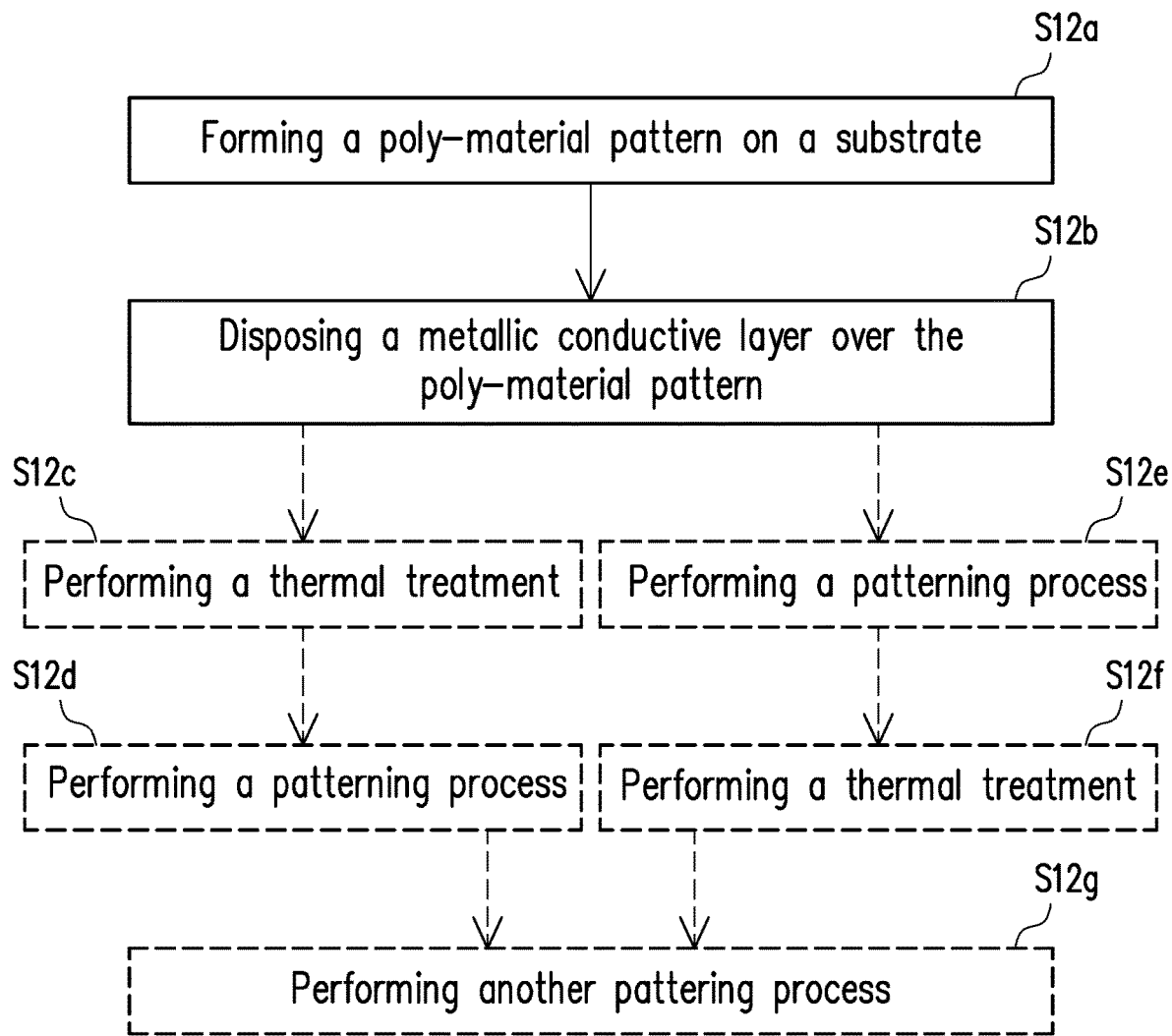
FIG. 10 is a flow chart illustrating a method of manufacturing a conductive element in accordance with some embodiments of the disclosure.

In some embodiments, the conductive elements 120A each are formed through, but not limited to, the processes illustrated in FIG. 5A to FIG. 5D, where only one conductive element 120A is shown in FIG. 5A to FIG. 5D for illustrative purposes. As shown in FIG. 5A, for example, after the substrate 100 with the dielectric layer 110 disposed thereon is provided, a doped poly-material film (not shown) is disposed over the substrate 100 in a manner of blanket formation to cover-up the dielectric layer 110 and is then patterned to form a poly-material pattern (portion), i.e. the inner portion 122, on the dielectric layer 110 and over the substrate 100, in accordance with step S12a of FIG. 10. For example, the doped poly-material film may include a doped polysilicon layer, a doped poly-germanium layer, a doped poly-silicon-germanium layer, or the like. The formation of the doped poly-material film may include a suitable deposition process (such as chemical vapor deposition (CVD)), and the patterning process may include photolithograph and etching processes, in some embodiments. As shown in FIG. 5B, for example, a metallic conductive layer 120M is conformally formed over the poly-material pattern 122 and the dielectric layer 110 to be in contact with the top surface 122t and the sidewall 122s of the poly-material pattern 122 and the surface of the dielectric layer 110 exposed by the poly-material pattern 122, in accordance with step S12b of FIG. 10. In some embodiments, a portion of the metallic conductive layer 120M is in contact with the top surface 122t and the sidewall 122s of the poly-material pattern 122. The metallic conductive layer 120M may be, for example, a metal layer formed by a suitable deposition process (such as CVD). For example, the metal layer may include W, Pt, Mo, or the like. As shown in FIG. 5C, for example, a thermal treatment 700 is performed on the structure depicted in FIG. 5B, in accordance with step S12c of FIG. 10. For example, during the thermal treatment 700, the portion of the metallic conductive layer 120M covering (in contact with) the poly-material pattern 122 is reacted to the poly-material pattern 122 to form a metal silicide layer (portion), i.e. the outer portion 124. The thermal treatment 700 may include, for example, argon (Ar) rapid thermal annealing, hydrogen (H2) furnace thermal annealing, or the like. As shown in FIG. 5D, for example, a patterning process is performed to remove the rest of the metallic conductive layer 120M remained on the dielectric layer 110, in accordance with step S12d of FIG. 10. For example, the patterning process may include an etching process or photolithograph and etching processes, where the etching process may include a dry etching, a wet etching, or a combination thereof. In some embodiments, after the patterning process, the poly-material pattern 122 is covered by the metal silicide layer 124, and a portion of the dielectric layer 110 is exposed by the metal silicide layer 124 and the poly-material pattern 122. In some embodiments, the poly-material pattern 122 and the metal silicide layer 124 together is referred to as one conductive element 120A, where the poly-material pattern 122 serves as the inner portion of the conductive element 120A and the metal silicide layer 124 (e.g. a metal silicide) serves as the outer portion of the conductive element 120A. However, the disclosure is not limited thereto.

Figure 6A:
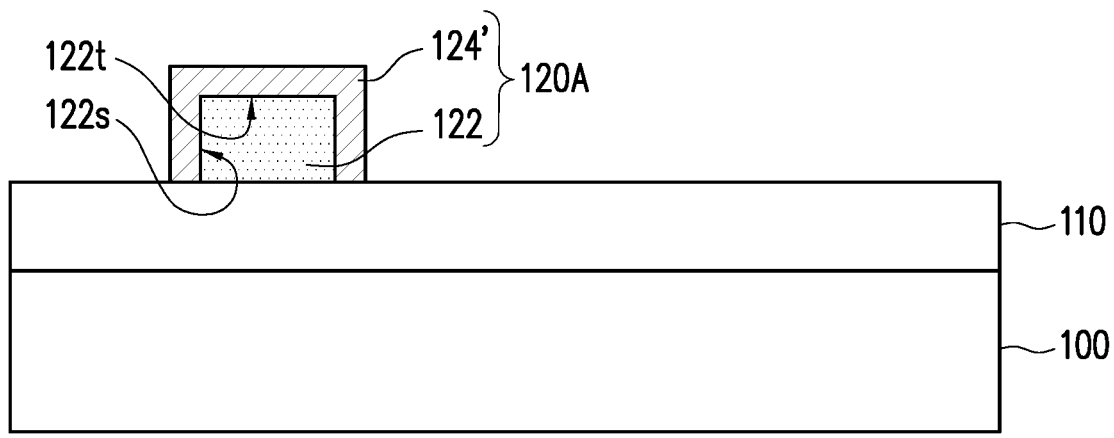
FIG. 6A to FIG. 6B are schematic cross-sectional views of various stages in a manufacturing method of a conductive element in accordance with some embodiments of the disclosure.
Figure 6B:
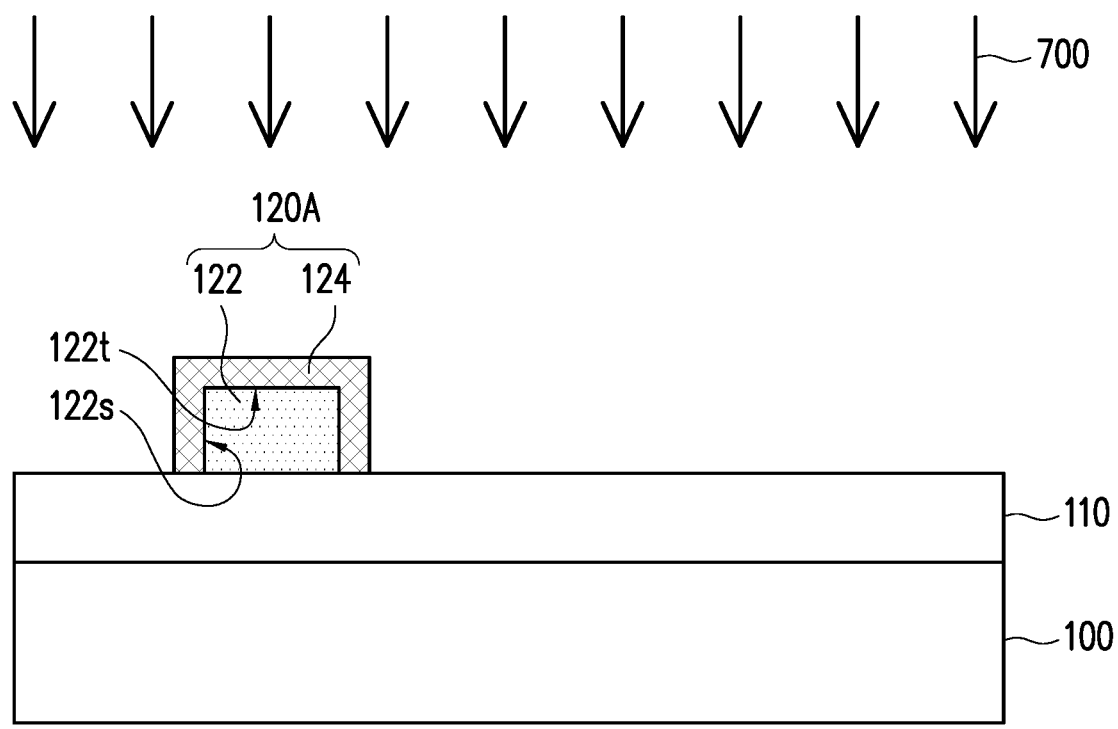

In alternative embodiments, the conductive elements 120A each may be formed through, but not limited to, the processes illustrated in FIG. 6A to FIG. 6B, where only one conductive element 120A is shown in FIG. 6A to FIG. 6B for illustrative purposes. As shown in FIG. 6A and in accordance with step S12b of FIG. 10, for example, a metallic conductive layer (portion) 124' is disposed over the substrate 100 in a manner of selective formation to cover-up the poly-material pattern 122, following the process as described in FIG. 5A (step S12a of FIG. 10). The metallic conductive layer 124' is formed by selective deposition, such as plasma-enhanced chemical vapor deposition (PE-CVD) or metal-organic chemical vapor deposition (MOCVD), and the material of the metallic conductive layer 124' may include W, Pt, Mo, WSix, PtSix, MoSix, WGex, or the like, for example, where x is an integer greater than 0. In some embodiments, the metallic conductive layer 124' is in contact with the top surface 122t and the sidewall 122s of the poly-material pattern 122, where a portion of the dielectric layer 110 is exposed by the metallic conductive layer 124' and the poly-material pattern 122. In one embodiment, the poly-material pattern 122 and the metallic conductive layer 124' together may be referred to as one conductive element 120A, where the poly-material pattern 122 serves as the inner portion of the conductive element 120A and the metallic conductive layer 124' (e.g. a metal) serves as the outer portion of the conductive element 120A.

However, the disclosure is not limited thereto. As shown in FIG. 6B, for example, a thermal treatment 700 may be further performed on the structure depicted in FIG. 6A, in accordance with step S12c of FIG. 10. The thermal treatment 700 has been described in FIG. 5C, and may not be repeated herein. For example, during the thermal treatment 700, the metallic conductive layer 124' is reacted to the poly-material pattern 122 to form the metal silicide layer 124. That is, the poly-material pattern 122 and the metal silicide layer 124 together may be referred to as one conductive element 120A, where the poly-material pattern 122 serves as the inner portion of the conductive element 120A and the metal silicide layer 124 serves as the outer portion of the conductive element 120A. However, the disclosure is not limited thereto.

Figure 7A:
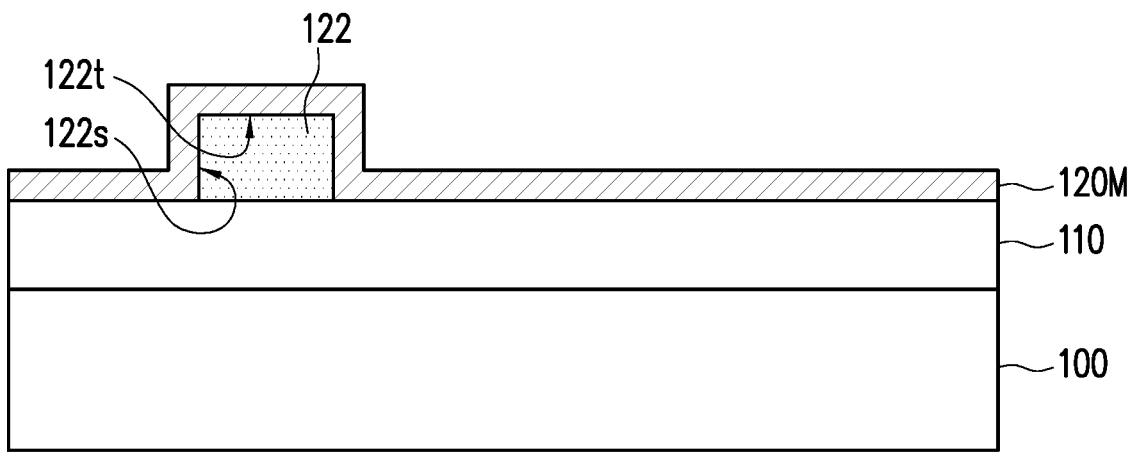
FIG. 7A to FIG. 7C are schematic cross-sectional views of various stages in a manufacturing method of a conductive element in accordance with some embodiments of the disclosure.
Figure 7B:
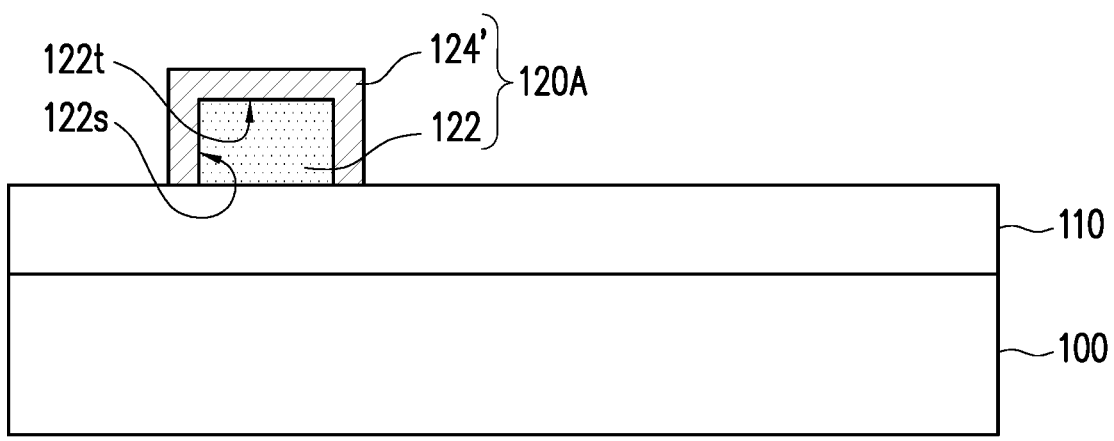
Figure 7C:
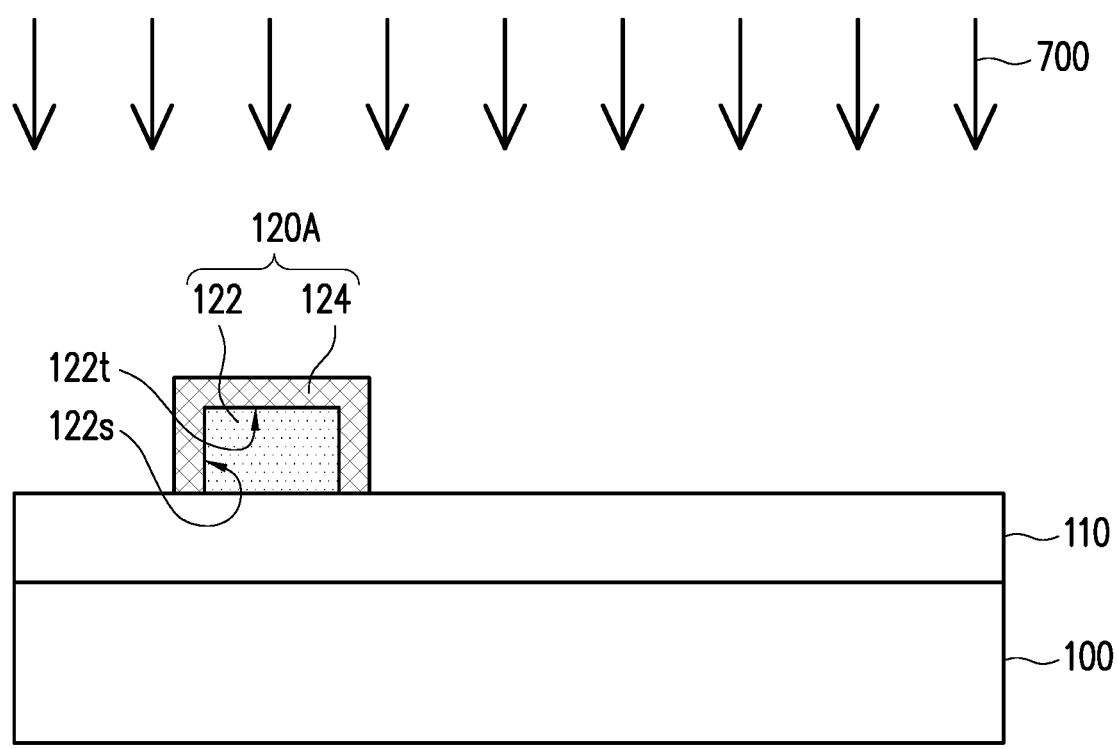

In further alternative embodiments, the conductive elements 120A each may be formed through, but not limited to, the processes illustrated in FIG. 7A to FIG. 7C, where only one conductive element 120A is shown in FIG. 7A to FIG. 7C for illustrative purposes. As shown in FIG. 7A and in accordance with step S12b of FIG. 10, for example, the metallic conductive layer 120M is conformally formed over the substrate 100 to cover the poly-material pattern 122, following the process as described in FIG. 5A (step S12a of FIG. 10). The formations and materials of the poly-material pattern 122 and the metallic conductive layer 120M and the positioning configuration thereof have been described in FIG. 5A and FIG. 5B, and may not be repeated herein for simplicity. As shown in FIG. 7B, for example, a patterning process is performed to form the metallic conductive layer 124' by removing a portion of the metallic conductive layer 120M disposed on the dielectric layer 110 and not in contact with the poly-material pattern 122, in accordance with step S12e of FIG. 10. The patterning process has been described in FIG. 5D, and may not be repeated herein. In some embodiments, after the patterning process, the poly-material pattern 122 is covered by the metallic conductive layer 124', and a portion of the dielectric layer 110 is exposed by the metallic conductive layer 124' and the poly-material pattern 122. In one embodiment, the poly-material pattern 122 and the metallic conductive layer 124' together may be referred to as one conductive element 120A, where the poly-material pattern 122 serves as the inner portion of the conductive element 120A and the metallic conductive layer 124' serves as the outer portion of the conductive element 120A.

However, the disclosure is not limited thereto. As shown in FIG. 7C, for example, a thermal treatment 700 may be further performed on the structure depicted in FIG. 7B, in accordance with step S12f of FIG. 10. The thermal treatment 700 has been described in FIG. 5C, and may not be repeated herein. For example, during the thermal treatment 700, the metallic conductive layer 124' is reacted to the poly-material pattern 122 to form the metal silicide layer 124. That is, in another embodiment, the poly-material pattern 122 and the metal silicide layer 124 together may be referred to as one conductive element 120A, where the poly-material pattern 122 serves as the inner portion of the conductive element 120A and the metal silicide layer 124 serves as the outer portion of the conductive element 120A.

Referring to FIG. 1B and FIG. 2B, in some embodiments, a semiconductor layer 130 is formed on the conductive elements 120A and over the substrate 100, in accordance with step S13 of FIG. 3. In some embodiments, the semiconductor layer 130 is a layer made of two-dimensional (2D) semiconductor materials. For example, the semiconductor layer 130 may be made of transition metal dichalcogenides or the like. In some embodiments, the transition metal dichalcogenides are represented by a general formula, $NX_2$, where N is a transition metal selected from the groups IVB, VB, or VIB of the periodic table, and X is one element selected from a group consisting of sulfur (S), selenium (Se), and tellurium (Te). For example, the semiconductor layer 130 may be a 2D semiconductor layer of $WS_2$, however the disclosure is not limited thereto. In alternative embodiments, the semiconductor layer 130 may be made of graphene, two-dimensional (2D) h-BN, or the like. In some embodiments, the semiconductor layer 130 may be formed by exfoliation, deposition (such as chemical vapor deposition (CVD) or the like) and gas phase epitaxy.

For example, in the disclosure, the conductive elements 120A serve as a seed layer for forming the semiconductor layer 130, such that during the deposition, a layer of the transition metal dichalcogenide is formed starting at the conductive elements 120A and extends outward along the direction X, the direction Y, and/or the direction Z to form the semiconductor layer 130. In the disclosure, the semiconductor layer 130 is formed with a uniform thickness (e.g. T130 depicted in FIG. 2B) and being capable of at least covering a portion of the dielectric layer 110 sandwiched between the conductive elements 120A and overlapping with an overlying or underlying gate structure (which would be described later). As shown in FIG. 1B and FIG. 2B, in addition, the semiconductor layer 130 may further extends onto the rest portions of the dielectric layer 110 that are exposed by the conductive elements 120A and not sandwiched between the conductive elements 120A, for example. In some embodiments, along the direction Z, a thickness T130 of the semiconductor layer 130 is approximately ranging from 0.5 nm to 5.0 nm. As shown in FIG. 2B, the semiconductor layer 130 covers the conductive elements 120A.

Referring to FIG. 1C and FIG. 2C, a gate structure 160A is formed on the conductive elements 120A and over the substrate 100 to form the semiconductor device 10A, in accordance with step S14 of FIG. 3. In some embodiments, the gate structure 160A includes a gate dielectric layer 162 and a gate electrode 164. In some embodiments, the gate electrode 164 is formed on and covers the semiconductor layer 130. For example, the gate electrode 164 is overlapped with a portion of the semiconductor layer 130, where the portion of the semiconductor layer 130 is located between the conductive elements 120A. In certain embodiments, the portion of the semiconductor layer 130 further extends onto the conductive elements 120A. In addition, prior to the formation of the gate electrode 164, the gate dielectric layer 162 is formed on the conductive elements 120A and covers the portion of the semiconductor layer 130. In other words, the substrate 100, the dielectric layer 110, the conductive elements 120A, the semiconductor layer 130, the gate dielectric layer 162 and the gate electrode 164 are sequentially formed along the direction Z, as shown in FIG. 2C. In such embodiment, the conductive elements 120A are respectively referred to as a source/drain element of the semiconductor device 10A depicted FIG. 1C and FIG. 2C, where the semiconductor layer 130 sandwiched between the conductive elements 120A and overlapped with the gate electrode 164 is referred to as a channel (portion) of the semiconductor device 10A, and a conduction status of the channel is controlled by a voltage applied onto the gate electrode 164. In other words, the gate electrode 164 serves as the gate of the semiconductor device 10A to provide a channel control of the semiconductor device 10A (e.g., turn on or turn off the channel of the semiconductor device 10A). Owing to the conductive elements 120A (e.g. the inner portions 122), the adhesion strength between the source/drain elements (e.g. the conductive elements 120A) of the semiconductor device 10A and the dielectric layer 110 is greatly enhanced, thereby peeling issue occurring at an interface of the source/drain elements of the semiconductor device 10A and the dielectric layer 110 in a thermal treatment is suppressed; thus, the yield of the semiconductor devices 10A is increased.

It is appreciated that, considering the semiconductor layer 130 is made of the 2D semiconductor material involving sulfur, a sulfidation of the metallic material underlying the semiconductor layer 130 takes place during the formation (involving a thermal process) of the semiconductor layer 130, due to metal atoms of the metallic material interact with sulfur atoms of the 2D semiconductor material. With such sulfidation, the device performance is greatly and negatively impacted. In the disclosure, the conductive elements 120A serve as the seed layer to promote the formation of the semiconductor layer 130, the sulfidation in the source/drain elements of the semiconductor device 10A is greatly suppressed due to the presence of the inner portions 122 (since sulfidation rarely occurs in the poly-materials); thus, the performance of the semiconductor device 10A is improved.

In some embodiments, the gate dielectric layer 162 may include silicon oxide, silicon nitride, silicon oxy-nitride, or high-k dielectric materials. For example, the high-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness $T_{GI}$ of the gate dielectric layer 162 is approximately in the range of 1 nm to 10 nm. The gate dielectric layer 162 may be formed using a suitable process such as atomic layer deposition (ALD), CVD, physical vapor deposition (PVD), thermal oxidation, UV-ozone oxidation, or combinations thereof. The disclosure is not limited thereto.

In some embodiments, the gate electrode 164 is then formed on the gate dielectric layer 162. In some embodiments, the gate electrode 164 may include a single layer or multi-layered structure. In one embodiment, the gate electrode 164 may be a poly gate consisting of a silicon-containing material, such as poly-silicon, amorphous silicon or a combination thereof. In an alternative embodiment, the gate electrode 164 may be a metal gate the disclosure is not limited thereto. For example, the metal gate may include a metal, such as Al, Cu, W, Ti, Ta, TiN, TiAl, TiAlN, TaN, NiSi, CoSi, other conductive materials with a work function compatible with the substrate material, or combinations thereof. In some embodiments, the gate electrode 164 includes a thickness T160 approximately in the range of 10 nm to 100 nm. The gate electrode 164 may be formed using a suitable process such as ALD, CVD, PVD, plating, or combinations thereof.

For example, after the formation of the semiconductor layer 130, the gate electrode 164 and the gate dielectric layer 162 may be formed by, but not limited to, the following steps, conformally forming a dielectric material layer in a form of a blanket layer to cover the structure depicted in FIG. 1B and FIG. 2B, forming a conductive material pattern on the dielectric material blanket layer to form the gate electrode 164, and the dielectric material blanket layer is patterned to form the gate dielectric layer 162 having the same profile with the gate electrode 164 on the X-Y plane. For example, the conductive material pattern is at least located over and overlapped with a portion of the semiconductor layer 130, where the portion of the semiconductor layer 130 is located between the conductive elements 120A and is extended on to the conductive elements 120A. In some embodiments, the conductive material pattern may be formed by deposition and etching processes. In some embodiments, the dielectric material blanket layer is patterned through etching process by using the gate electrode 164 as the etching mask. The etching process may include a dry etching, a wet etching, or a combination thereof. The disclosure is not limited thereto. Up to this, the manufacture of the semiconductor device 10A is finished. As shown in FIG. 2C, each of the conductive elements 120A is partially overlapped with the gate electrode 164, in some embodiments. In other embodiments, at least one of the conductive elements 120A may be entirely overlapped with the gate electrode 164, the disclosure is not limited thereto.

In some alternative embodiments, the conductive elements 120A may be replaced with conductive elements 120B, see a semiconductor device 10B as shown in FIG. 4A. The elements similar to or substantially the same as the elements described previously will use the same reference numbers, and certain details or descriptions of the same elements may not be repeated herein. As illustrated in FIG. 4A, in some embodiments, the conductive elements 120B each include an inner portion 122 and an outer portion 126 connecting to the sidewall 122s of the inner portion 122. For example, in each conductive element 120B, the outer portion 126 is formed in a form of a closed frame shape (viewing from the plane view, e.g. on the X-Y plane) entirely surrounding the sidewall 122s of the inner portion 122. For example, as shown in FIG. 4A, the outer portions 126 are free from the top surfaces 122t of the inner portions 122, and covers the sidewalls 122s of the inner portions 122. In other words, the top surfaces 122t of the inner portions 122 are accessibly revealed by the outer portions 126, respectively. As shown in FIG. 4A, the top surfaces 122t of the inner portions 122 are in contact with the semiconductor layer 130, in some embodiments.

Figure 8A:
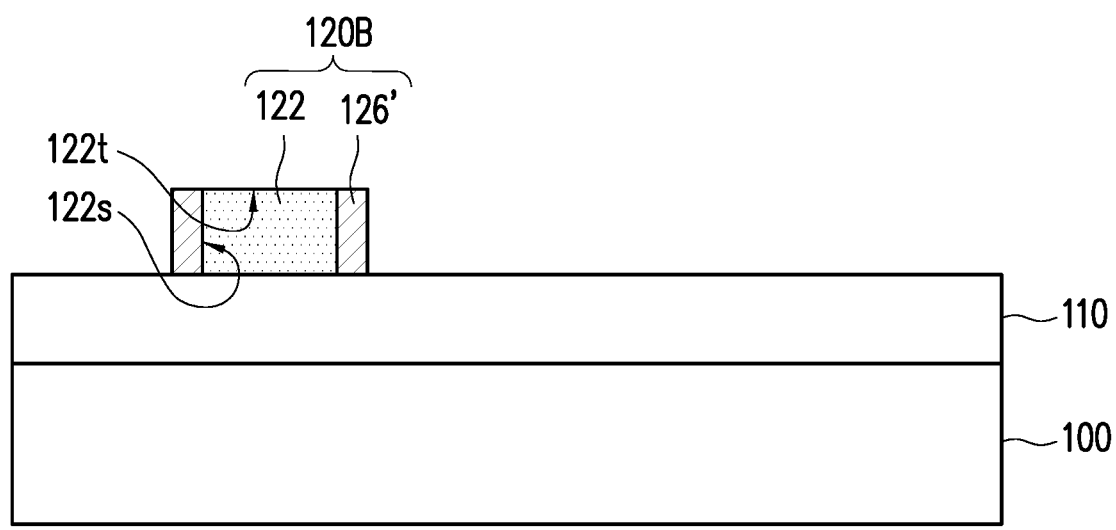
FIG. 8A to FIG. 8B are schematic cross-sectional views of various stages in a manufacturing method of a conductive element in accordance with some embodiments of the disclosure.
Figure 8B:
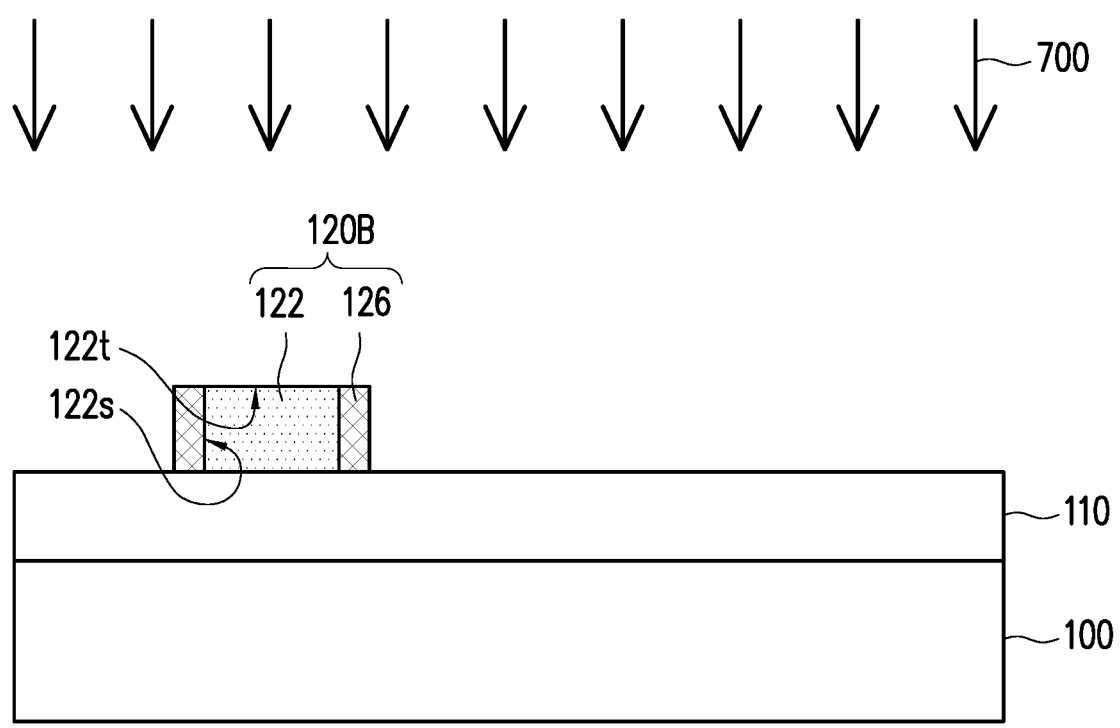

In some embodiments, the conductive elements 120B each are formed through, but not limited to, the processes illustrated in FIG. 8A to FIG. 8B, where only one conductive element 120B is shown in FIG. 8A to FIG. 8B for illustrative purposes. As shown in FIG. 8A and in accordance with step S12e of FIG. 10, for example, a patterning process is performed to form a metallic conductive layer (portion) 126', by removing a portion of the metallic conductive layer 120M disposed on the dielectric layer 110 and not in contact with the sidewall 122s of the poly-material pattern 122, following the process as described in FIG. 7A (step S12b of FIG. 10). The patterning process may be an anti-isotropic etching. In some embodiments, after the patterning process, the sidewall 122s of the poly-material pattern 122 is covered by the metallic conductive layer 126', where the top surface 122t of the poly-material pattern 122 is exposed by the metallic conductive layer 126', and a portion of the dielectric layer 110 is exposed by the poly-material pattern 122 and the metallic conductive layer 126'. In one embodiment, the poly-material pattern 122 and the metallic conductive layer 126' together may be referred to as one conductive element 120B, where the poly-material pattern 122 serves as the inner portion of the conductive element 120B and the metallic conductive layer 126' (e.g. a metal) serves as the outer portion of the conductive element 120B.

However, the disclosure is not limited thereto. As shown in FIG. 8B, for example, a thermal treatment 700 may be further performed on the structure depicted in FIG. 8A, in accordance with step S12f of FIG. 10. The thermal treatment 700 has been described in FIG. 5B, and may not be repeated herein. For example, during the thermal treatment 700, the metallic conductive layer 126' is reacted to the poly-material pattern 122 to form a metal silicide layer (portion), i.e. the outer portion 126. That is, in another embodiment, the poly-material pattern 122 and the metal silicide layer 126 together may be referred to as one conductive element 120B, where the poly-material pattern 122 serves as the inner portion of the conductive element 120B and the metal silicide layer 126 (e.g. a metal silicide) serves as the outer portion of the conductive element 120B.

In certain embodiments, a patterning process may be additionally performed on the structure depicted in FIG. 5D to remove a portion of the metal silicide layer 124 located on the top surface 122t of the poly-material pattern 122 to form the metal silicide layer 126 located only on the sidewall 122s of the poly-material pattern 122 as shown in FIG. 8B. In other words, the top surface 122t of the poly-material pattern 122 is accessibly exposed by the metal silicide layer 126. The patterning process may include anti-isotropic etching, or any suitable patterning process(es).

In some alternative embodiments, the conductive elements 120A may be replaced with conductive elements 120C, see a semiconductor device 10C as shown in FIG. 4B. The elements similar to or substantially the same as the elements described previously will use the same reference numbers, and certain details or descriptions of the same elements may not be repeated herein. As illustrated in FIG. 4B, in some embodiments, the conductive elements 120C each include an inner portion 122 and an outer portion 128 connecting to the top surface 122t of the inner portion 122. For example, in each conductive element 120C, the outer portion 128 is formed in a solid plate shape (viewing from the plane view, e.g. on the X-Y plane) atop the top surface 122t of the inner portion 122 and is free from the sidewall 122s of the inner portion 122. For example, as shown in FIG. 4B, the outer portion 128 is not covering the sidewall 122s of the inner portion 122. In other words, the sidewall 122s of the inner portions 122 are accessibly revealed by the outer portions 128, respectively. As shown in FIG. 4B, the sidewalls 122s of the inner portions 122 are in contact with the semiconductor layer 130, in some embodiments.

Figure 9A:
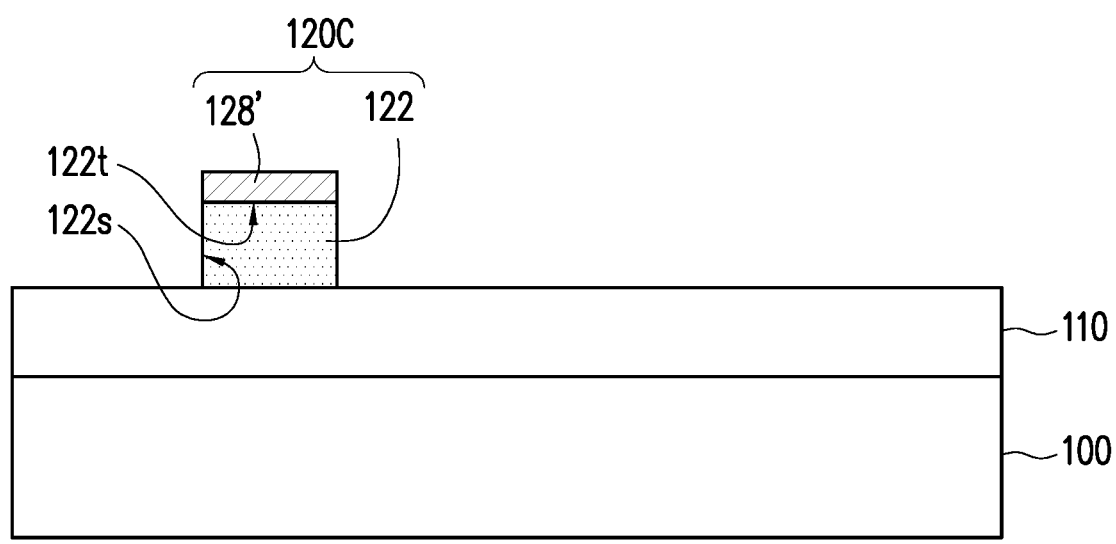
FIG. 9A to FIG. 9B are schematic cross-sectional views of various stages in a manufacturing method of a conductive element in accordance with some embodiments of the disclosure.
Figure 9B:
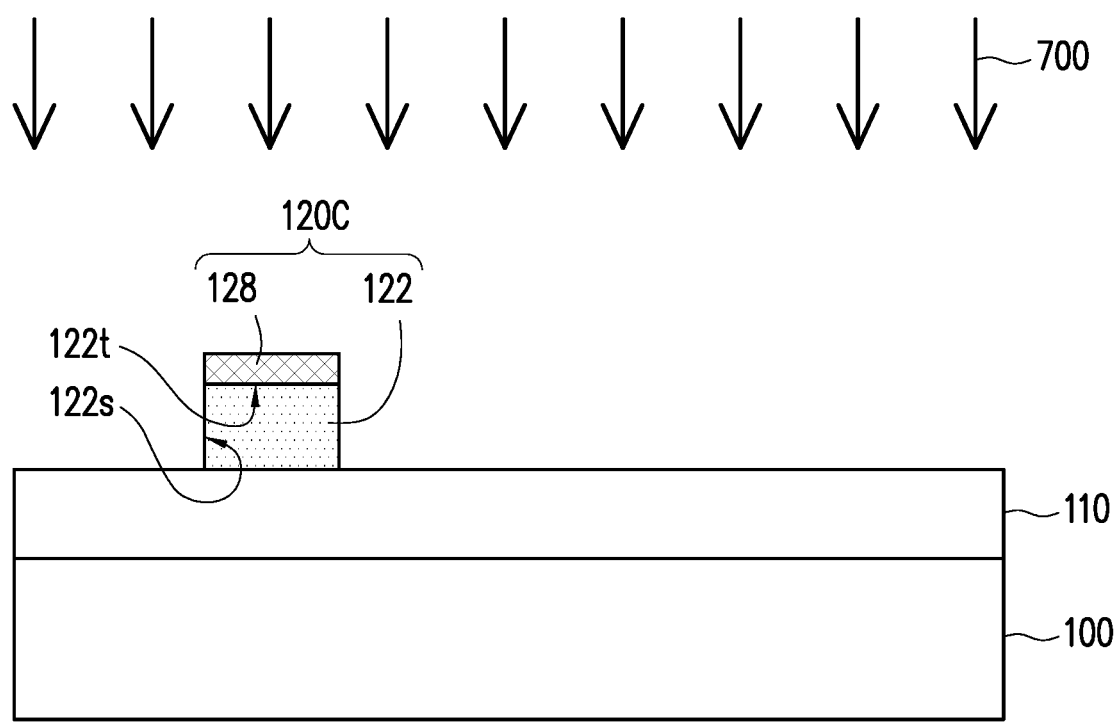

In some embodiments, the conductive elements 120C each are formed through, but not limited to, the processes illustrated in FIG. 9A to FIG. 9B, where only one conductive element 120C is shown in FIG. 9A to FIG. 9B for illustrative purposes. As shown in FIG. 9A and in accordance with step S12e of FIG. 10, for example, a patterning process is performed to form a metallic conductive layer (portion) 128' by removing a portion of the metallic conductive layer 120M disposed on the dielectric layer 110 and not in contact with the top surface 122t of the poly-material pattern 122, following the process as described in FIG. 7A (step S12b of FIG. 10). The patterning process may include photolithography and etching processes. In some embodiments, after the patterning process, the top surface 122t of the poly-material pattern 122 is covered by the metallic conductive layer 128', where the sidewall 122s of the poly-material pattern 122 is exposed by the metallic conductive layer 128', and a portion of the dielectric layer 110 is exposed by the poly-material pattern 122 and the metallic conductive layer 128'. In one embodiment, the poly-material pattern 122 and the metallic conductive layer 128' together may be referred to as one conductive element 120C, where the poly-material pattern 122 serves as the inner portion of the conductive element 120C and the metallic conductive layer 128' (e.g. a metal) serves as the outer portion of the conductive element 120C.

However, the disclosure is not limited thereto. As shown in FIG. 9B, for example, a thermal treatment 700 may be further performed to the structure depicted in FIG. 9A, in accordance with step S12f of FIG. 10. The thermal treatment 700 has been described in FIG. 5C, and may not be repeated herein. For example, during the thermal treatment 700, the metallic conductive layer 128' is reacted to the poly-material pattern 122 to form a metal silicide layer (portion), i.e. the outer portion 128. That is, in another embodiment, the poly-material pattern 122 and the metal silicide layer 128 together may be referred to as one conductive element 120C, where the poly-material pattern 122 serves as the inner portion of the conductive element 120C and the metal silicide layer 128 (e.g. a metal silicide) serves as the outer portion of the conductive element 120C.

In certain embodiments, a patterning process may be additionally performed on the structure depicted in FIG. 5D to remove a portion of the metal silicide layer 124 located on the sidewall 122s of the poly-material pattern 122 to form the metal silicide layer 128 located only on the top surface 122t of the poly-material pattern 122 as shown in FIG. 9B. In other words, the sidewall 122s of the poly-material pattern 122 is accessibly exposed by the metal silicide layer 128. The patterning process may include photolithography and etching processes, or any suitable patterning process (es).

Similar to the shape of the conductive elements 120A projecting on the X-Y plane, shapes of the conductive elements 120B, 120C may also be rectangular shapes, for example. In some embodiments, on the X-Y plane, the shape of the conductive elements 120B, 120C may be a triangular shape, a square shape, a pentagonal shape, a polygonal shape, or the like. The disclosure is not limited thereto.

However, the disclosure is not limited thereto. In some alternative embodiments, the conductive element(s) of the semiconductor device may only serve as the seed layer for facilitate formation of the semiconductor layer, not being source/drain elements of the semiconductor device.

Figure 11A:
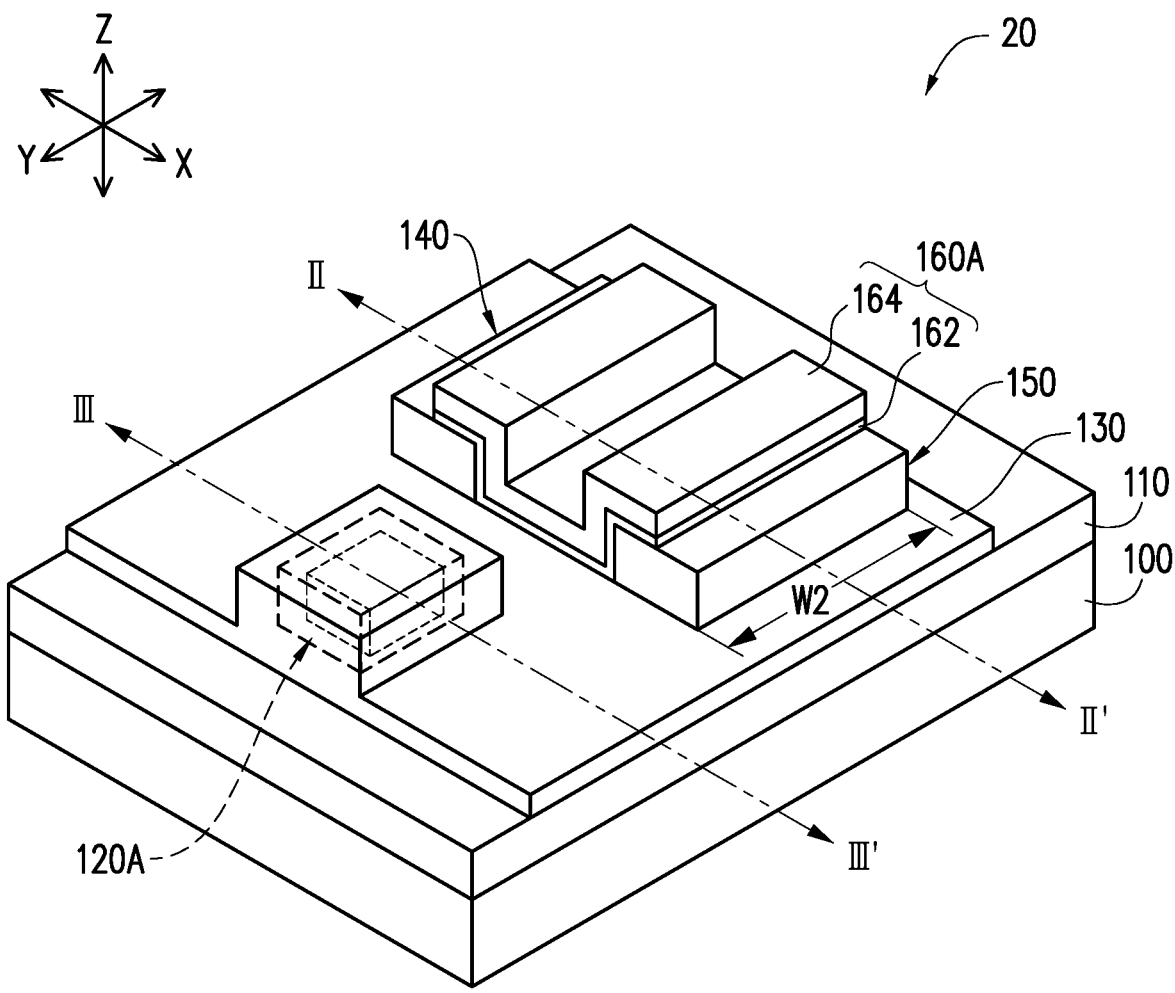
FIG. 11A is a schematic perspective view of a semiconductor device in accordance with some embodiments of the disclosure.
Figure 11B:
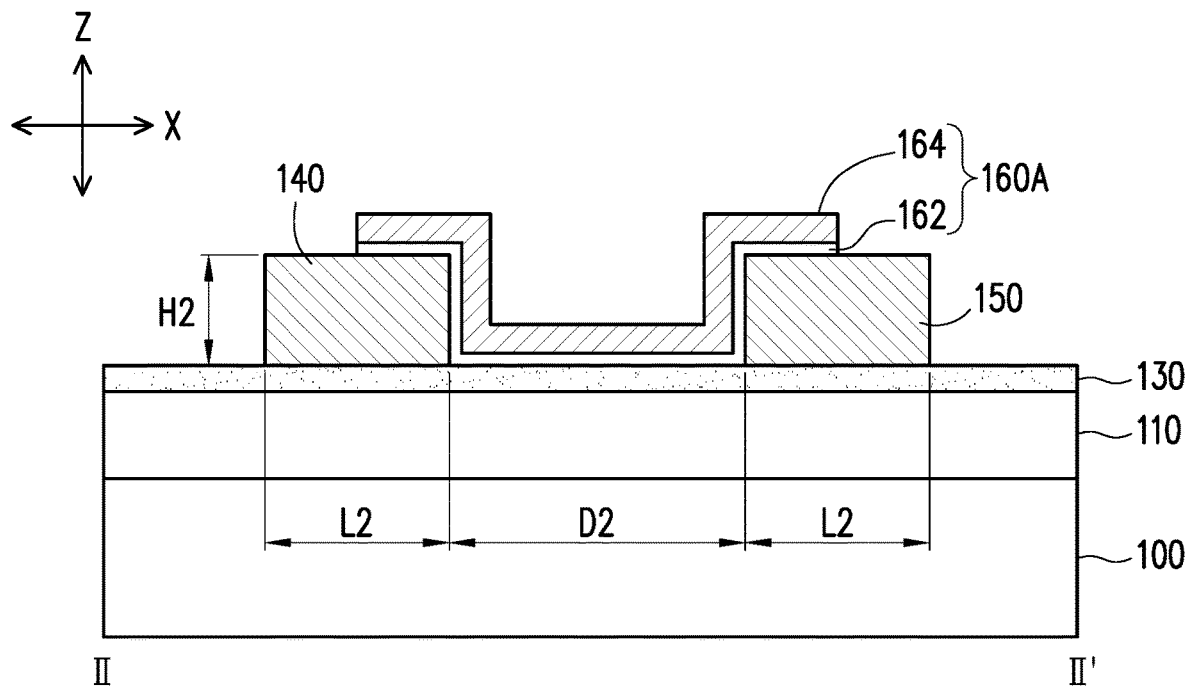
FIGS. 11B and 11C are schematic cross-sectional views of a semiconductor device in accordance with some embodiments of the disclosure.
Figure 11C:
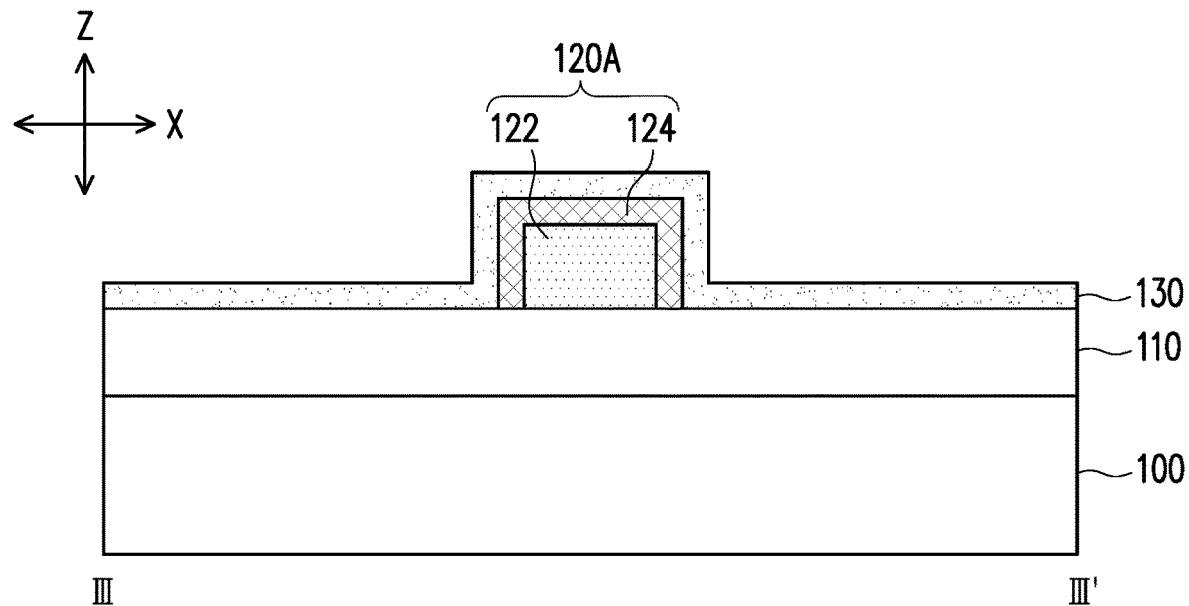
Figure 12:
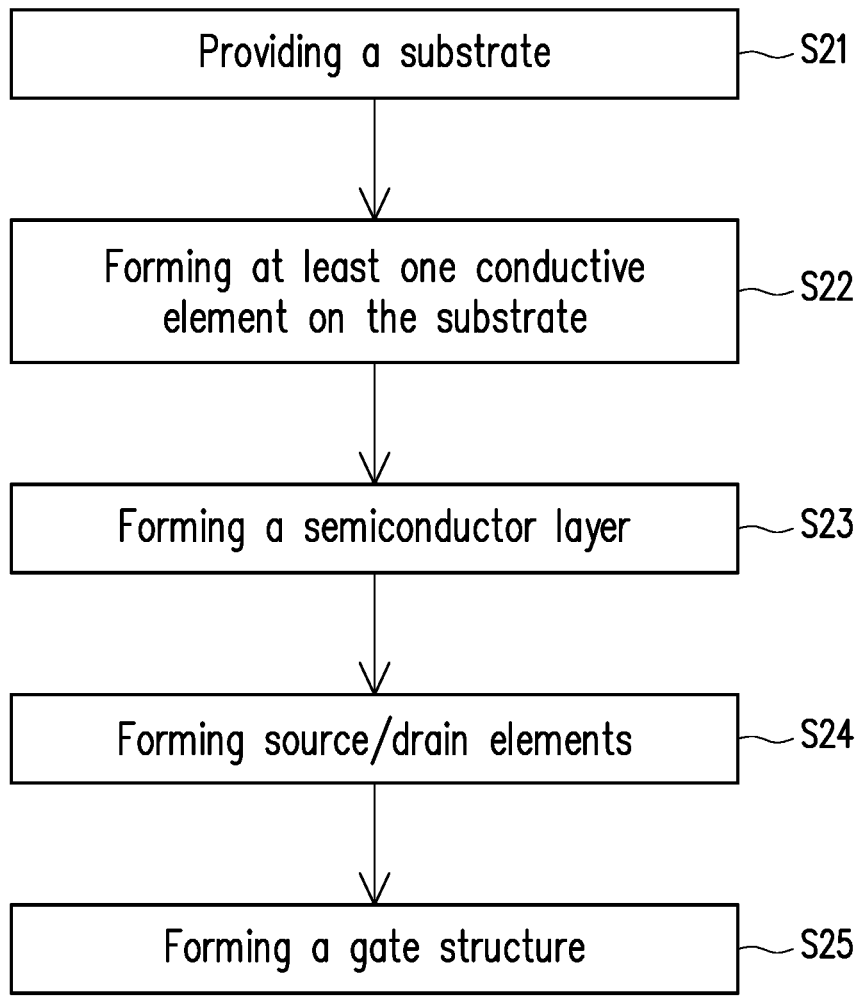
FIG. 12 is a flow chart illustrating a method of manufacturing a semiconductor device in accordance with some embodiments of the disclosure.

FIG. 11A is a schematic perspective view of a semiconductor device 20 in accordance with some embodiments of the disclosure. FIG. 11B is a schematic cross-sectional view of the semiconductor device 20 taken along a cross-sectional line II-IF depicted in FIG. 11A. FIG. 11C is a schematic cross-sectional view of the semiconductor device 20 taken along a cross-sectional line depicted in FIG. 11A. FIG. 12 is a flow chart illustrating a method of manufacturing a semiconductor device in accordance with some embodiments of the disclosure. In some embodiments, the semiconductor device 10A depicted in FIG. 1C and the semiconductor device 20 depicted in FIG. 11A are similar; such that the elements similar to or substantially the same as the elements described above will use the same reference numbers, and certain details or descriptions (e.g. materials and forming methods) of the same elements and the relationship thereof (e.g. the relative positioning configuration and electrical connection) will not be repeated herein. Referring to FIG. 1C and FIG. 11A, one difference is that, for the semiconductor device 20 depicted in FIG. 11A, there is only one conductive element 120A. Besides, the semiconductor device 20 depicted in FIG. 11A further includes additional elements, two source/drain elements 140, 150.

Figure 28:
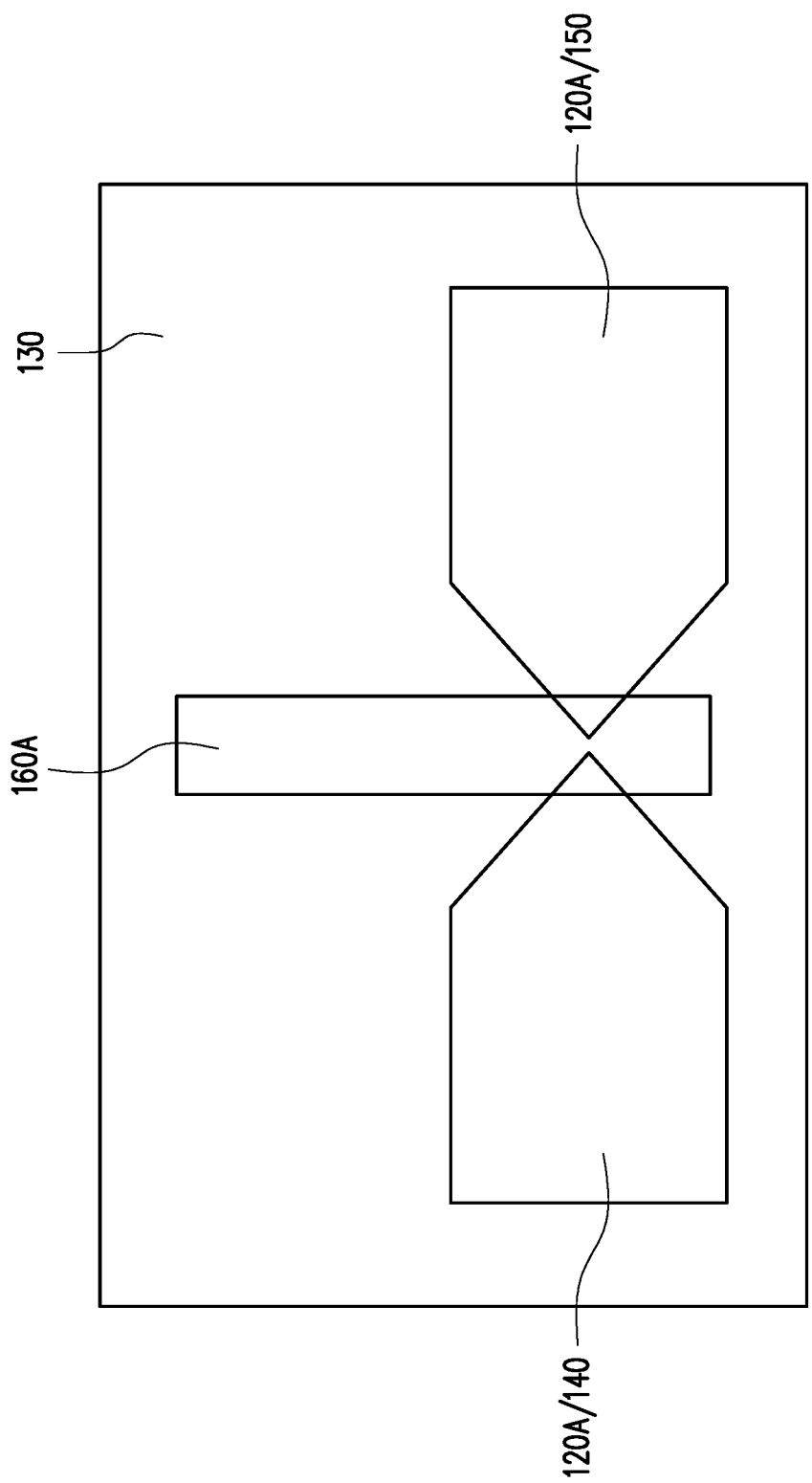
FIG. 28 is a schematic top view illustrating a shape of conductive elements or source/drain elements of a semiconductor device in accordance with some embodiments of the disclosure.

As illustrated in FIG. 11A to FIG. 11C, in some embodiments, the semiconductor device 20 includes the substrate 100, the dielectric layer 110 disposed on the substrate 100, the conductive element 120A located on the dielectric layer 110, the semiconductor layer 130 located on the conductive element 120A, the source/drain elements 140, 150 located on the semiconductor layer 130, and the gate structure 160A located on the source/drain elements 140, 150. As shown in FIG. 11B and FIG. 11C, for example, the substrate 100, the dielectric layer 110, the conductive elements 120A, the semiconductor layer 130, the source/drain elements 140/150, the gate dielectric layer 162 and the gate electrode 164 are sequentially formed along the direction Z. In some embodiments, the conductive element 120A (including the inner portion 122 and the outer portion 124) is not overlapped with the gate structure 160A (including the gate electrode 164 and the gate dielectric layer 162) and the source/drain elements 140/150. In other words, the conductive element 120A is separated and spacing apart from the source/drain elements 140/150, the gate electrode 164 and the gate dielectric layer 162, and is connected to and covered by the semiconductor layer 130. As shown in FIG. 11A, on the X-Y plane (e.g. a top plane view), a shape of the source/drain elements 140/150 is a rectangular shape, for example. In some embodiments, on the X-Y plane (e.g. a plane view), the shape of the source/drain elements 140/150 may be a triangular shape, a square shape, a pentagonal shape (see FIG. 28, where only the semiconductor layer 130, the source/drain elements 140/150, and the gate structure 160A are shown), a polygonal shape, or the like.

In the disclosure, a portion of the semiconductor layer 130 sandwiched between the source/drain elements 140/150 and overlapped with the gate electrode 164 is referred to as a channel (portion) of the semiconductor device 20 while the source/drain elements 140/150 both serve as source/drains of the semiconductor device 20, and a conduction status of the channel is controlled by a voltage applied onto the gate electrode 164. In other words, the gate electrode 164 serves as the gate of the semiconductor device 20 to provide a channel control of the semiconductor device 20 (e.g., turn on or turn off the channel of the semiconductor device 20). Owing to the conductive element 120A, the formation of the semiconductor layer 130 is promoted; thus, the yield of the semiconductor device 20 is improved.

For example, the semiconductor device 20 may be formed by the processes illustrated in steps S21 to S25 of FIG. 12. The substrate 100 is provided, in accordance with step S21 of FIG. 12, for example. In some embodiments, the dielectric layer 110 is formed over the substrate 100. The material and/or forming method of the substrate 100 and the material and/or forming method of the dielectric layer 110 have been described in FIG. 1A and FIG. 2A, and thus are not repeated herein. Then, the conductive element 120A is formed on the dielectric layer 110 and over the substrate 100, in accordance with step S22 of FIG. 12, for example. The material and/or forming method of the conductive element 120A have been described in FIG. 1A and FIG. 2A along with FIG. 5A to FIG. 5C, FIG. 6A to FIG. 6B, and FIG. 7A to FIG. 7C, and thus are not repeated herein. However, the disclosure is not limited thereto; in some alternative embodiments, the conductive element 120A may be replaced with the conductive element 120B or the conductive element 120C, which are respectively described in FIG. 8A to FIG. 8B and FIG. 9A to FIG. 9B, and thus are not repeated herein for simplicity.

After the formation of the conductive element 120A (serving as the seed layer for forming the semiconductor layer 130), the semiconductor layer 130 is formed on the conductive element 120A and over the substrate 100, in accordance with step S23 of FIG. 12, for example. The material and/or forming method of the semiconductor layer 130 have been described in FIG. 1B and FIG. 2B, and thus are not repeated herein. In the disclosure, the semiconductor layer 130 is formed with the uniform thickness and at least covers a portion of the dielectric layer 110 sandwiched between the source/drain elements 140, 150, and the semiconductor layer 130 is overlapped with the gate electrode 164. In some embodiments, the semiconductor layer 130 may further extends onto the rest portions of the dielectric layer 110 that are exposed by the conductive element 120A and not sandwiched between the source/drain elements 140, 150, for example. As shown in FIG. 11A to FIG. 11C, the semiconductor layer 130 is electrically connected to the conductive element 120A and the source/drain elements 140, 150.

The source/drain elements 140, 150 are formed over the substrate 100, in accordance with step S24 of FIG. 12, for example. In some embodiments, the source/drain elements 140, 150 are formed over the substrate 100 and formed on the semiconductor layer 130. For example, the source/drain elements 140, 150 are spacing away from the conductive element 120A. As shown in FIG. 11A and FIG. 11B, the source/drain elements 140, 150 are arranged into a row along the direction X. In some embodiments, the source/drain elements 140, 150 each has a length L2 ranging approximately from 10 nm to 500 nm along the direction X, a width W2 ranging approximately from 50 nm to 500 nm along the direction Y, and a height H2 ranging approximately from 30 nm to 300 nm along the direction Z. In some embodiments, along the direction X, the source/drain elements 140, 150 are spaced apart to each other with a distance D2 therebetween, where the distance D2 is approximately ranging from 5 nm to 10 μm. Due to the dielectric layer 110 is sandwiched between the substrate 100 and the semiconductor layer 130 (and the source/drain elements 140, 150 overlying thereto) along the direction Z, current leakage between the substrate 100 and the semiconductor layer 130 (and the source/drain elements 140, 150 overlying thereto) in the semiconductor device 20 can be suppressed. However, the disclosure is not limited thereto; in alternative embodiments, the source/drain elements 140, 150 may be arranged into a row along the direction Y. In other words, the source/drain elements 140, 150 may be arranged into row(s) or column(s) on a X-Y plane depending on the demand or design layout. In some embodiments, the source/drain elements 140, 150 may include a single layer or multi-layered structure. In one embodiment, the material of the source/drain elements 140, 150 may include metal or metal alloy, such as Al, Cu, W, Ti, Ta, TiN, TiAl, TiAlN, TaN, NiSi, CoSi, other conductive materials with a work function compatible with the substrate material, or combinations thereof. The disclosure is not limited thereto. In some embodiments, the source/drain elements 140, 150 may be formed using a suitable process such as ALD, CVD, PVD, plating, or combinations thereof with or without a patterning process.

After the formation of the source/drain elements 140, 150, the gate structure 160A is formed over the source/drain elements 140, 150 to form the semiconductor device 20, in accordance with step S25 of FIG. 12, for example. In some embodiments, the gate dielectric layer 162 and the gate electrode 164 are sequentially formed over the substrate 100. The material and/or forming method of the gate dielectric layer 162 and the material and/or forming method of the gate electrode 164 have been described in FIG. 1C and FIG. 2C, and thus are not repeated herein. Up to this, the manufacture of the semiconductor device 20 is finished. Owing to such semiconductor device 20 and the manufacturing method thereof (e.g. the semiconductor layer 130 is formed prior to the formation of the source/drain elements 140, 150), the sulfidation in the source/drain elements of the semiconductor device 20 is greatly suppressed or nearly eliminated; thus, the performance of the semiconductor device 20 is improved.

In the disclosure, the semiconductor devices 10A to 10C and 20 are considered as a top-gate semiconductor device having a planar-like structure. However, the disclosure is not limited thereto. In alternative embodiments, there may be a bottom gate semiconductor device having a planar-like structure, such as semiconductor device 30A to 30C and 40 which are described as follows.

Figure 13:
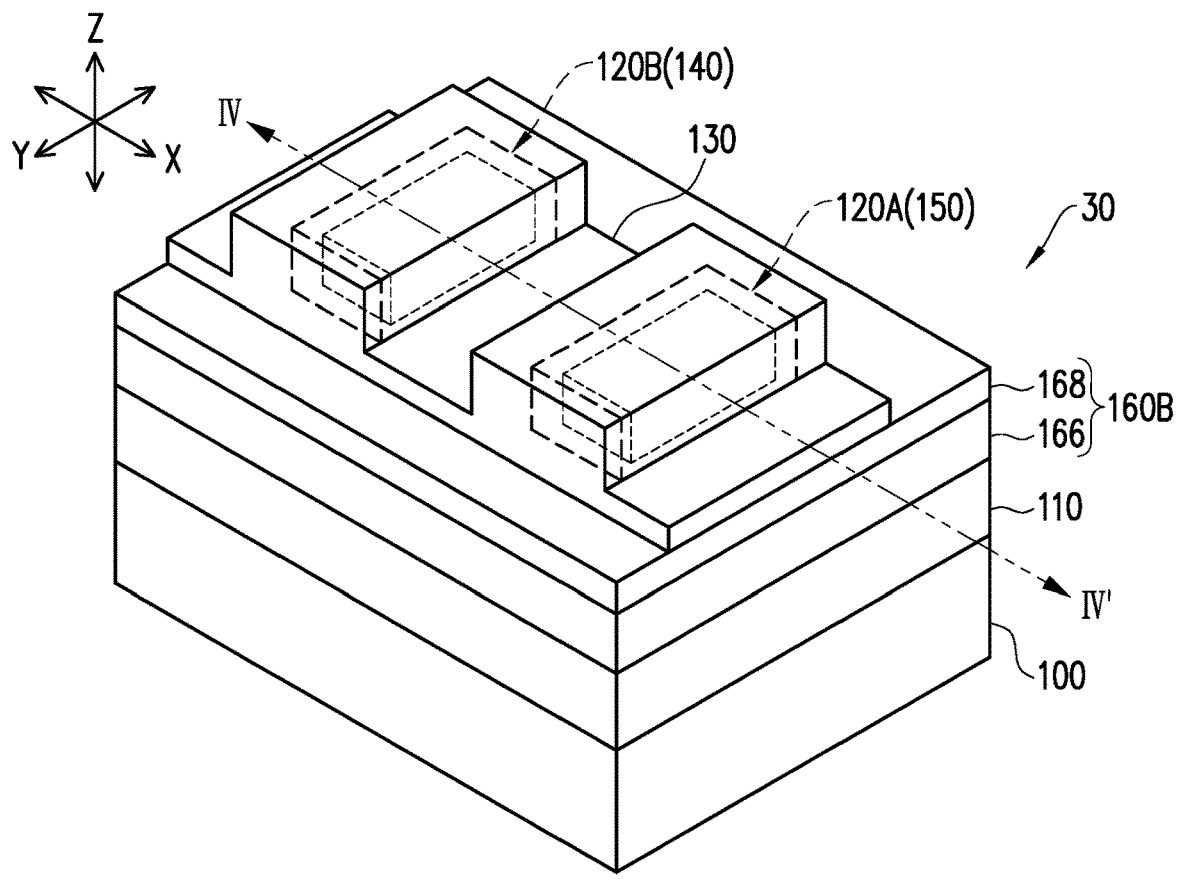
FIG. 13 is a schematic perspective view of a semiconductor device in accordance with some embodiments of the disclosure.
Figure 14A:
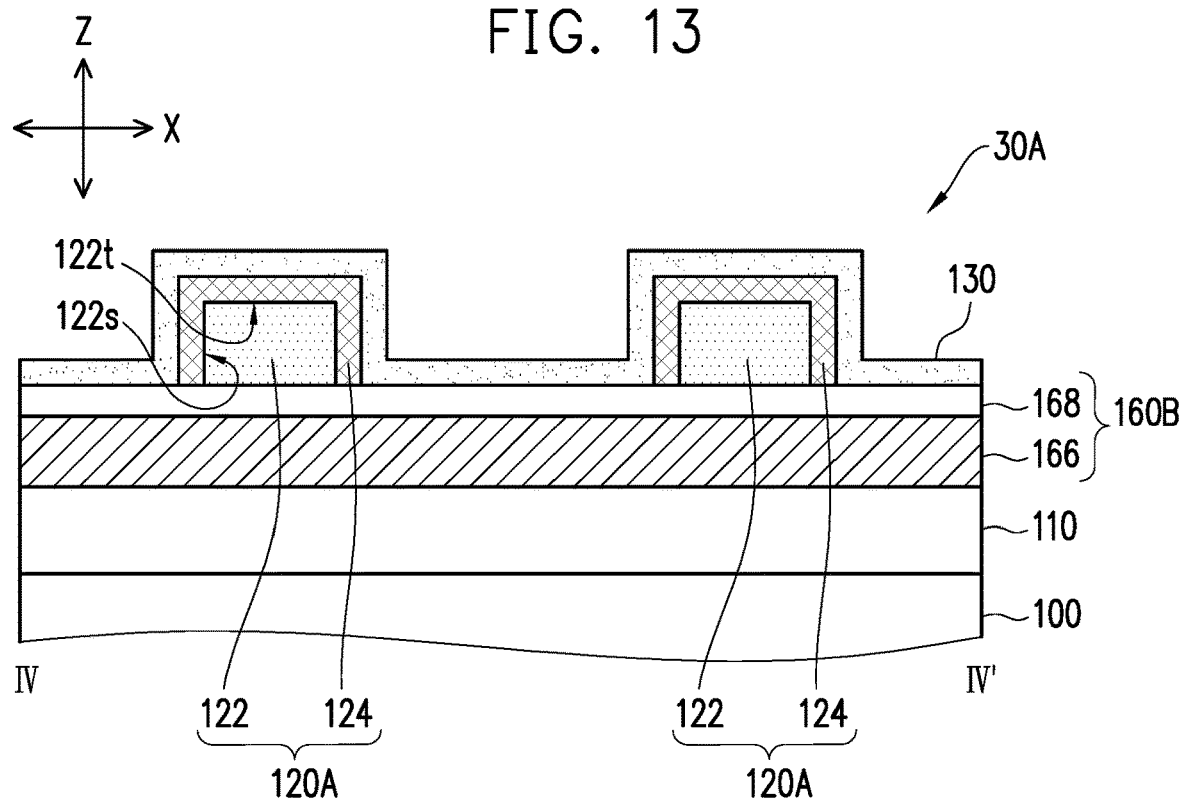
FIG. 14A to FIG. 14C are schematic cross-sectional views of a semiconductor device in accordance with some embodiments of the disclosure.
Figure 14B:
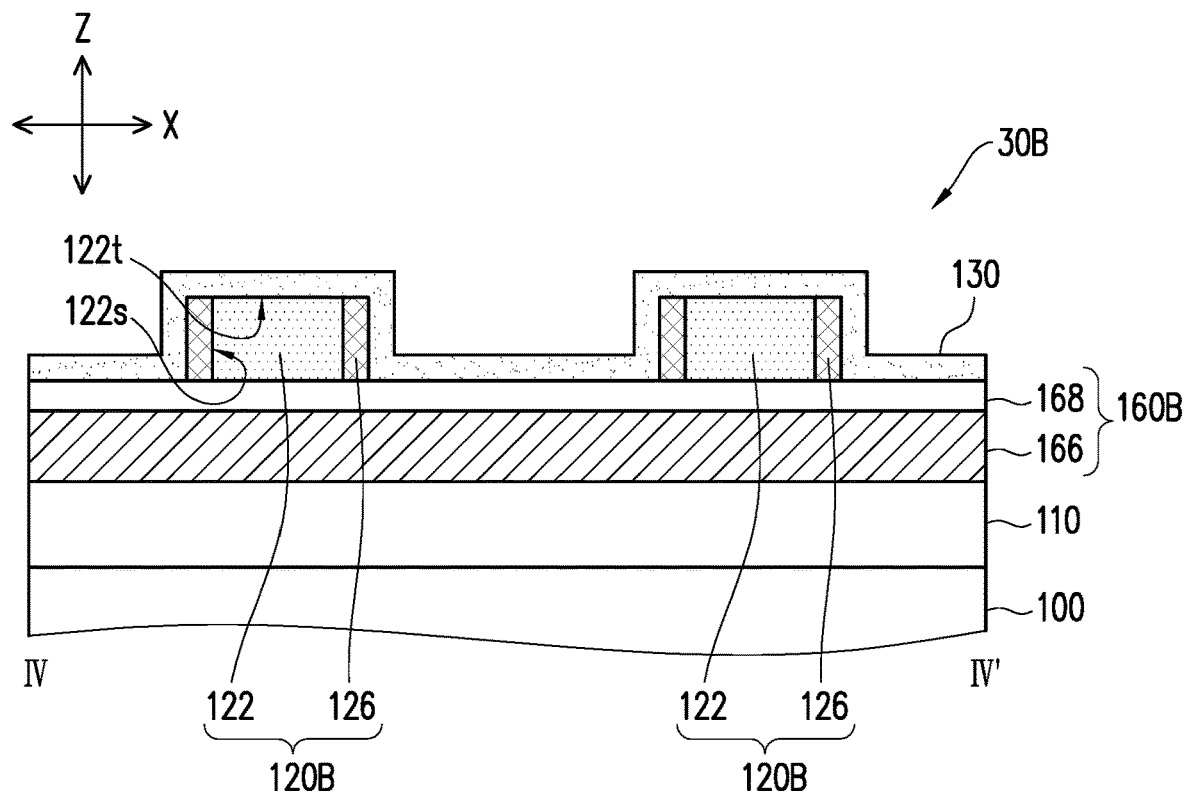
Figure 14C:
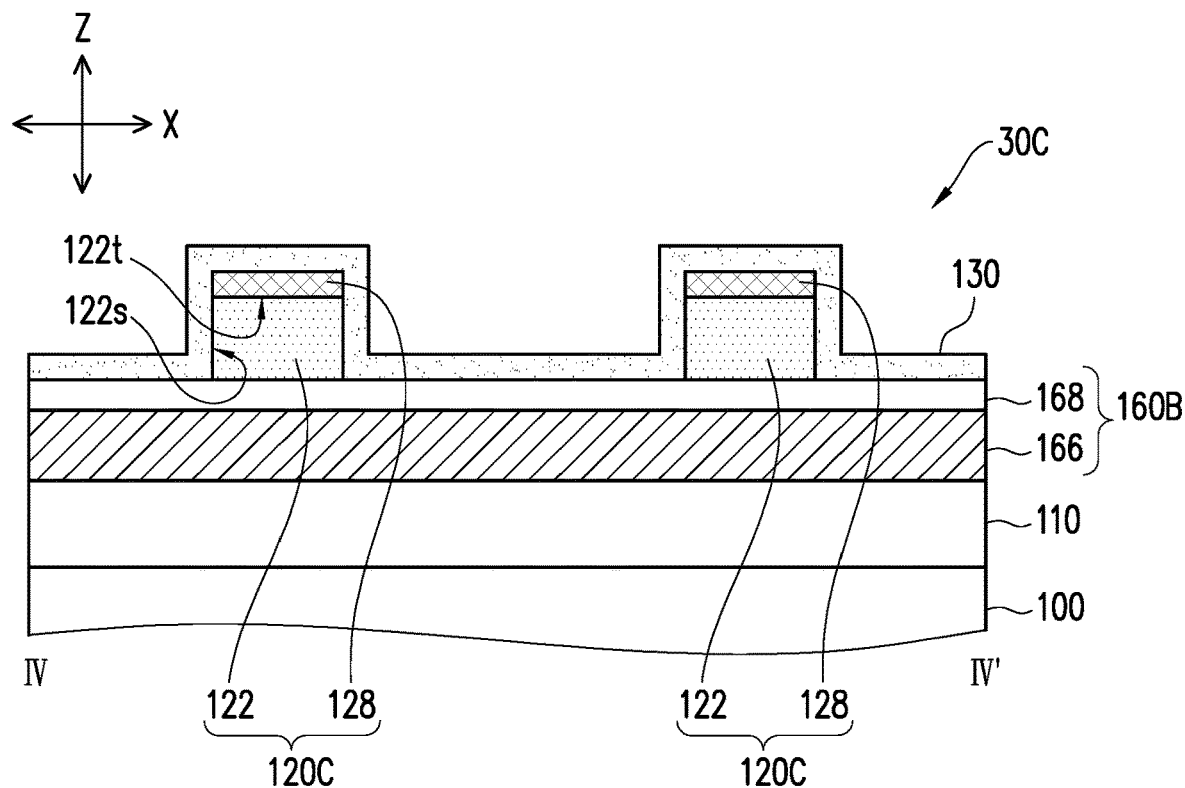
Figure 15:
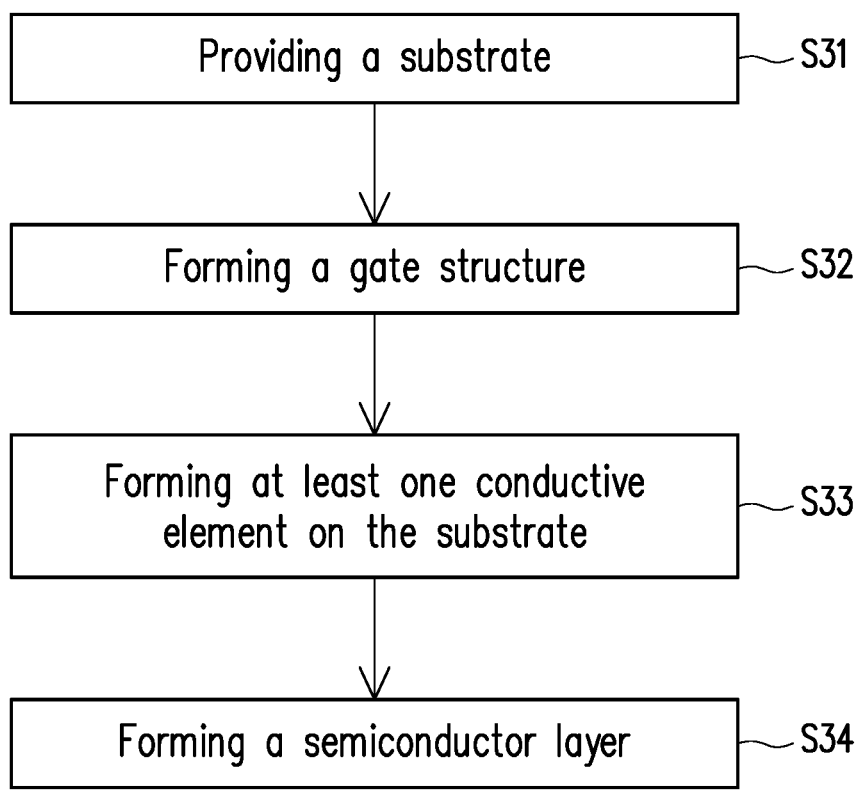
FIG. 15 is a flow chart illustrating a method of manufacturing a semiconductor device in accordance with some embodiments of the disclosure.

FIG. 13 is a schematic perspective view of a semiconductor device 30A in accordance with some embodiments of the disclosure, and FIG. 14A is a schematic cross-sectional view of the semiconductor device 30A depicted in FIG. 13 taken along a cross-sectional line IV-IV' depicted in FIG. 13. FIG. 14B to FIG. 14C each are a schematic cross-sectional view of a semiconductor device in accordance with some embodiments of the disclosure. FIG. 15 is a flow chart illustrating a method of manufacturing a semiconductor device in accordance with some embodiments of the disclosure. In some embodiments, the semiconductor device 10A depicted in FIG. 1C and the semiconductor device 30A depicted in FIG. 13 are similar to each other. Referring to FIG. 1C and FIG. 13, one difference is that, for the semiconductor device 30A depicted in FIG. 13, the gate structure 160A is replaced with a gate structure 160B, where prior to the formation of the conductive elements 120A, the gate structure 160B is formed over the substrate 100. The elements similar to or substantially the same as the elements described above will use the same reference numbers, and certain details or descriptions (e.g. materials and forming methods) of the same elements and the relationship thereof (e.g. the relative positioning configuration and electrical connection) will not be repeated herein.

Referring to FIG. 13 and FIG. 14A, in some embodiments, the semiconductor device 30A includes the substrate 100, the dielectric layer 110 disposed over the substrate 100, the gate structure 160B disposed on the dielectric layer 110, the conductive elements 120A disposed on the gate structure 160B, and the semiconductor layer 130 disposed over the conductive elements 120A and the gate structure 160B. In some embodiments, the gate structure 160B includes a gate electrode 166 and a gate dielectric layer 168 disposed over the gate electrode 166. As shown in FIG. 13 and FIG. 14A, for example, the substrate 100, the dielectric layer 110, the gate electrode 166, the gate dielectric layer 168, the conductive elements 120A, and the semiconductor layer 130 are sequentially formed along the direction Z. As shown in FIG. 14A, the conductive elements 120A (including the inner portion 122 and the outer portion 124) each are entirely overlapped with the gate structure 160B (including the gate electrode 166 and the gate dielectric layer 168 overlying thereto) and are electrically connected to the semiconductor layer 130, in some embodiments. In other words, the conductive elements 120A are separated and spacing apart from the gate electrode 166, and covers the semiconductor layer 130 and the gate dielectric layer 168.

In the disclosure, a portion of the semiconductor layer 130 sandwiched between the conductive elements 120A and overlapped with the gate electrode 166 is referred to as a channel (portion) of the semiconductor device 30A while the conductive elements 120A both serve as source/drains of the semiconductor device 30A, and a conduction status of the channel is controlled by a voltage applied onto the gate electrode 166. In other words, the gate electrode 166 serves as the gate of the semiconductor device 30A to provide a channel control of the semiconductor device 30A (e.g., turn on or turn off the channel of the semiconductor device 30A).

For example, the semiconductor device 30A may be formed by the processes illustrated in steps S31 to S34 of FIG. 15. The substrate 100 with the dielectric layer disposed thereon is provided, in accordance with step S31 of FIG. 15, for example. The material and/or forming method of the substrate 100 and the material and/or forming method of the dielectric layer 110 have been described in FIG. 1A and FIG. 2A, and thus are not repeated herein. Then, the gate structure 160B is formed on the dielectric layer 110 and over the substrate 100, in accordance with step S32 of FIG. 15, for example. In some embodiments, the gate electrode 166 and the gate dielectric layer 168 are sequentially formed on the dielectric layer 110. The material and/or forming method of the gate electrode 166 and the material and/or forming method of the gate dielectric layer 168 are similar to or substantially the same to the gate electrode 162 and the gate dielectric layer 164 described in FIG. 1C and FIG. 2C, respectively; and thus, are not repeated herein. After the formation of the gate structure 160B, the conductive elements 120A are formed on the gate structure 160B and over the substrate 100, in accordance with step S43 of FIG. 15, for example. The material and/or forming method of the conductive elements 120A have been described in FIG. 1A and FIG. 2A along with FIG. 5A to FIG. 5C, FIG. 6A to FIG. 6B, and FIG. 7A to FIG. 7C, and thus are not repeated herein. However, the disclosure is not limited thereto; in some alternative embodiments, the conductive elements 120A may be replaced with the conductive elements 120B (see a semiconductor device 30B depicted in FIG. 14B) or the conductive elements 120C (see a semiconductor device 30C depicted in FIG. 14C), which are respectively described in FIG. 8A to FIG. 8B and FIG. 9A to FIG. 9B, and thus are not repeated herein for simplicity. The semiconductor layer 130 is then formed on the conductive elements 120A and over the substrate 100, in accordance with step S34 of FIG. 15, for example. The material and/or forming method of the semiconductor layer 130 have been described in FIG. 1B and FIG. 2B, and thus are not repeated herein. Up to this, the manufacture of the semiconductor device 30A is finished.

In the disclosure, the semiconductor layer 130 is formed with the uniform thickness and at least covers a portion of the gate dielectric layer 168 of the gate structure 160B sandwiched between the conductive elements 120A and overlaps with the gate electrode 166 of the gate structure 160B. In some embodiments, the semiconductor layer 130 may further extends onto the rest portions of the gate dielectric layer 168 that are exposed by the conductive element 120A and not sandwiched between the conductive elements 120A, for example. As shown in FIG. 13 and FIG. 14A, the semiconductor layer 130 is electrically connected to the conductive elements 120A. Owing to the conductive elements 120A (e.g. the inner portions 122), the adhesion strength between the source/drain elements (e.g. the conductive elements 120A) of the semiconductor device 30A and the gate dielectric layer 168 is greatly enhanced, thereby peeling issue occurring at an interface of the source/drain elements of the semiconductor device 30A and the gate dielectric layer 168 in a thermal treatment is suppressed; thus, the yield of the semiconductor devices 30A is increased. In addition, the conductive elements 120A serve as the seed layer to promote the formation of the semiconductor layer 130, the sulfidation in the source/drain elements of the semiconductor device 30A is greatly suppressed due to the presence of the inner portion 122; thus, the performance of the semiconductor device 30A is improved.

Figure 16:
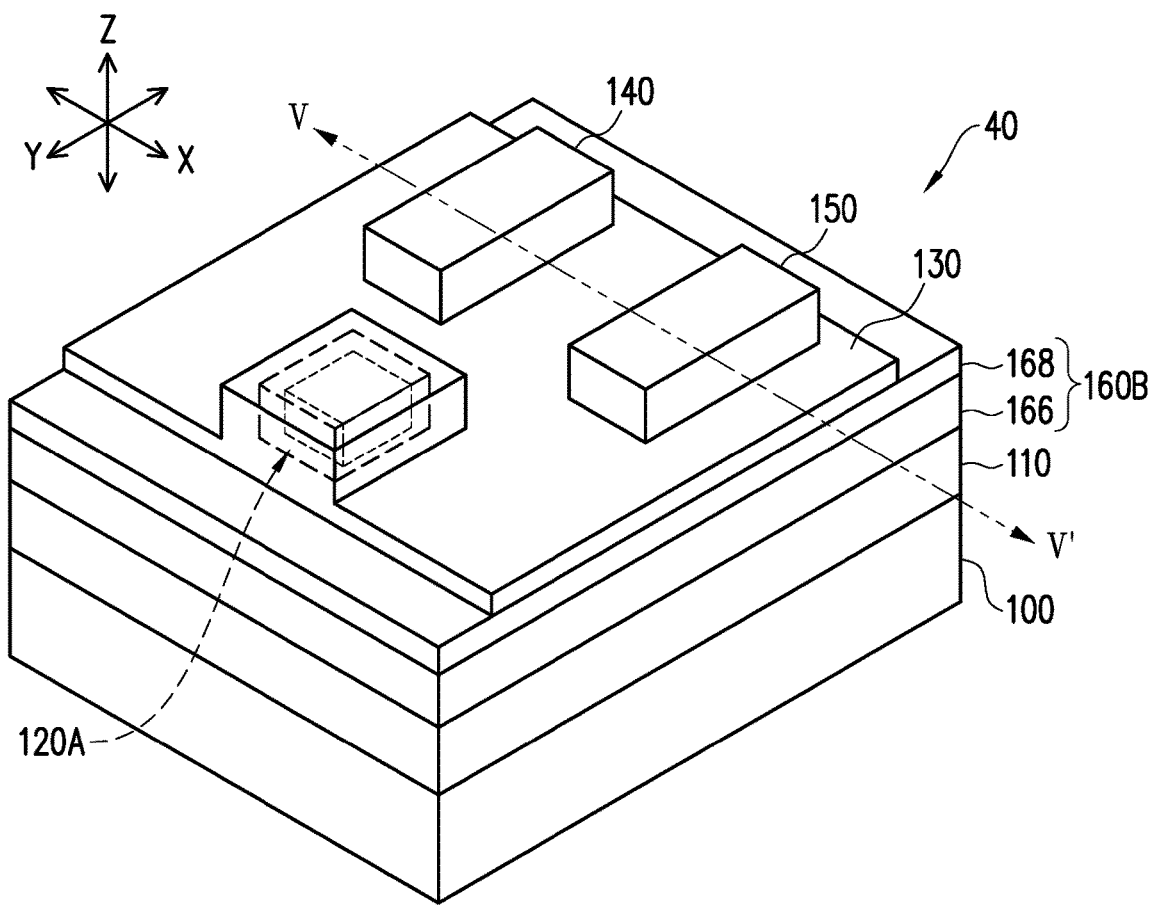
FIG. 16 is a schematic perspective view of a semiconductor device in accordance with some embodiments of the disclosure.
Figure 17:
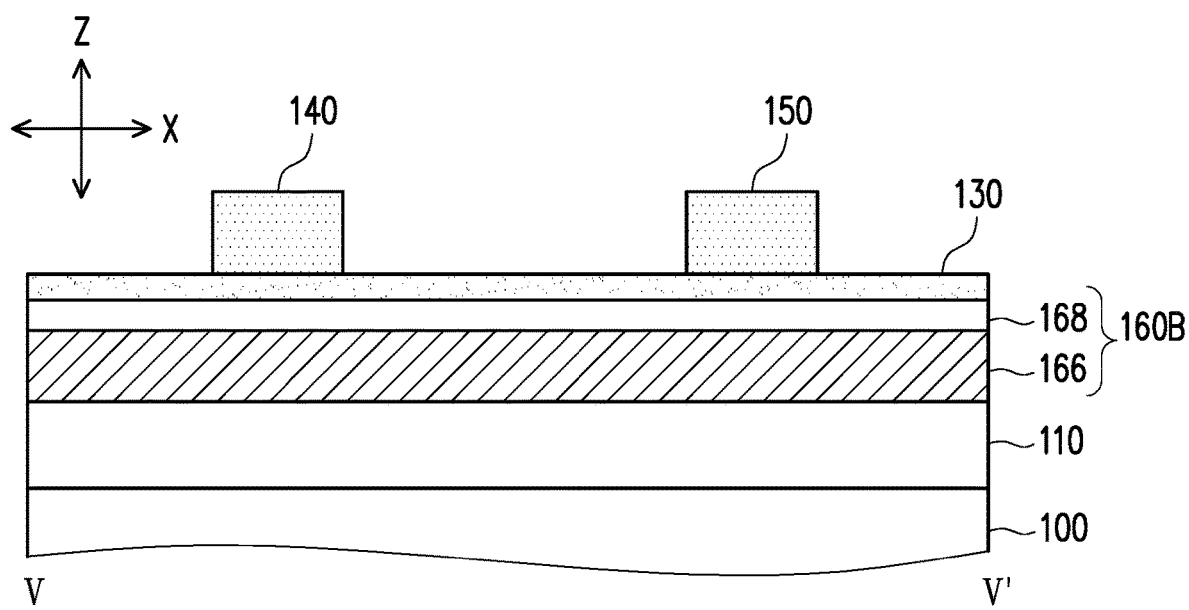
FIG. 17 is a schematic cross-sectional view of a semiconductor device in accordance with some embodiments of the disclosure.
Figure 18:
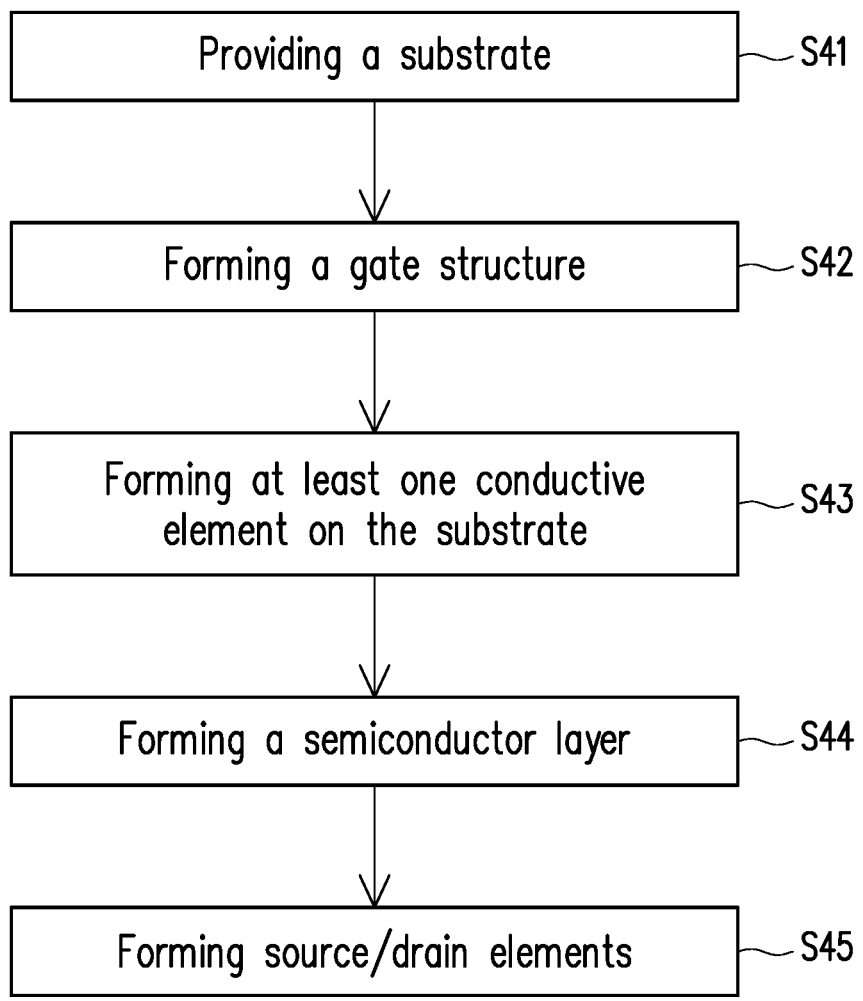
FIG. 18 is a flow chart illustrating a method of manufacturing a semiconductor device in accordance with some embodiments of the disclosure.

FIG. 16 is a schematic perspective view of a semiconductor device 40 in accordance with some embodiments of the disclosure. FIG. 17 is a schematic cross-sectional view of the semiconductor device 40 depicted in FIG. 16 taken along a cross-sectional line V-V' depicted in FIG. 16. FIG. 18 is a flow chart illustrating a method of manufacturing a semiconductor device in accordance with some embodiments of the disclosure. In some embodiments, the semiconductor device 30A depicted in FIG. 13 and the semiconductor device 40 depicted in FIG. 16 are similar; such that the elements similar to or substantially the same as the elements described above will use the same reference numbers, and certain details or descriptions (e.g. materials and forming methods) of the same elements and the relationship thereof (e.g. the relative positioning configuration and electrical connection) will not be repeated herein. Referring to FIG. 13 and FIG. 16, one difference is that, for the semiconductor device 40 depicted in FIG. 16, there is only one conductive element 120A. Besides, the semiconductor device 40 depicted in FIG. 16 further includes additional elements, two source/drain elements 140, 150.

As illustrated in FIG. 16 and FIG. 17, in some embodiments, the semiconductor device 40 includes the substrate 100, the dielectric layer 110 disposed on the substrate 100, the gate structure 160B disposed on the dielectric layer 110, the conductive element 120A located on the gate structure 160B, the semiconductor layer 130 located on the conductive element 120A, and the source/drain elements 140, 150 located on the semiconductor layer 130. As shown in FIG. 16 and FIG. 17, the substrate 100, the dielectric layer 110, the gate electrode 166, the gate dielectric layer 168, the conductive element 120A, the semiconductor layer 130, and the source/drain elements 140, 150 are sequentially formed along the direction Z. The conductive element 120A (including the inner portion 122 and the outer portion 124) is entirely overlapped with the gate structure 160B (including the gate electrode 166 and the gate dielectric layer 168), and is not overlapped with the source/drain elements 140/150, in some embodiments. In other words, the conductive element 120A is separated and spacing apart from the source/drain elements 140/150 and the gate electrode 166, and covers the semiconductor layer 130 and the gate dielectric layer 168.

In the disclosure, a portion of the semiconductor layer 130 sandwiched between the source/drain elements 140/150 and overlapped with the gate electrode 166 is referred to as a channel (portion) of the semiconductor device 40 while the source/drain elements 140/150 both serve as source/drains of the semiconductor device 40, and a conduction status of the channel is controlled by a voltage applied onto the gate electrode 166. In other words, the gate electrode 166 serves as the gate of the semiconductor device 40 to provide a channel control of the semiconductor device 40 (e.g., turn on or turn off the channel of the semiconductor device 40). Owing to the conductive element 120A, the formation of the semiconductor layer 130 is promoted; thus, the yield of the semiconductor device 40 is improved.

For example, the semiconductor device 40 may be formed by the processes illustrated in steps S41 to S45 of FIG. 18. The substrate 100 with the dielectric layer disposed thereon is provided, in accordance with step S41 of FIG. 18, for example. The material and/or forming method of the substrate 100 and the material and/or forming method of the dielectric layer 110 have been described in FIG. 1A and FIG. 2A, and thus are not repeated herein. Then, the gate structure 160B is formed on the dielectric layer 110 and over the substrate 100, in accordance with step S42 of FIG. 18, for example. The material and/or forming method of the gate electrode 166 and the material and/or forming method of the gate dielectric layer 168 are similar to or substantially the same to the gate electrode 162 and the gate dielectric layer 164 described in FIG. 1C and FIG. 2C, respectively; and thus, are not repeated herein. After the formation of the gate structure 160B, the conductive element 120A (serving as the seed layer for forming the semiconductor layer 130) is formed on the gate structure 160B and over the substrate 100, in accordance with step S43 of FIG. 18, for example. The material and/or forming method of the conductive element 120A have been described in FIG. 1A and FIG. 2A along with FIG. 5A to FIG. 5C, FIG. 6A to FIG. 6B, and FIG. 7A to FIG. 7C, and thus are not repeated herein. However, the disclosure is not limited thereto; in some alternative embodiments, the conductive element 120A may be replaced with the conductive element 120B described in FIG. 8A to FIG. 8B or the conductive element 120C described in FIG. 9A to FIG. 9B, and thus are not repeated herein for simplicity. The semiconductor layer 130 is then formed on the conductive element 120A and over the substrate 100, in accordance with step S44 of FIG. 18, for example. The material and/or forming method of the semiconductor layer 130 have been described in FIG. 1B and FIG. 2B, and thus are not repeated herein. After the semiconductor layer 130 is formed, the source/drain elements 140, 150 are formed on the semiconductor layer 130 and over the substrate 100, in accordance with step S45 of FIG. 18, for example. In some embodiments, the source/drain elements 140, 150 are formed to overlap with the semiconductor layer 130 and spacing away from the conductive element 120A. The material and/or forming method of the source/drain elements 140, 150 have been described in FIG. 11A to FIG. 11B along with FIG. 12, and thus are not repeated herein for simplicity. Up to this, the manufacture of the semiconductor device 40 is finished. Owing to such semiconductor device 40 and the manufacturing method thereof, the sulfidation in the source/drain elements of the semiconductor device 40 is greatly suppressed; thus, the performance of the semiconductor device 40 is improved.

In the disclosure, the semiconductor layer 130 is formed with the uniform thickness and at least covers a portion of the gate dielectric layer 168 sandwiched between the source/drain elements 140, 150 and overlaps with the gate electrode 166. In some embodiments, the semiconductor layer 130 may further extends onto the rest portions of the gate dielectric layer 168 that are exposed by the conductive element 120A and not sandwiched between the source/drain elements 140, 150, for example. As shown in FIG. 16 to FIG. 17, the semiconductor layer 130 is electrically connected to the conductive element 120A, the source/drain elements 140, 150, and the gate dielectric layer 168.

However, the disclosure is not limited thereto. In further alternative embodiments, there may be a semiconductor device having a fin-like structure, such as semiconductor device 50A to 50C, 60, and 70, which are described as follows.

Figure 21A:
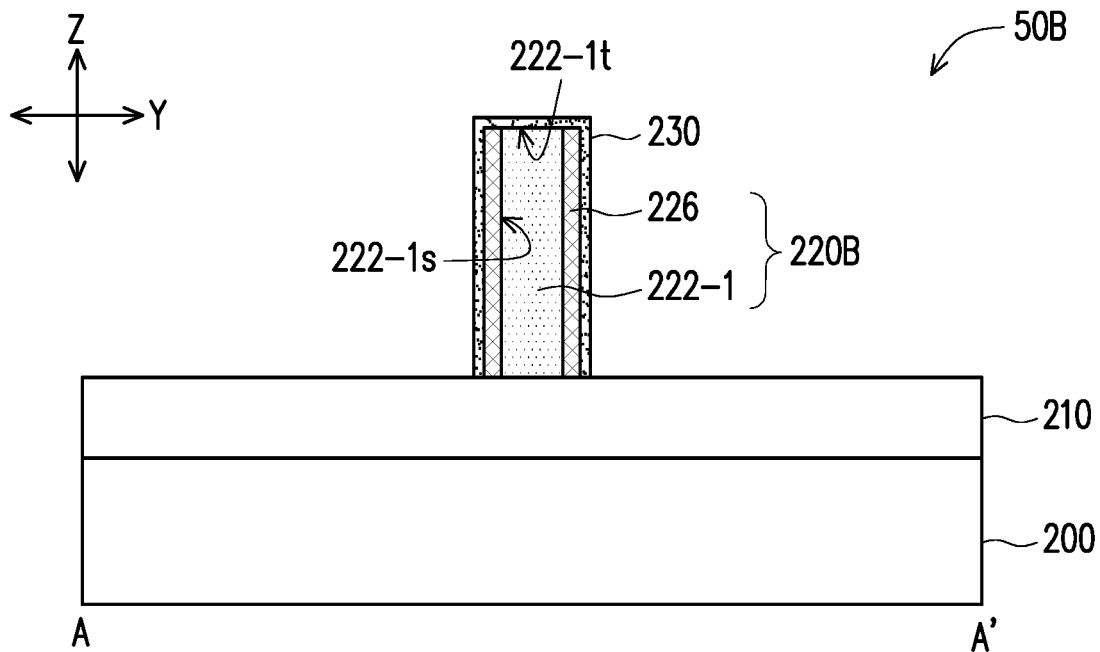
FIG. 21A to FIG. 21B are schematic cross-sectional views of a semiconductor device in accordance with some embodiments of the disclosure.
Figure 21B:
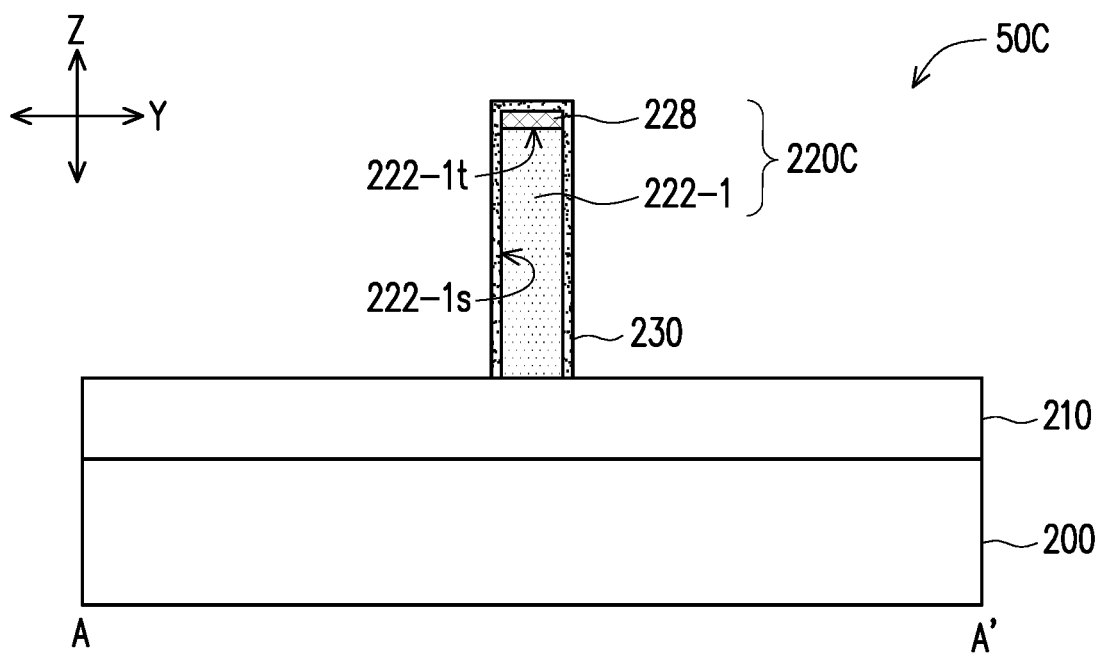
Figure 22:
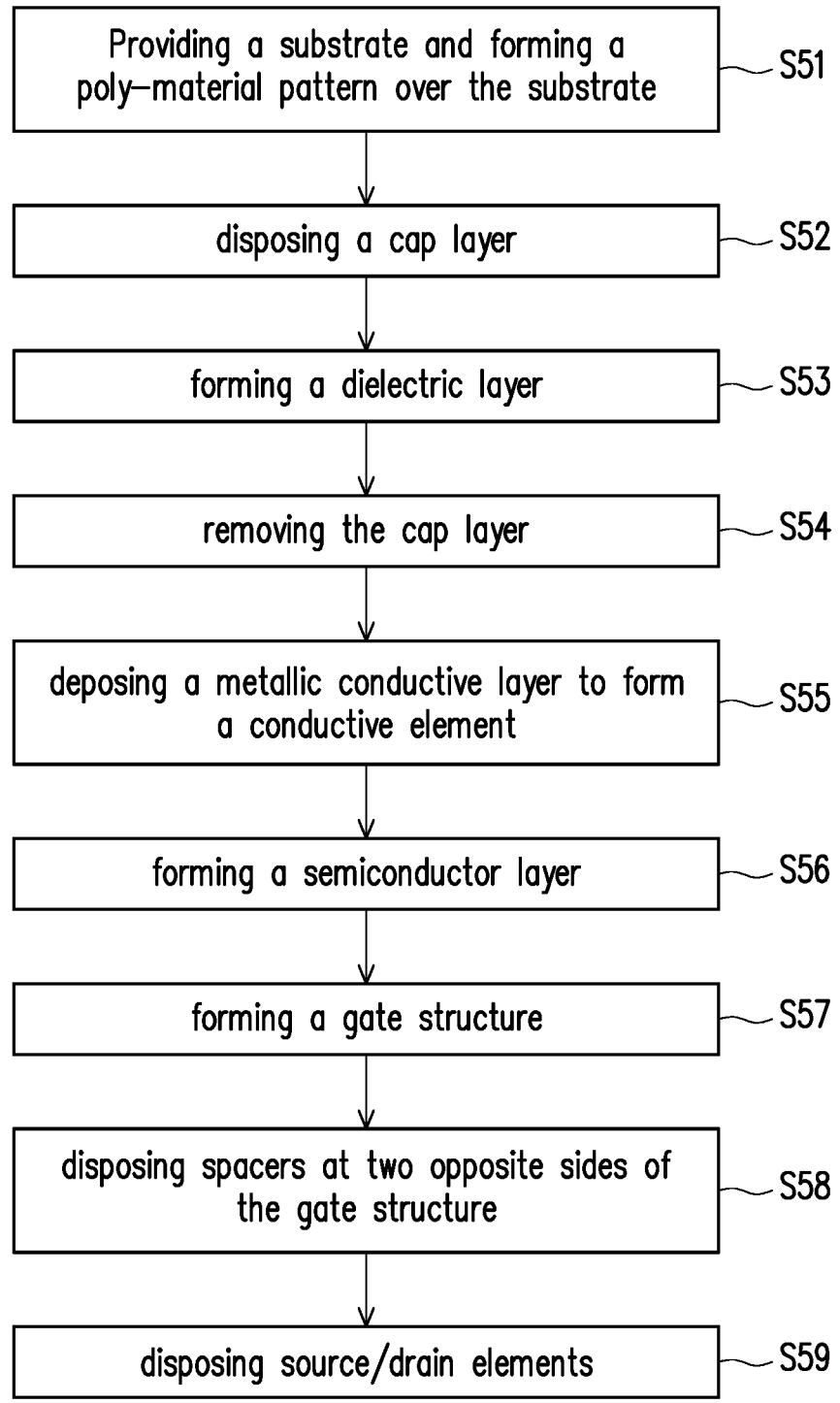
FIG. 22 is a flow chart illustrating a method of manufacturing a semiconductor device in accordance with some embodiments of the disclosure.

FIG. 19A to FIG. 19J are schematic perspective views of various stages in a manufacturing method of a semiconductor device 50A in accordance with some embodiments of the disclosure. FIG. 20A to FIG. 20J are schematic cross-sectional views of various stages in a manufacturing method of the semiconductor device 50A depicted in FIG. 19A to FIG. 19J taken along one of cross-sectional lines AA', BB', and CC'. FIG. 21A to FIG. 21B each are a schematic cross-sectional view of a semiconductor device in accordance with some embodiments of the disclosure. FIG. 22 is a flow chart illustrating a method of manufacturing a semiconductor device in accordance with some embodiments of the disclosure. The elements similar to or substantially the same as the elements described above will use the same reference numbers, and certain details or descriptions (e.g. materials and forming methods) of the same elements and the relationship thereof (e.g. the relative positioning configuration and electrical connection) will not be repeated herein. In FIG. 19A to FIG. 19J and FIG. 20A to FIG. 20J, one transistor (e.g. the semiconductor device 50A) is shown to represent plural transistors obtained following the manufacturing method, however the disclosure is not limited thereto. In other embodiments, more than one transistors are shown to represent plural transistors obtained following the manufacturing method.

Figure 19A:
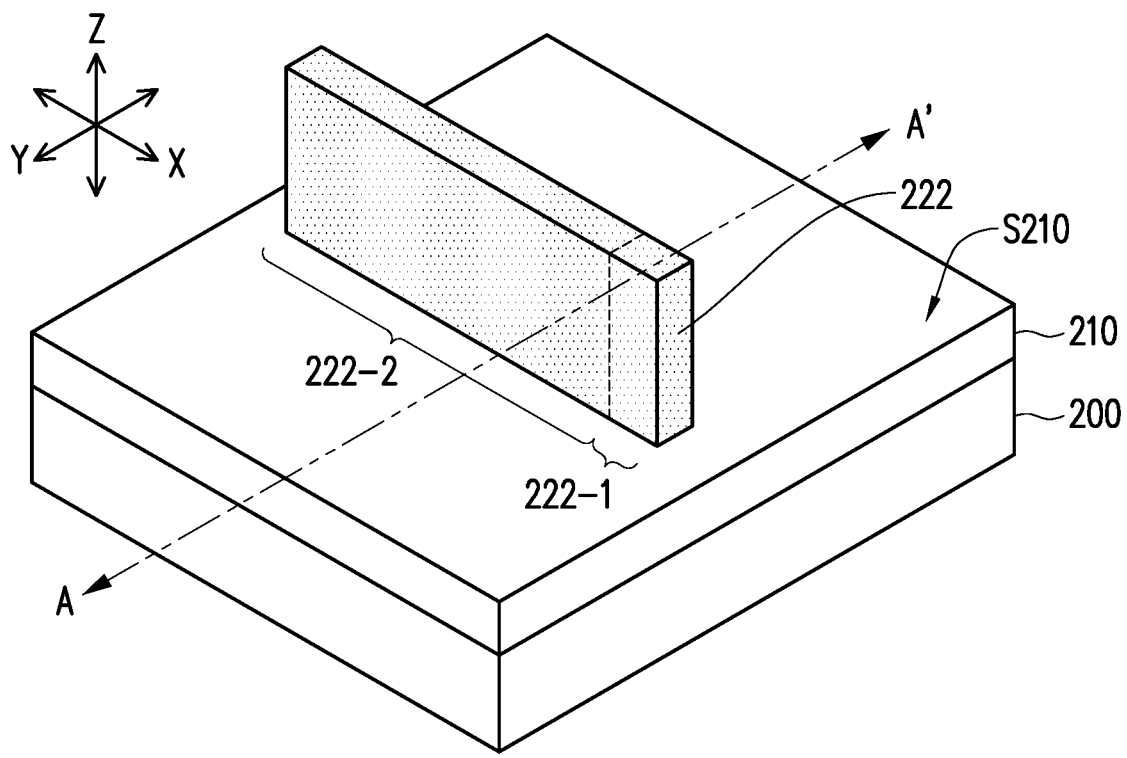
FIG. 19A to FIG. 19J are schematic perspective views of various stages in a manufacturing method of a semiconductor device in accordance with some embodiments of the disclosure.
Figure 20A:
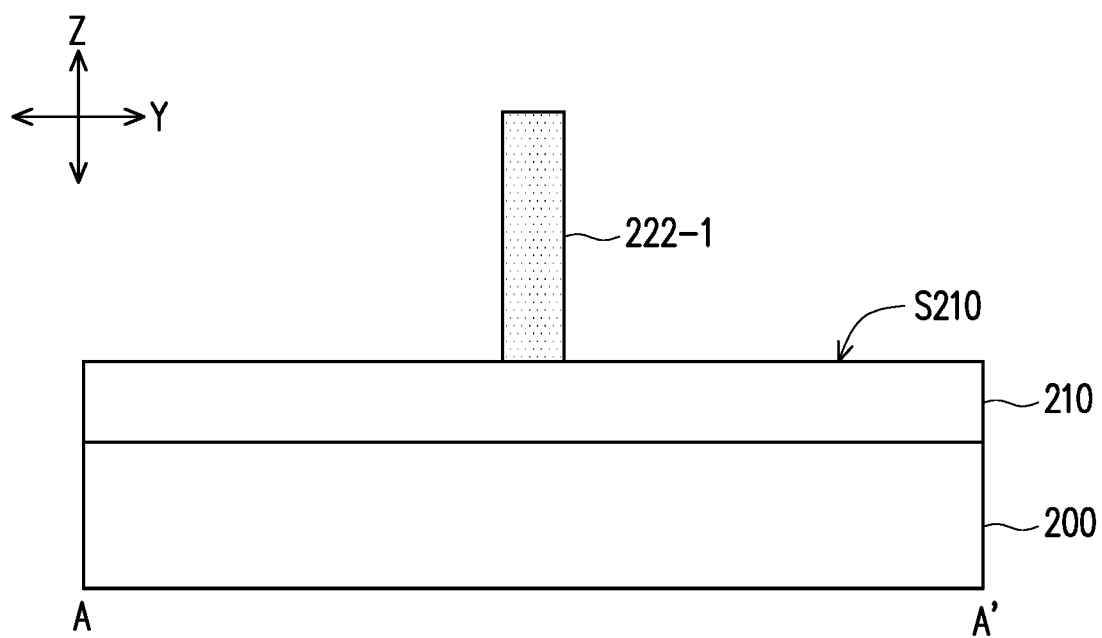
FIG. 20A to FIG. 20J are schematic cross-sectional views of various stages in a manufacturing method of a semiconductor device in accordance with some embodiments of the disclosure.

Referring to FIG. 19A and FIG. 20A, in some embodiments, a substrate 200 is provided, in accordance with step S51 of FIG. 22. In some embodiments, a dielectric layer 210 is formed on the substrate 200. The material and/or forming method of the substrate 200 and the material and/or forming method of the dielectric layer 210 are similar to or substantially the same as the substrate 100 and the dielectric layer 110 described in FIG. 1A and FIG. 2A, and thus are not repeated herein.

Continued on FIG. 19A and FIG. 20A, in some embodiments, a poly-material pattern 222 is formed on the dielectric layer 210 and over the substrate 200, in accordance with step S51 of FIG. 22. For example, the formation of the poly-material pattern 222 may include, but not limited to, forming a doped poly-material film (not shown) over the substrate 200 in a manner of blanket formation to cover-up the dielectric layer 210 and then patterning the doped poly-material film to form the poly-material pattern 222 on the dielectric layer 210 and over the substrate 200. For example, the doped poly-material film may include a doped polysilicon layer, a doped poly-germanium layer, a doped poly-silicon-germanium layer, or the like. The formation of the doped poly-material film may include a suitable deposition process (such as CVD), and the patterning process may include photolithograph and etching processes, in some embodiments. As shown in FIG. 19A, the poly-material pattern 222 is extended along the direction X, for example. However, the disclosure is not limited thereto, where the poly-material pattern 222 may be extended along the direction Y, in an alternative embodiment.

In one embodiment, a material of the poly-material pattern 222 may be the same or different from a material of the poly-material pattern 222 described in FIG. 5A; the disclosure is not limited thereto. In some embodiments, as shown in FIG. 19A and FIG. 20A, the dielectric layer 210 is partially covered by the poly-material pattern 222. In some embodiments, the poly-material pattern 222 includes a periphery portion 222-1 and an active portion 222-2 connected to and adjacent to the periphery portion 222-1, as shown in FIG. 19A. As shown in FIG. 19A and FIG. 20A, the poly-material pattern 222 is located on a surface S210 of the dielectric layer 210 and protrudes away from the surface S210 along the direction Z, for example. In other words, the structure depicted in FIG. 19A and FIG. 20A, as a whole, has a fin-like structure.

Figure 19B:
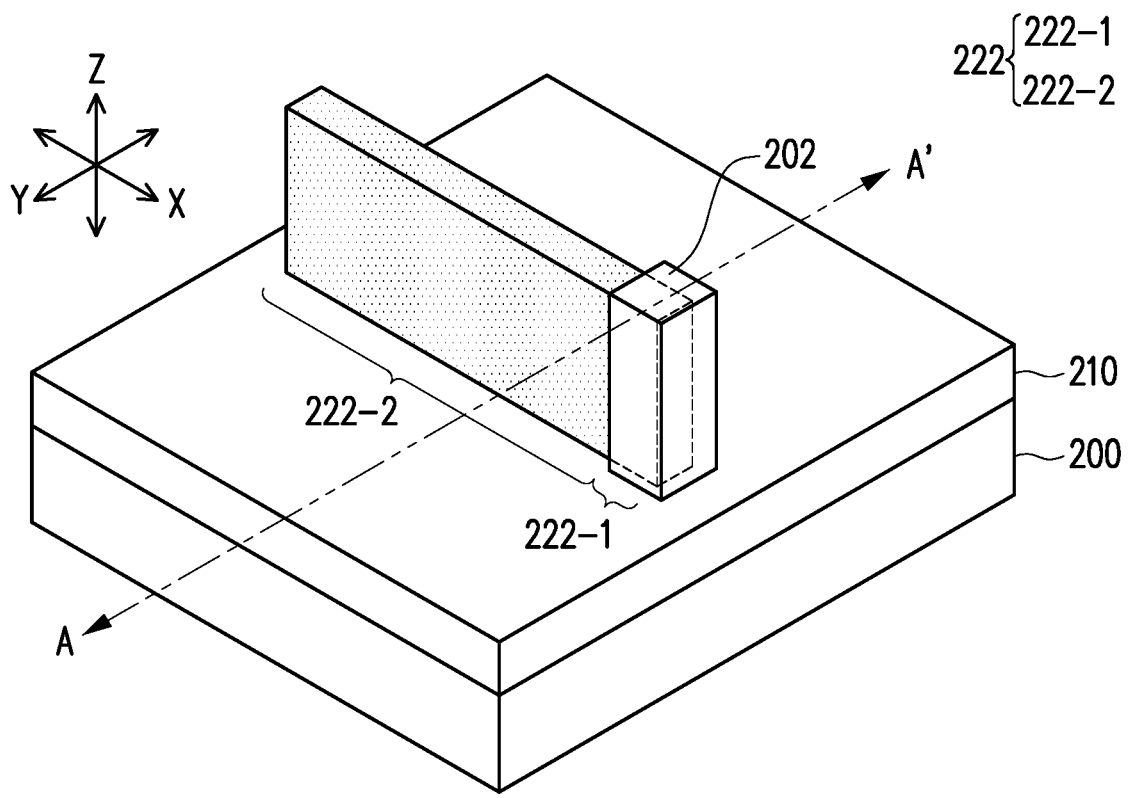
Figure 20B:
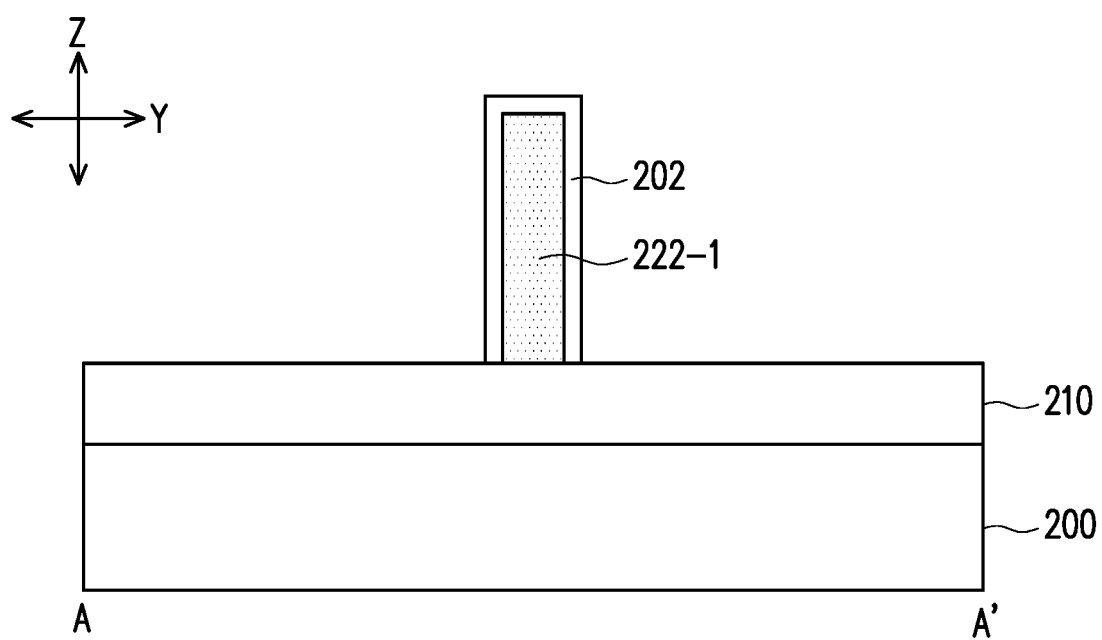

Referring to FIG. 19B and FIG. 20B, in some embodiments, a cap layer 202 is formed on the poly-material pattern 222, in accordance with step S52 of FIG. 22. In some embodiments, as shown in FIG. 19B and FIG. 20B, the cap layer 202 is formed on and entirely covered the periphery portion 222-1 of the poly-material pattern 222, where the active portion 222-2 of the poly-material pattern 222 is exposed by the cap layer 202. In the disclosure, the cap layer 202 may be referred to as a hard mask layer. The cap layer 202 may be a silicon nitride (e.g. SiNx, x is an integer greater than zero) layer, for example. In some embodiments, the cap layer 202 may be formed by deposition and patterning processes. For example, the formation of the cap layer 202 may include, but not limited to, forming a blanket layer of a dielectric material (e.g. silicon nitride) covering the structure depicted in FIG. 19A and FIG. 20A and patterning the dielectric material blanket layer into a pattern covering only the periphery portion 222-1 of the poly-material pattern 222 to form the cap layer 202. The patterning process may include an etching process, such as a dry etching. The disclosure is not limited thereto. As shown in FIG. 19B and FIG. 20B, the cap layer 202 is formed in a shell-shape to cover up the periphery portion 222-1 of the poly-material pattern 222. The active portion 222-2 of the poly-material pattern 222 is free of the cap layer 202. In one embodiment, a material of the cap layer 202 may be the same as a material of the dielectric layer 210. In an alternative embodiment, the material of the cap layer 202 may be different from the material of the dielectric layer 210.

Figure 19C:
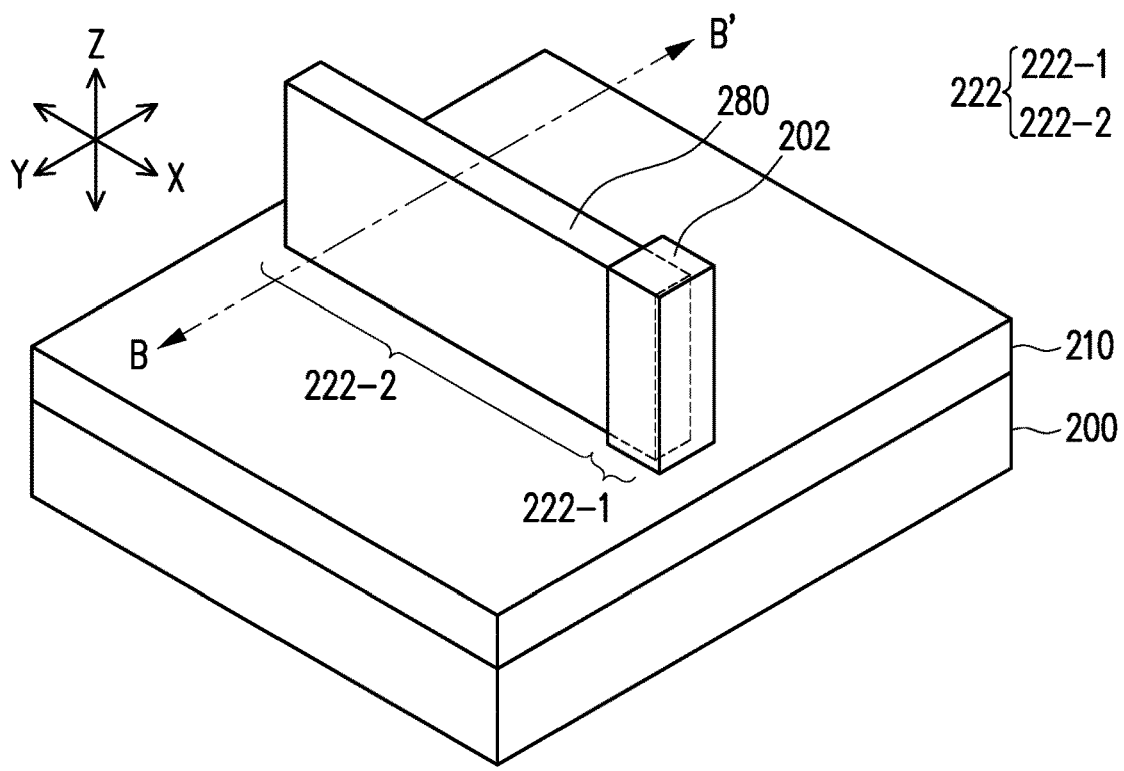
Figure 20C:
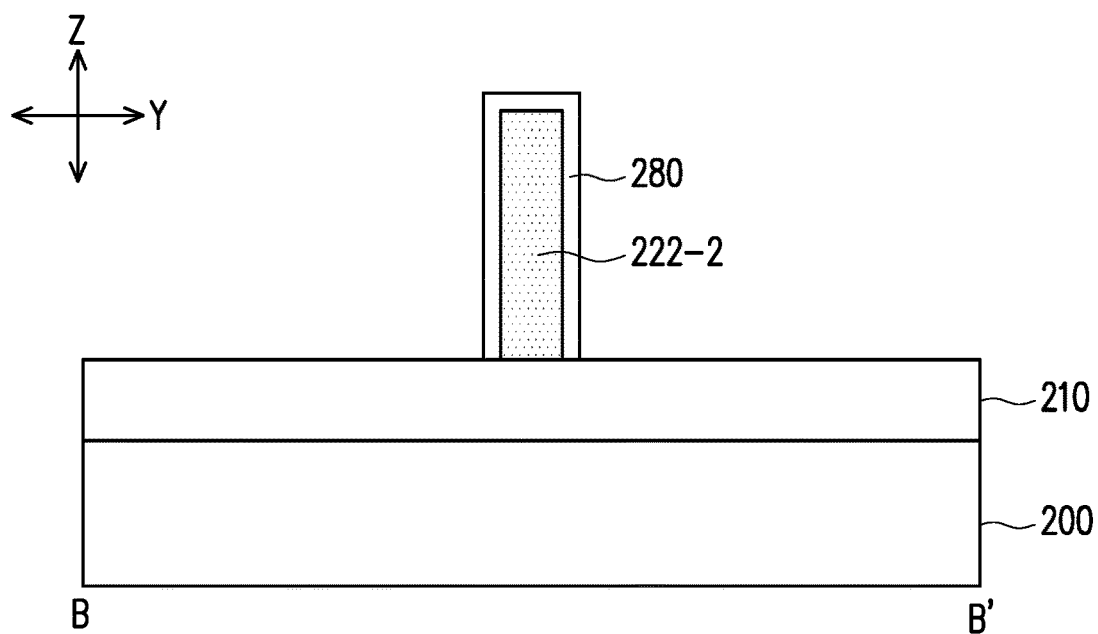

Referring to FIG. 19C and FIG. 20C, in some embodiments, a dielectric layer 280 is formed on the poly-material pattern 222, in accordance with step S53 of FIG. 22. In some embodiments, as shown in FIG. 19C and FIG. 20C, the dielectric layer 280 is formed over the substrate 200 in the active portion 222-2 of the poly-material pattern 222. For example, along the direction X, the cap layer 202 wrapping around the periphery portion 222-1 of the poly-material pattern 222 is aside of the dielectric layer 280 located in the active portion 222-2. For example, top surfaces of the dielectric layer 280 and the cap layer 202 are located at different levels along the direction Z. In some embodiments, the dielectric layer 280 is a silicon oxide (e.g. $SiO_2$) layer, which is formed by a thermal oxidation process. In such embodiments, the dielectric layer 280 is formed at an outer surface of the active portion 222-2 of the poly-material pattern 222 by thermal oxidation, where the silicon (Si) atoms included in the active portion 222-2 of the poly-material pattern 222 is oxidized to form the dielectric layer 202. Consequentially, the dielectric layer 280 is formed to wrap around the active portion 222-2 of the poly-material pattern 222 exposed by the cap layer 202. In one embodiment, a material of the dielectric layer 280 may be the same as a material of the dielectric layer 210. However, the disclosure is not limited thereto. In an alternative embodiment, the material of the dielectric layer 280 may be different from the material of the dielectric layer 210. As shown in FIG. 20C, the dielectric layer 280 is formed in a shell-shape to cover up the active portion 222-2 of the poly-material pattern 222, where a top surface of the dielectric layer 280 is substantially coplanar to a top surface of the cap layer 202. The top surface of the cap layer 202 disposed on and covering the periphery portion 222-1 of the poly-material pattern 222 is free of the dielectric layer 280. In the disclosure, the material of the dielectric layer 280 is different from the material of the cap layer 202.

In other embodiments, the dielectric layer 280 may be formed by deposition and patterning processes, in some embodiments. For example, the formation of the dielectric layer 280 may include, but not limited to, forming a blanket layer of a dielectric material (e.g. $SiO_2$) covering the structure depicted in FIG. 19B and FIG. 20B, and patterning the dielectric material blanket layer into a pattern covering only the active portion 222-2 of the poly-material pattern 222 to form the dielectric layer 280. The patterning process may include photolithography and/or etching processes. For example, the etching process may include a dry etching, a wet etching, and/or a combination thereof. The disclosure is not limited thereto. In such embodiments, the top surface of the dielectric layer 280 may not be coplanar to (e.g. higher than) the top surface of the cap layer 202 along the direction Z. For example, the top surfaces of the dielectric layer 280 and the cap layer 202 are located at different levels along the direction Z, however the disclosure is not limited thereto. In an alternative embodiment, the top surfaces of the dielectric layer 280 and the cap layer 202 are located at the same level along the direction Z.

Figure 19D:
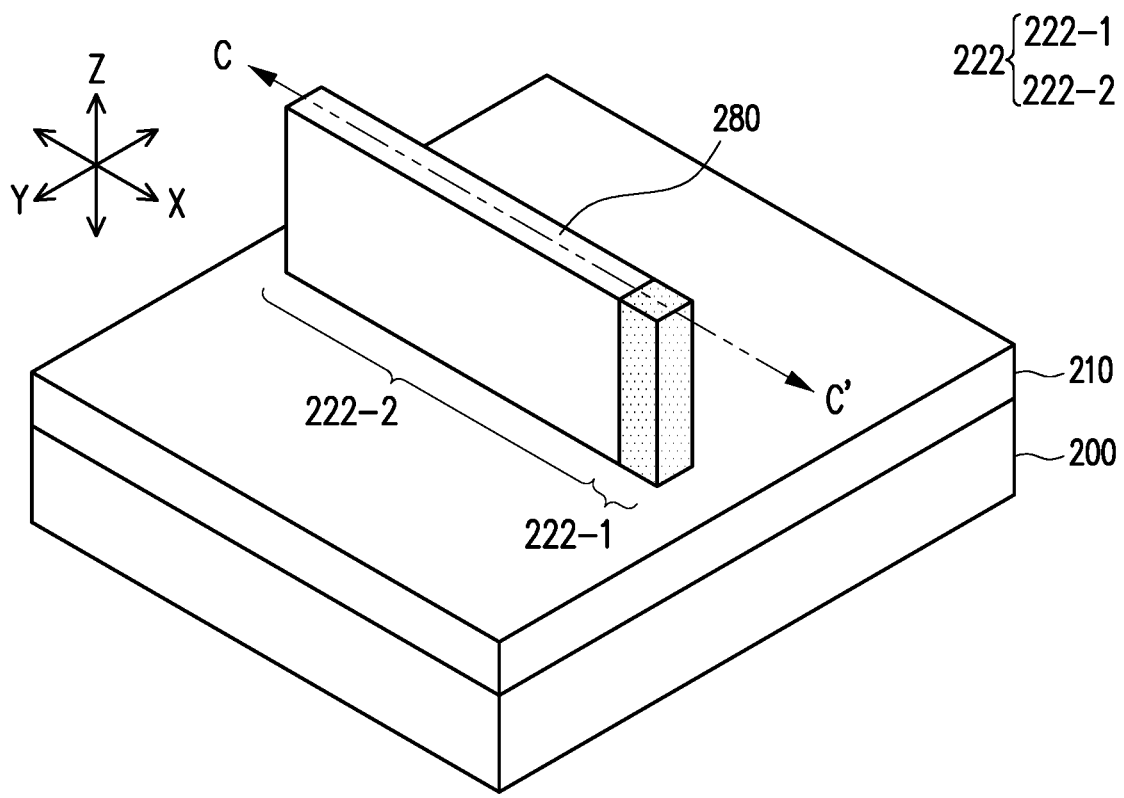
Figure 20D:
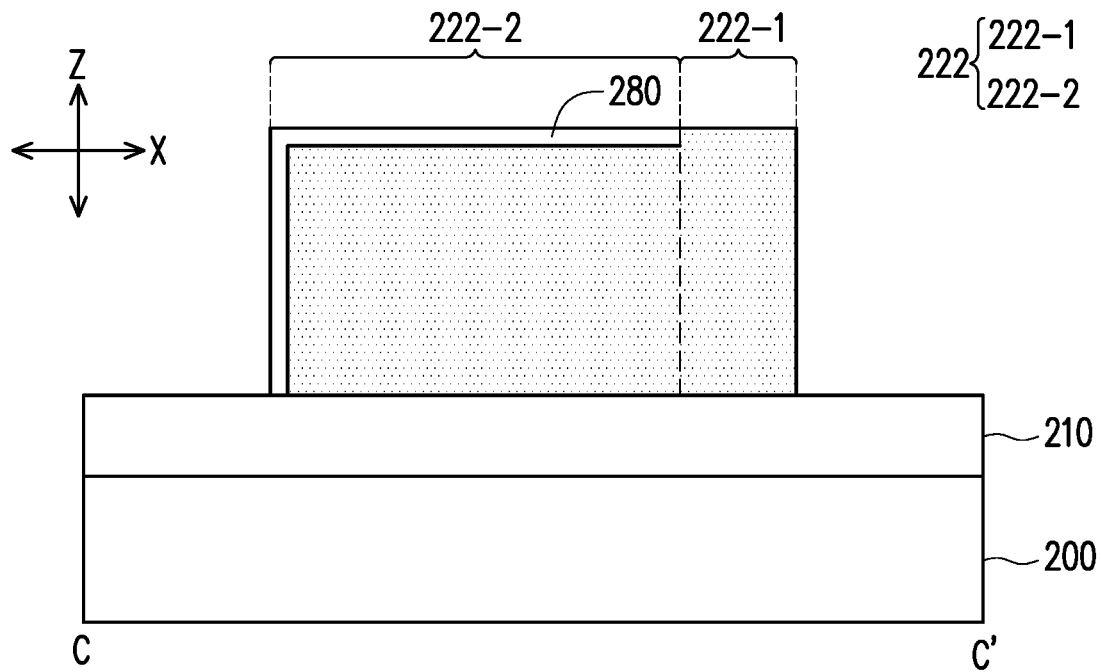

Referring to FIG. 19D and FIG. 20D, in some embodiments, the cap layer 202 is removed from the poly-material pattern 222, in accordance with step S54 of FIG. 22. In some embodiments, the removal of the cap layer 202 is performed by wet etching. For example, the etchant of the wet etching process may include $H_3PO_4$. However, the disclosure is not limited thereto; in an alternative embodiment, the removal of the cap layer 202 may be performed by any suitable removal process(es) without damages to the dielectric layer 280 and the poly-material pattern 222. As shown in FIG. 19D and FIG. 20D, the periphery portion 222-1 of the poly-material pattern 222 is aside of the dielectric layer 280.

Figure 19E:
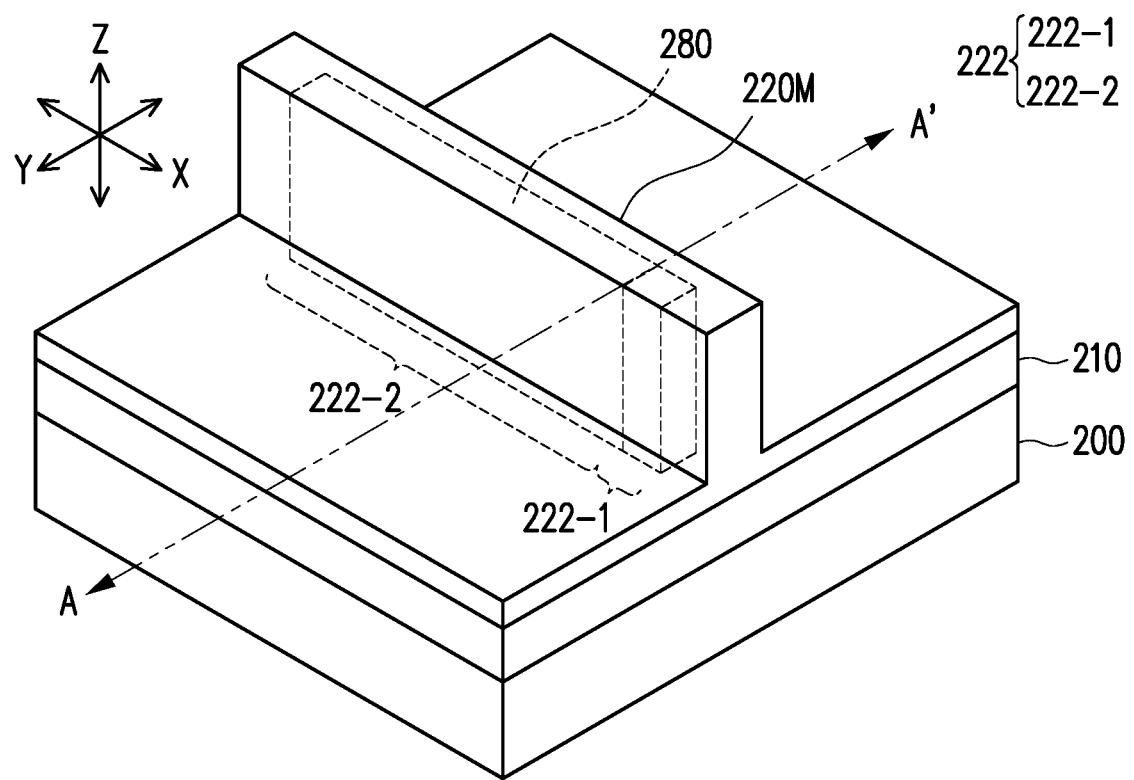
Figure 20E:
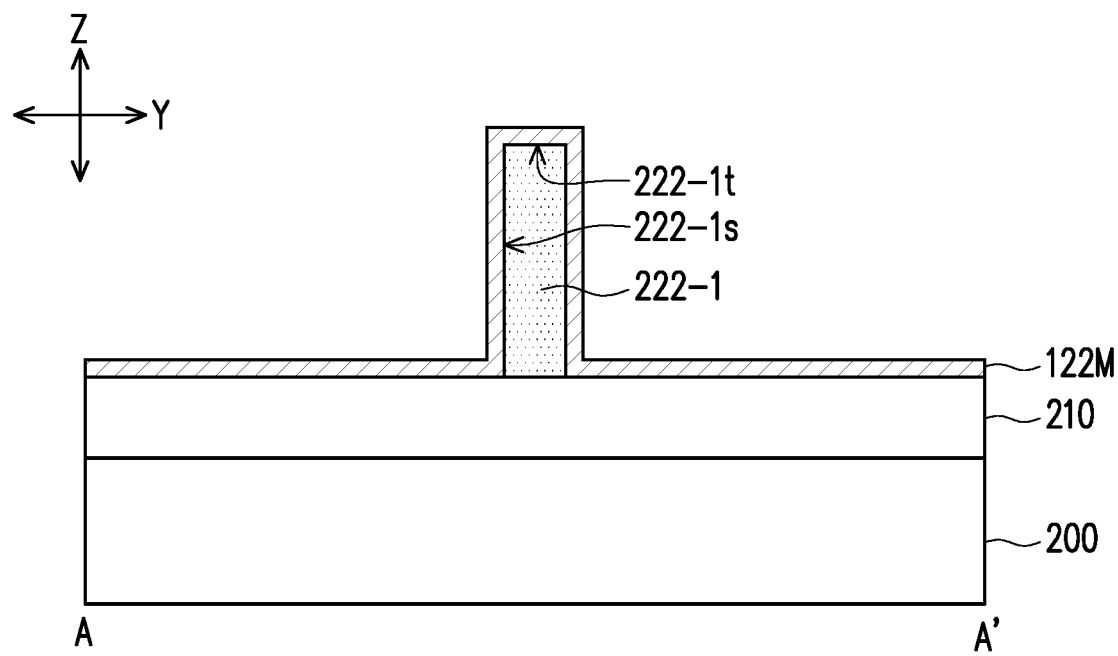

Referring to FIG. 19E and FIG. 20E, in some embodiments, a metallic conductive layer 220M is formed over the substrate 200, in accordance with step S55 of FIG. 22. As shown in FIG. 19E, for example, the metallic conductive layer 220M is conformally formed on the structure depicted in FIG. 19D and FIG. 20D to cover the periphery portion 222-1 of the poly-material pattern 222, the dielectric layer 280, the dielectric layer 210 exposed by the poly-material pattern 222 and to be in contact with the periphery portion 222-1 of the poly-material pattern 222. In some embodiments, a portion of the metallic conductive layer 220M is in contact with (covers) a top surface 222-1t and a sidewall 222-1s of the periphery portion 222-1, as shown in FIG. 20E. The metallic conductive layer 220M may be, for example, a metal layer formed by a suitable deposition process (such as CVD). For example, the metal layer may include W, Pt, Mo, or the like.

Figure 19F:
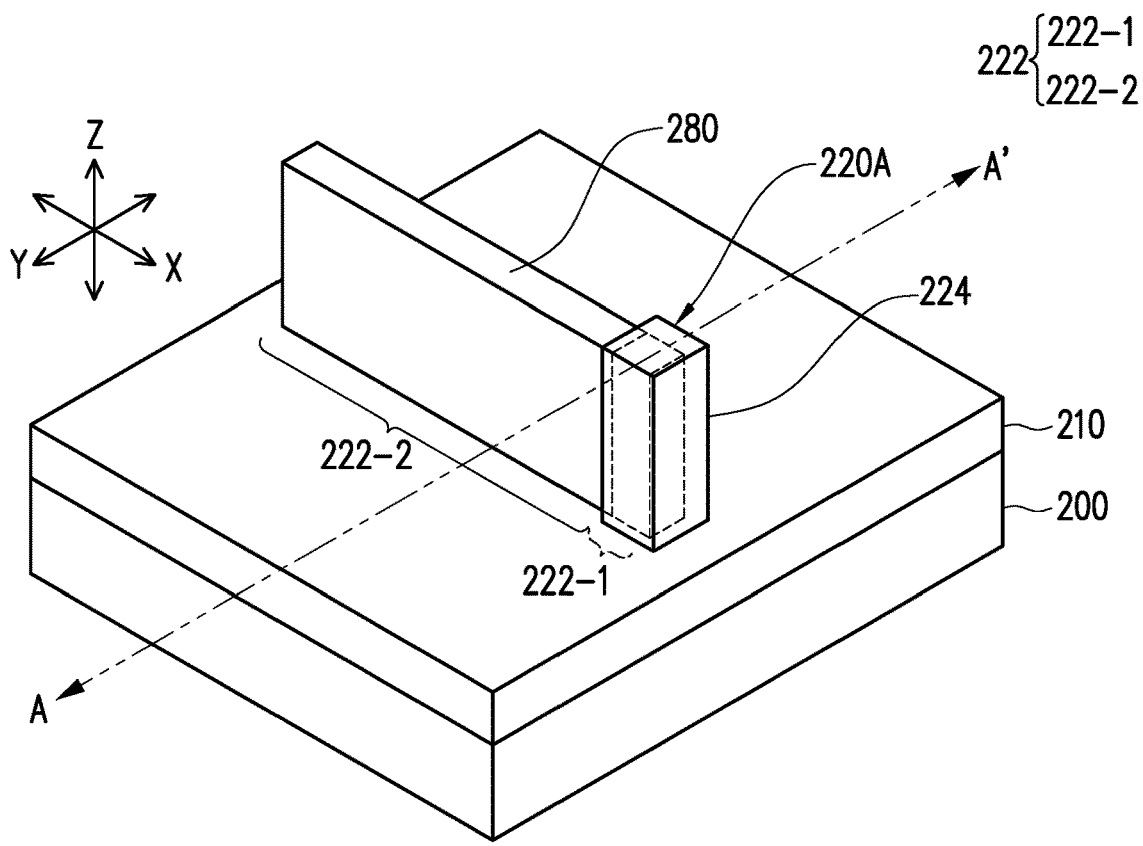
Figure 20F:
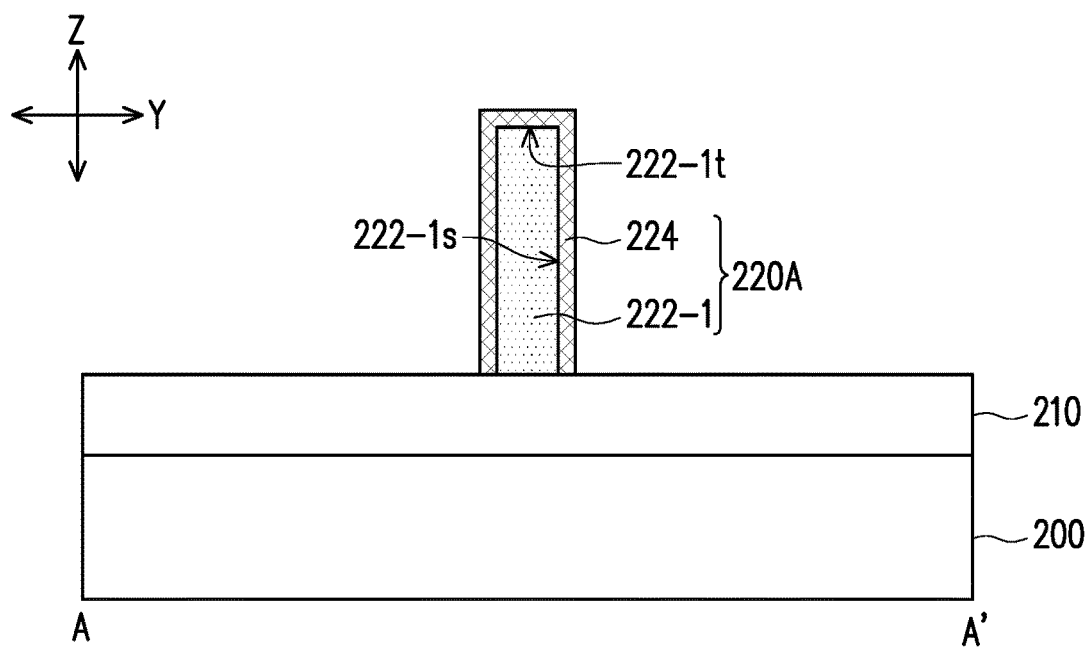

Referring to FIG. 19F and FIG. 20F, in some embodiments, the metallic conductive layer 220M is patterned to form a conductive element 220A, in accordance with step S55 of FIG. 22. In some embodiments, prior to the patterning process, a thermal treatment is further performed on the metallic conductive layer 220M depicted in FIG. 20E. The thermal treatment may include, for example, Ar rapid thermal annealing or H2 furnace thermal annealing, or the like. For example, during the thermal treatment, the metallic conductive layer 220M in contact with the periphery portion 222-1 of the poly-material pattern 222 is reacted to the periphery portion 222-1 and turned into the metal silicide layer 224 while the metallic conductive layer 220M not in contact with the periphery portion 222-1 of the poly-material pattern 222 remains the same. Then, the patterning process is performed to remove the non-reacted portion of the metallic conductive layer 220M. For example, the patterning process may include an etching process or photolithograph and etching processes, where the etching process may include a dry etching, a wet etching, or a combination thereof. In such embodiments, after the thermal treatment, the periphery portion 222-1 and the metal silicide layer 224 together is referred to as the conductive element 220A, where the periphery portion 222-1 is referred to as the inner portion of the conductive element 220A while the metal silicide layer 224 (e.g. a metal silicide) is referred to as the outer portion of the conductive element 220A. As shown in FIG. 19F, the dielectric layer 280 is exposed by the outer portion of the conductive element 220A, for example.

However, the disclosure is not limited thereto. In alternative embodiments, without the thermal process, the metallic conductive layer 220M is patterned to form a metallic conductive layer, where the metallic conductive layer is the portion of the metallic conductive layer 220M in contact with the top surface 222-1t and the sidewall 222-1s of the periphery portion 222-1. In other words, during the patterning process, a portion of the metallic conductive layer 220M is not in contact with the top surface 222-1t and the sidewall 222-1*s* of the periphery portion 222-1 is removed from the substrate 200, and the metallic conductive layer is only disposed on the periphery portion 222-1. As shown in FIG. 20F, the metallic conductive layer is electrically connected to and covers the top surface 222-1*t* and sidewall 222-1*s* of the periphery portion 222-1, where the periphery portion 222-1 and the metallic conductive layer together constitute the conductive element 220A. In such embodiments, the periphery portion 222-1 serves as the inner portion of the conductive element 220A and the metallic conductive layer (e.g. a metal) serves as the outer portion of the conductive element 220A.

In some alternative embodiments, after the formation of the metallic conductive layer, the thermal treatment may be further performed on the metallic conductive layer as described above. For example, during the thermal treatment, the metallic conductive layer in contact with the periphery portion 222-1 of the poly-material pattern 222 is reacted to the periphery portion 222-1 and turned into a metal silicide layer. In such embodiments, after the thermal treatment, the periphery portion 222-1 and the metal silicide layer (generated from the reaction of the metallic conductive layer and the periphery portion 222-1) together is referred to as the conductive element 220A, where the periphery portion 222-1 serves as the inner portion of the conductive element 220A and the metal silicide layer (e.g. a metal silicide) serves as the outer portion of the conductive element 220A.

In some embodiments, the materials and/or forming methods of the conductive element 220A are similar to or substantially the same as the conductive elements 120B, 120A described in FIG. 1A and FIG. 2A along with FIG. 5A to FIG. 5C, FIG. 6A to FIG. 6B, and FIG. 7A to FIG. 7C, and thus are not repeated herein.

Figure 19G:
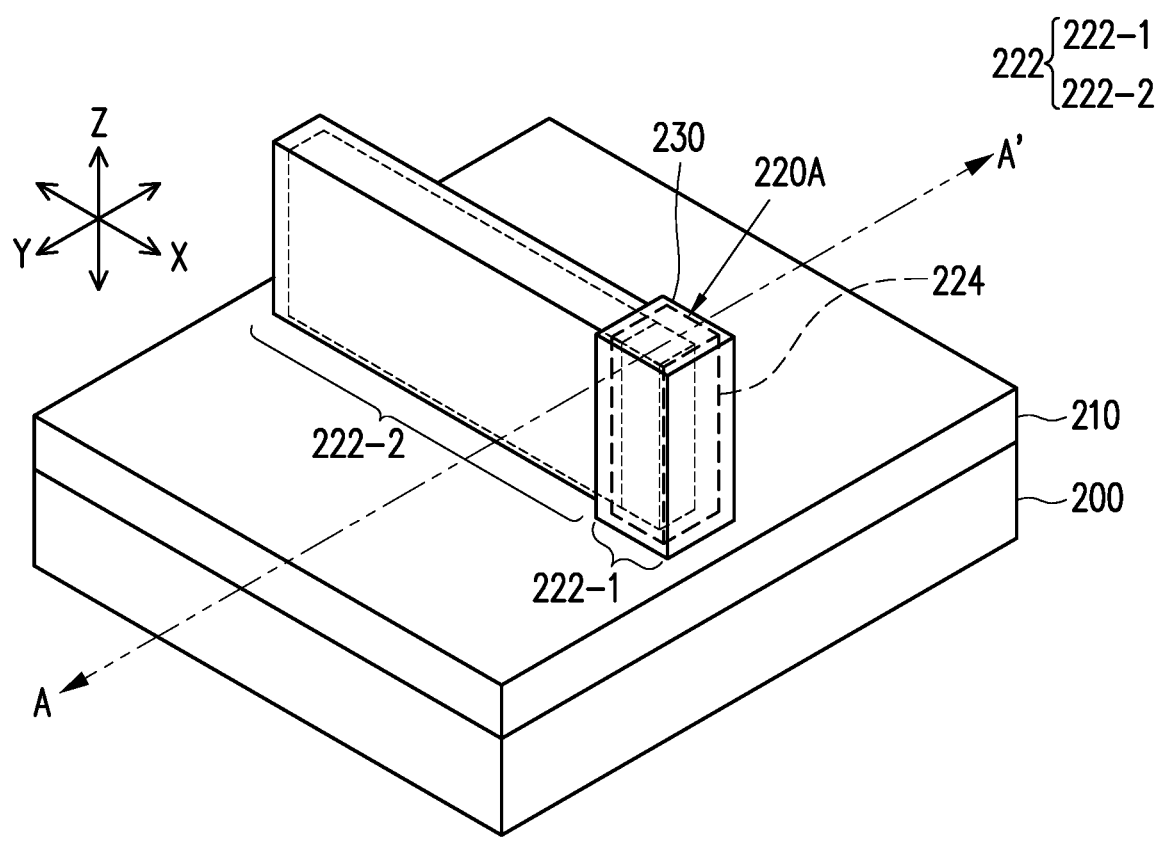
Figure 20G:
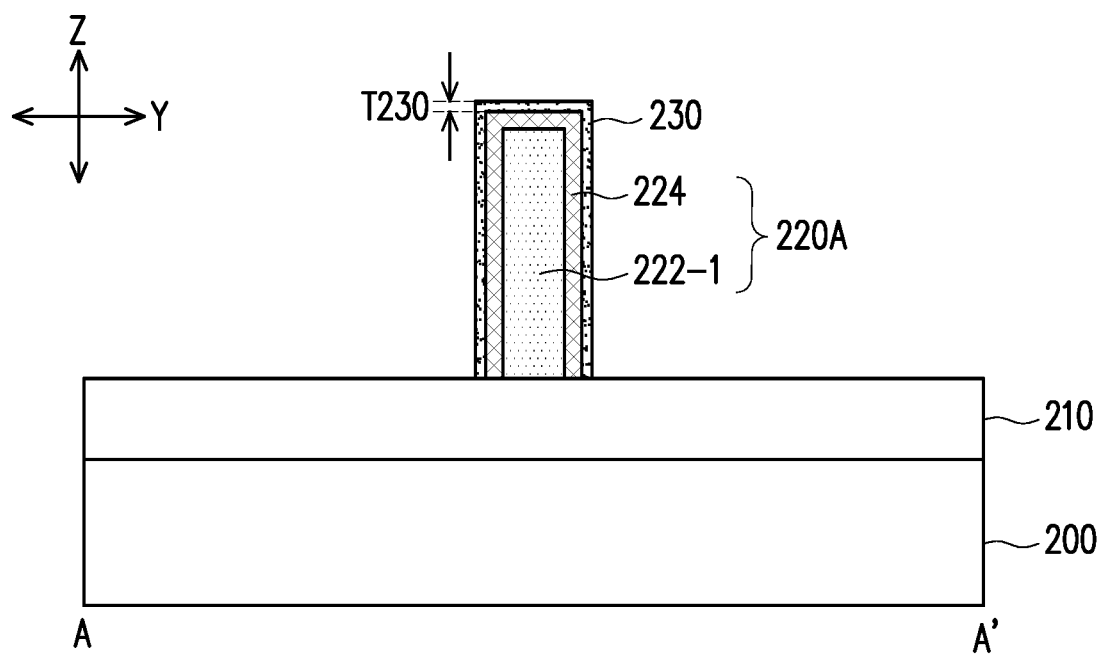
Figure 20H:
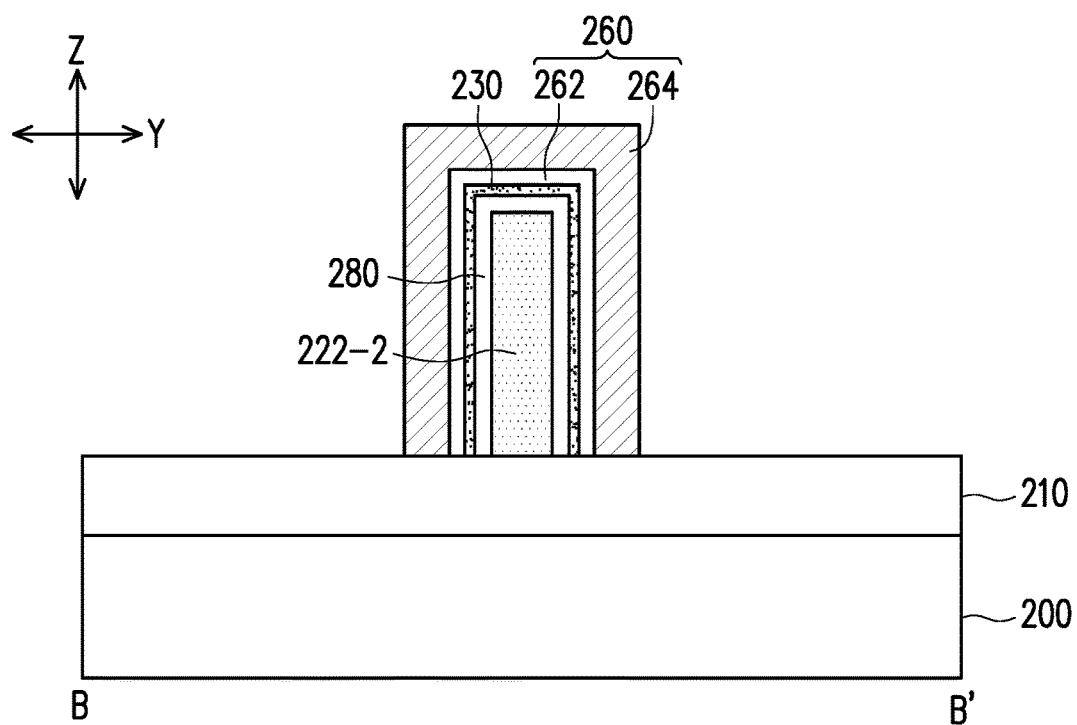

Referring to FIG. 19G and FIG. 20G, in some embodiments, a semiconductor layer 230 is formed over the substrate 200, in accordance with step S56 of FIG. 22. In some embodiments, the semiconductor layer 230 is disposed on the dielectric layer 210 and located on the poly-material pattern 222, where the dielectric layer 280 and the conductive element 220A are covered by the semiconductor layer 230. The material and/or forming method of the semiconductor layer 230 are similar to or substantially the same as the semiconductor layer 130 described in FIG. 1B and FIG. 2B, and thus are not repeated herein. In such embodiment as shown in FIG. 19G and FIG. 20G, the conductive elements 220A serve as a seed layer for forming the semiconductor layer 230 on the active portion 222-2 exposing by the conductive elements 220A. During the deposition, a layer of the transition metal dichalcogenide is formed starting at the conductive elements 220A and extends outward along the direction X, the direction Y, and/or the direction Z to form the semiconductor layer 230 on an exposed surface of the active portion 222-2. In some embodiments, along the direction Z, a thickness T230 of the semiconductor layer 230 is approximately ranging from 0.5 nm to 5.0 nm. As shown in FIG. 20H, the semiconductor layer 230 is electrically connected to and wraps around (covers) the conductive elements 220A. Owing to the conductive element 220A, the formation of the semiconductor layer 230 is promoted; thus, the yield of the semiconductor device 50A is improved.

Figure 19H:
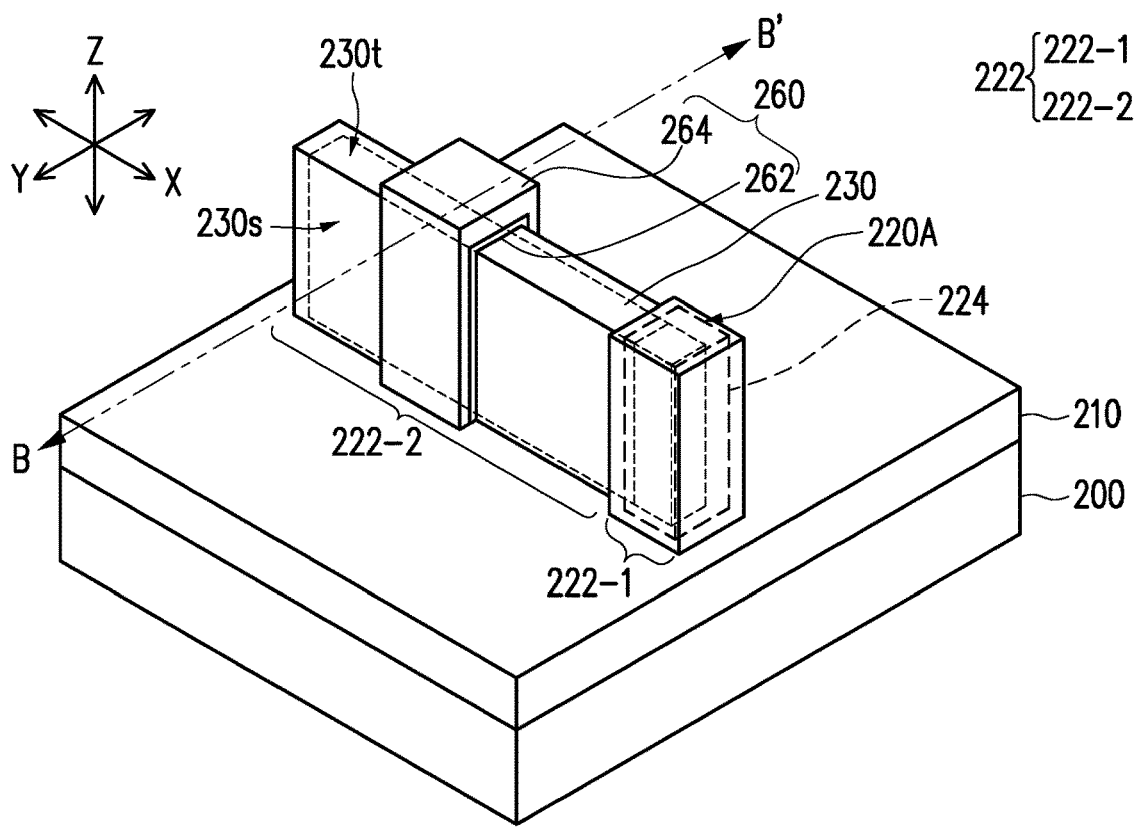

Referring to FIG. 19H and FIG. 20H, in some embodiments, a gate structure 260 is formed over the substrate 200, in accordance with step S57 of FIG. 22. In some embodiments, the gate structure 260 is formed on the dielectric layer 210 and disposed on the semiconductor layer 230 located on the active portion 222-2 of the poly-material pattern 222. For example, a portion of a top surface 230*t* and a portion of each of two opposite sidewalls 230*s* (along the direction Y) of the active portion 222-2 are covered by the gate structure 260. In other words, the gate structure 260 is extended along the direction Y, for example. However, in an alternative embodiment, the gate structure 260 may be extended along the direction X, as long as the extending directions of the gate structure 260 and the poly-material pattern 222 are different from each other. As shown in FIG. 19H and FIG. 20H, the gate structure 260 includes a gate dielectric layer 262 and a gate electrode 264 disposed on the gate dielectric layer 262, for example. The material and/or forming method of the gate dielectric layer 262 and the material and/or forming method of the gate electrode 264 are similar to or substantially the same as the gate dielectric layer 162 and the gate electrode 164 described in FIG. 1C and FIG. 2C, and thus are not repeated herein. As shown in FIG. 19H and FIG. 20H, the gate dielectric layer 162 and the gate electrode 164 share on the same profile on the X-Y plane, for example. In some embodiments, the gate electrode 164 is separated from the semiconductor layer 230 through the gate dielectric layer 162 while the gate electrode 164 is overlapped with the semiconductor layer 230.

Figure 19I:
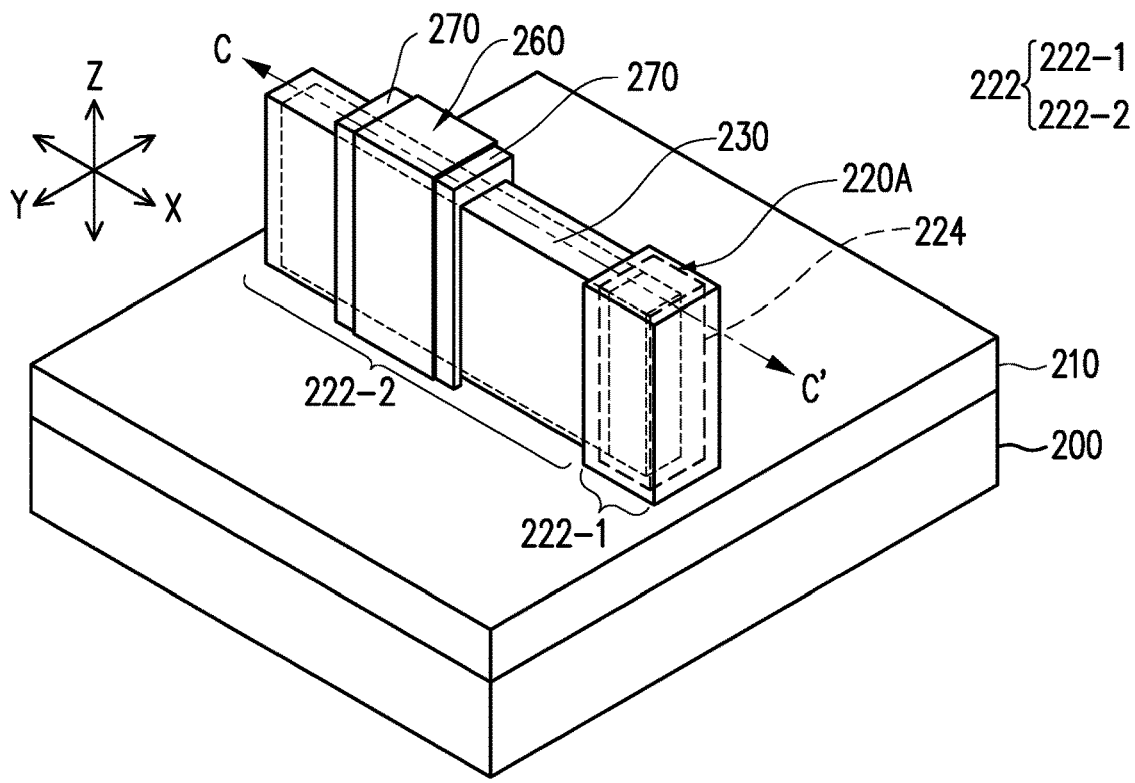
Figure 20I:
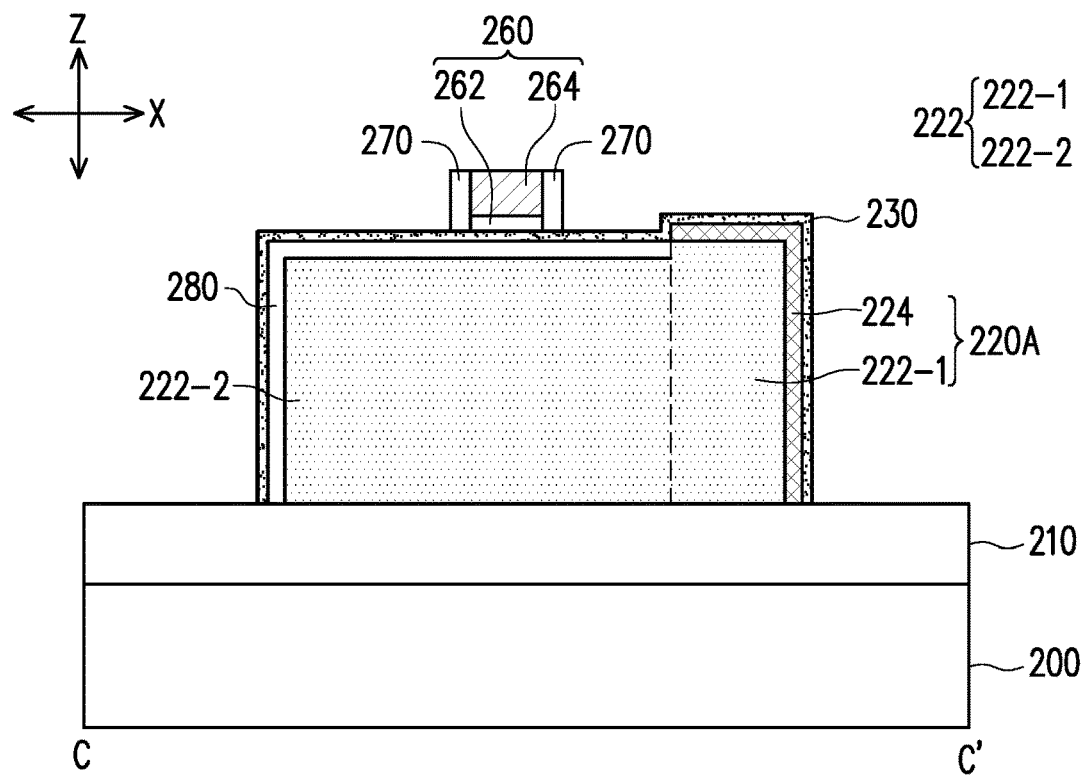

Referring to FIG. 19I and FIG. 20I, in some embodiments, a pair of spacers 270 are formed on sidewalls of the gate structure 260 over the substrate 200, in accordance with step S58 of FIG. 22. In other words, the gate structure 260 is sandwiched between the pair of spacers 270, for example. In some embodiments, the pair of spacers 270 are disposed on the semiconductor layer 230 located on the active portion 222-2 and at two opposite sidewalls of the gate structure 260 along the direction X. For example, the extending direction of the pair of spacers 270 is the same as the extending direction of the gate structure 260, e.g. the direction Y. The pair of spacers 270 are overlapped with a portion of the semiconductor layer 230, for example. The spacers 270 are formed of dielectric materials, such as silicon oxide, silicon nitride, SiCN, high-k dielectric materials (such as SiCON), or a combination thereof, in some embodiments. The spacers 270 may be formed by deposition and patterning processes. For example, the deposition process may include a suitable process such as an ALD process, a CVD process, or a combination thereof. The patterning process may include a suitable process such as a photolithograph process or an etching process, for example. In certain embodiments, the materials of the spacers 270 may be the same as the materials of the gate dielectric layer 262, the disclosure is not limited thereto. The spacers 270 may include a single layer or multilayer structure. As shown in FIG. 19I and FIG. 20I, sidewalls of the gate structure 260 (e.g. the sidewalls of the gate dielectric layer 262 and the sidewalls of the gate electrode 264) are in contact with the pair of spacers 270. In some embodiments, one of the spacers 270 is located between the gate structure 260 and the conductive element 220A along the direction X.

Figure 19J:
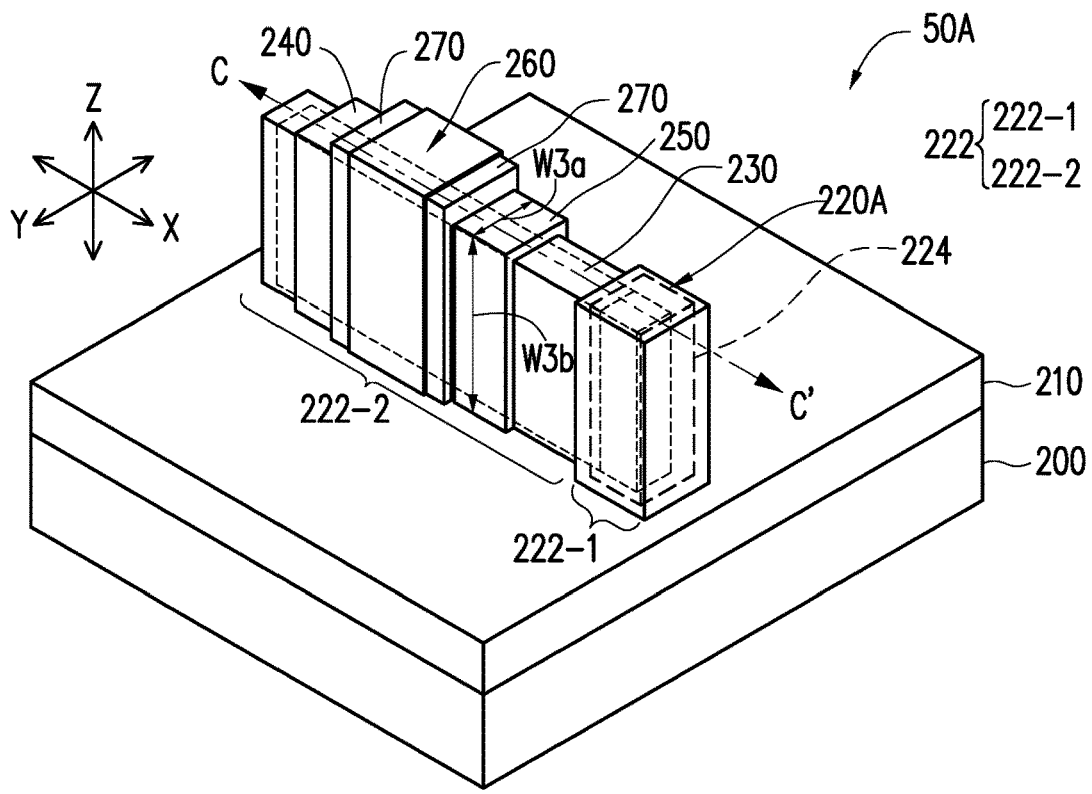
Figure 20J:
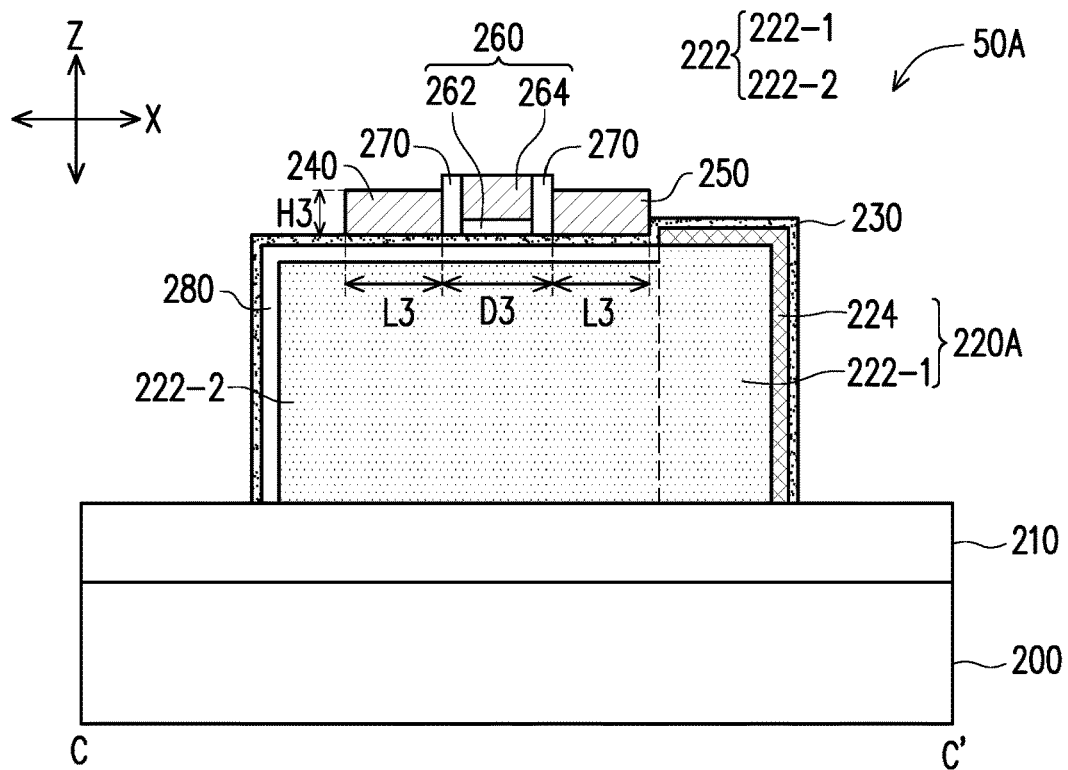

Referring to FIG. 19J and FIG. 20J, in some embodiments, a source/drain element 240 and a source/drain element 250 are formed over the substrate 200, in accordance with step S59 of FIG. 22. In some embodiments, the source/drain elements 240, 250 are disposed on the semiconductor layer 230 and at two opposite sidewalls of the gate structure 260 along the direction X. For example, along the direction X, one of the spacers 270 is sandwiched between the gate structure 260 and the source/drain element 240, and other one of the spacers 270 is sandwiched between the gate structure 260 and the source/drain element 250, as shown in FIG. 19J and FIG. 20J. In some embodiments, one of the spacers 270 is separated from the conductive element 220A via the source/drain element 250 along the direction X. In some embodiments, the source/drain elements 240, 250 are not in contact with the gate structure 260, and are not overlapped with the gate structure 260 on the X-Y plane. In other words, the gate structure 260 are spaced apart from the source/drain elements 240, 250 along the direction X and direction Y. In some embodiments, as shown in FIG. 19J and FIG. 20J, the source/drain elements 240, 250 are in contact with the semiconductor layer 230, and are overlapped with (covering) the semiconductor layer 230 on the X-Y plane. The materials and/or forming methods of the source/drain elements 240, 250 are similar to or substantially the same as the source/drain elements 140, 150 described in FIG. 11A to FIG. 11C, and thus are not repeated herein. As shown FIG. 19J and FIG. 20J, for example, the conductive element 220A serving as the seed layer of the semiconductor layer 230 is separated and spacing apart from the source/drain elements 240, 250 and the gate structure 260 (including the gate electrode 264 and the gate dielectric layer 262). As shown in FIG. 20J, in some embodiments, the source/drain elements 240, 250 are spaced apart to each other with a distance D3 therebetween, where the distance D3 is approximately ranging from 5 nm to 10 µm. In some embodiments, the source/drain elements 240, 250 each has a length L3 approximately ranging from 10 nm to 500 nm along the direction X, and a height H3 approximately ranging from 30 nm to 300 nm along the direction Z. In some embodiments, as shown in FIG. 19J, each of the source/drain elements 240 has a width W3 (e.g. W3=W3a+2*W3b), where along the direction Y, a width W3a of each of the source/drain elements 240, 250 is approximately ranging from 5 nm to 500 nm, and along the direction Z, a width W3b of each of the source/drain elements 240, 250 is approximately ranging from 10 nm to 100 nm.

Up to this, the manufacture of the semiconductor device 50A is finished. In the disclosure, a portion of the semiconductor layer 230 sandwiched between the source/drain elements 240, 250 and overlapped with the gate electrode 264 is referred to as a channel (portion) of the semiconductor device 50A while the source/drain elements 240, 250 both serve as source/drains of the semiconductor device 50A, and a conduction status of the channel is controlled by a voltage applied onto the gate electrode 264. In other words, the gate electrode 264 serves as the gate of the semiconductor device 50A to provide a channel control of the semiconductor device 50A. Owing to such semiconductor device 50A and the manufacturing method thereof, the sulfidation in the source/drain elements of the semiconductor device 50A is greatly suppressed; thus, the performance of the semiconductor device 50A is improved. Owing to such configuration, the adhesion strength between the dielectric layer 210 and the poly-material portion 222 is greatly enhanced, thereby peeling issue occurring at an interface thereof in a thermal treatment is suppressed; thus, the yield of the semiconductor devices 50A is increased.

However, the disclosure is not limited thereto. In an alternative embodiment, the conductive element 220A may be replaced with a conductive element 220B, see a semiconductor device 50B as shown in FIG. 21A. The elements similar to or substantially the same as the elements described previously will use the same reference numbers, and certain details or descriptions of the same elements may not be repeated herein. As illustrated in FIG. 21A, in some embodiments, the conductive element 220B includes the periphery portion 222-1 of the poly-material pattern 222 (referred to as an inner portion of the conductive element 220B) and a metallic conductive layer 226 (referred to as an outer portion of the conductive element 220B) connecting to the sidewall 222-1s of the periphery portion 222-1 of the poly-material pattern 222. For example, in the conductive element 220B, the metallic conductive layer 226 is formed in a form of a closed frame shape (for example, viewing from the plane view, e.g. on the X-Y plane) covering the sidewall 222-1s of the periphery portion 222-1 of the poly-material pattern 222. For example, as shown in FIG. 21A, the metallic conductive layer 226 is not connected to (and in contact with) the top surface 222-1t of the periphery portion 222-1 of the poly-material pattern 222. In other words, the top surface 222-1t of the periphery portion 222-1 of the poly-material pattern 222 is accessibly revealed by the metallic conductive layer 226. As shown in FIG. 21A, the top surface 222-1t of the periphery portion 222-1 of the poly-material pattern 222 is in contact with the semiconductor layer 230, in some embodiments.

In a further alternative embodiment, the conductive element 220A may be replaced with a conductive element 220C, see a semiconductor device 50C as shown in FIG. 21B. The elements similar to or substantially the same as the elements described previously will use the same reference numbers, and certain details or descriptions of the same elements may not be repeated herein. As illustrated in FIG. 21B, in some embodiments, the conductive element 220C includes the periphery portion 222-1 of the poly-material pattern 222 (referred to as an inner portion of the conductive element 220C) and a metallic conductive layer 228 (referred to as an outer portion of the conductive element 220C) connecting to the top surface 222-1t of the periphery portion 222-1 of the poly-material pattern 222. For example, in the conductive element 220C, the metallic conductive layer 228 is formed in a form of a solid plate shape (for example, viewing from the plane view, e.g. on the X-Y plane) atop the top surface 222-1t of the periphery portion 222-1 of the poly-material pattern 222 and is free from the sidewall 222-1s of the periphery portion 222-1 of the poly-material pattern 222. For example, as shown in FIG. 21B, the metallic conductive layer 228 is not connected to (and in contact with) the sidewall 222-1s of the periphery portion 222-1 of the poly-material pattern 222. In other words, the sidewall 222-1s of the periphery portion 222-1 of the poly-material pattern 222 is accessibly revealed by the metallic conductive layer 228. As shown in FIG. 21B, the sidewall 222-1s of the periphery portion 222-1 of the poly-material pattern 222 is in contact with the semiconductor layer 230, in some embodiments.

The materials and/or forming methods of the conductive elements 220B, 220C are similar to or substantially the same as the conductive elements 120B, 120C respectively described in FIG. 8A to FIG. 8B and FIG. 9A to FIG. 9B, and thus are not repeated herein.

Figure 23:
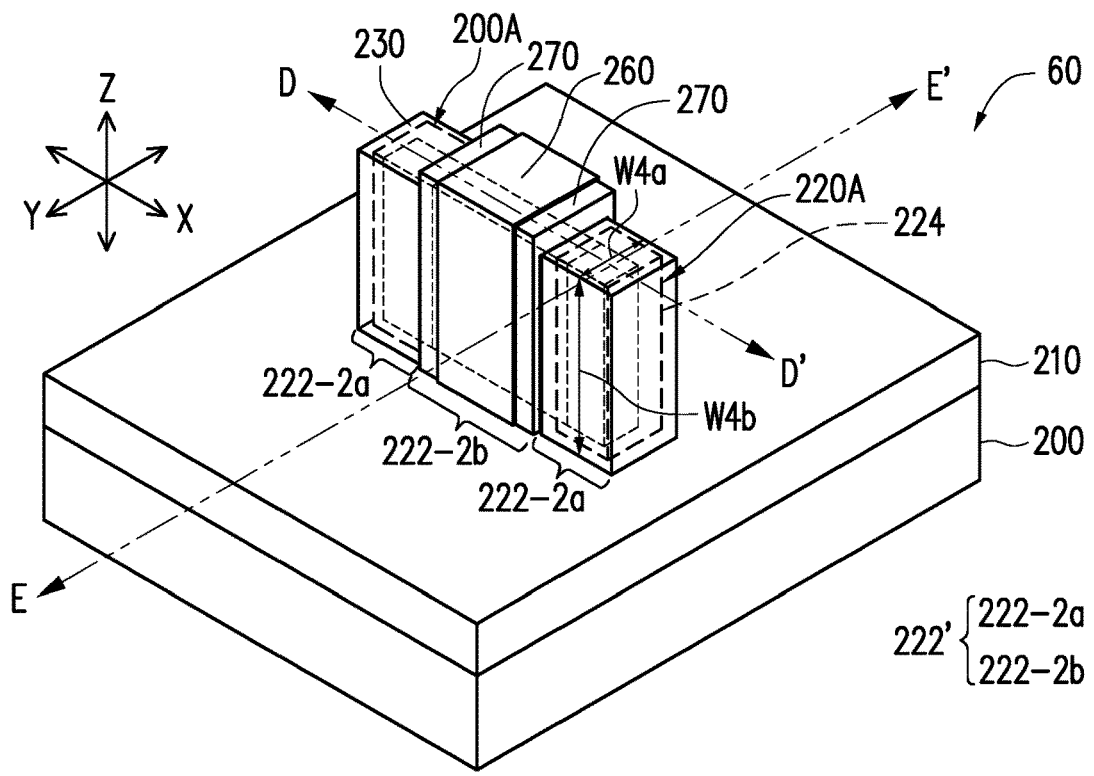
FIG. 23 is a schematic perspective view of a semiconductor device in accordance with some embodiments of the disclosure.
Figure 24:
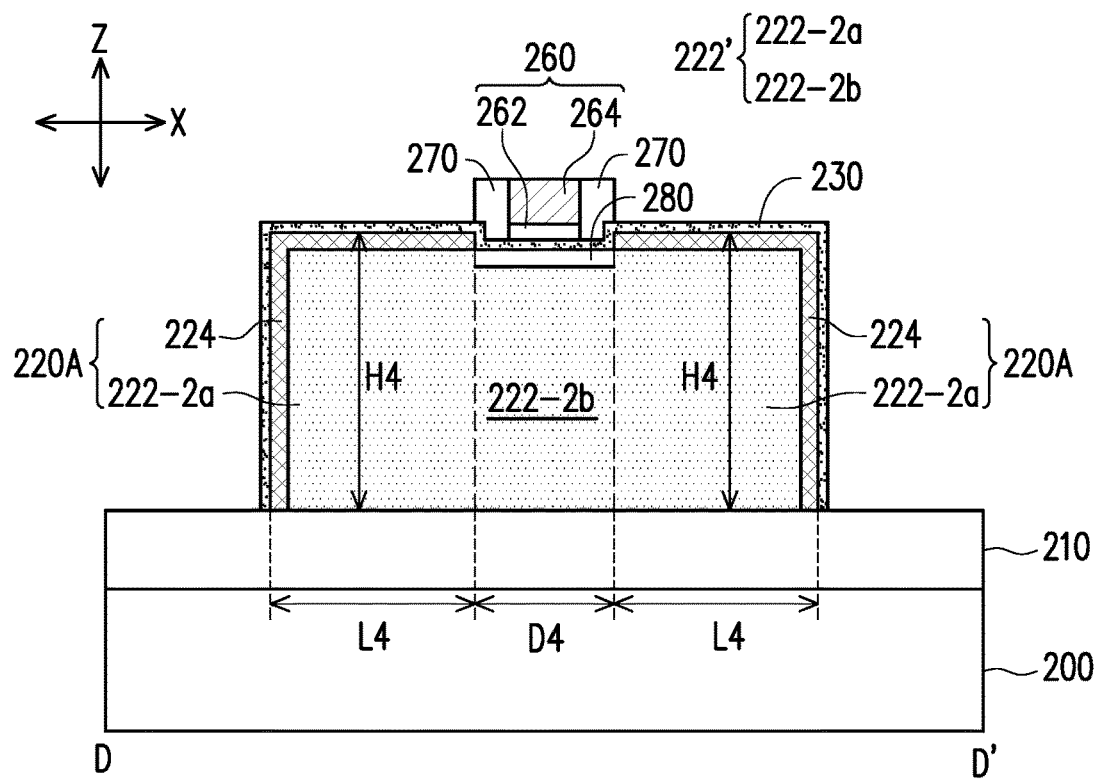
FIG. 24 are schematic cross-sectional views of a semiconductor device in accordance with some embodiments of the disclosure.
Figure 25:
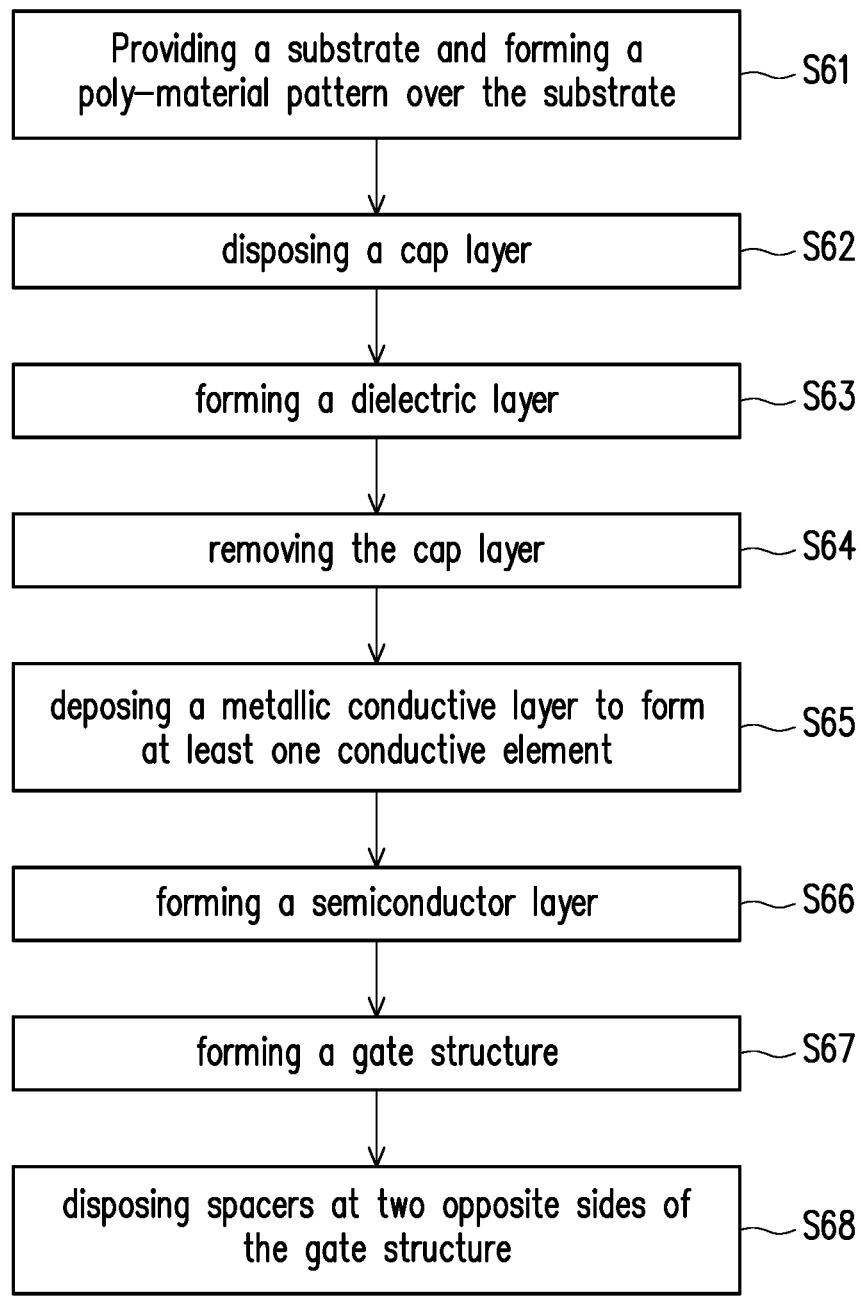
FIG. 25 is a flow chart illustrating a method of manufacturing a semiconductor device in accordance with some embodiments of the disclosure.

FIG. 23 is a schematic perspective view of a semiconductor device 60 in accordance with some embodiments of the disclosure. FIG. 24 are schematic cross-sectional views of the semiconductor device 60 depicted in FIG. 23 taken along a cross-sectional line DD'. FIG. 25 is a flow chart illustrating a method of manufacturing a semiconductor device in accordance with some embodiments of the disclosure. In some embodiments, the semiconductor device 50A depicted in FIG. 19J and the semiconductor device 60 depicted in FIG. 23 are similar; such that the elements similar to or substantially the same as the elements described above will use the same reference numbers, and certain details or descriptions (e.g. materials and forming methods) of the same elements and the relationship thereof (e.g. the relative positioning configuration and electrical connection)

will not be repeated herein. Referring to FIG. 19J and FIG. 23, one difference is that, for the semiconductor device 60 depicted in FIG. 23, two conductive elements 220A are adopted instead of one conductive element 220A, where the two conductive elements 220A respectively substitute the source/drain elements 240, 250, and the source/drain elements 240, 250 are excluded from the semiconductor device 60.

As illustrated in FIG. 23 and FIG. 24, in some embodiments, the semiconductor device 60 includes the substrate 200, the dielectric layer 210 disposed on the substrate 200, a poly-material pattern 222' (having first active portions 222-2a and a second active portion 222-2b) disposed on the dielectric layer 210, the metallic conductive layer 224 disposed on the first active portions 222-2a, the dielectric layer 280 disposed on the second active portion 222-2b, the semiconductor layer 230 disposed on the dielectric layer 280 and the metallic conductive layer 224, the gate structure 260 (including the gate dielectric layer 262 and the gate electrode 264 located on the gate dielectric layer 262) disposed on the semiconductor layer 230 over the dielectric layer 280, and the pair of spacers 270 disposed on the semiconductor layer 230 over the dielectric layer 280. In some embodiments, each of the first active portions 222-2a and a respective portion of the metallic conductive layer 224 overlying thereto together constitute one conductive element 220A, where the first active portion 222-2a is referred to as an inner portion of a respective one conductive element 220A, and the metallic conductive layer 224 is referred to as an outer portion of the respective one conductive element 220A. In some embodiments, the gate structure 260 and the spacers 270 are separated from the poly-material pattern 222' through the dielectric layer 280 and the semiconductor layer 230, where the semiconductor layer 230 is in contact with the gate structure 260, the dielectric layer 280, and the conductive elements 220A. The semiconductor layer 230 is sandwiched between the gate structure 260 and the dielectric layer 280. As shown in FIG. 23 and FIG. 24, the gate structure 260 is not overlapped with the conductive elements 220A on the X-Y plane. In some embodiments, the gate structure 260 and the spacers 270 are located between the conductive elements 220A, where the gate structure 260 is sandwiched between the spacers 270. As illustrated in FIG. 24, the sidewalls of the gate dielectric layer 262 and the gate electrode 264 are in contact with the spacers 270.

In addition, the cross-sectional view of one conductive element 220A of the semiconductor device 60 taken along a cross-sectional line EE' depicted in FIG. 23 is the same as the cross-section view of the conductive element 220A of the semiconductor device 50A shown in FIG. 20F, and thus is omitted for simplicity. However, the disclosure is not limited. In an alternative embodiment, the cross-sectional view of one conductive element 220A of the semiconductor device 60 taken along the cross-sectional line EE' depicted in FIG. 23 may be the same as the cross-section view of the conductive element 220B of the semiconductor device 50B shown in FIG. 21A or the cross-section view of the conductive element 220C of the semiconductor device 50C shown in FIG. 21B.

For example, the semiconductor device 60 may be formed by the processes illustrated in steps S61 to S68 of FIG. 25, for example. In some embodiments, the substrate 200 is provided, and the poly-material pattern 222' is then formed on the dielectric layer 210 and over the substrate 200, in accordance with step S61 of FIG. 25. Prior to the formation of the poly-material pattern 222', the dielectric layer 210 is formed over the substrate 200. The material and/or forming method of the poly-material pattern 222' is the same or similar to the material and/or forming method of the poly-material pattern 222 described in FIG. 19A and FIG. 20A; thus, are not repeated herein. In some embodiments, the cap layer 202 is formed to cover the first active portions 222-2a of the poly-material pattern 222', in accordance with step S62 of FIG. 25. In some embodiments, the dielectric layer 280 is then formed on the second active portion 222-2b of the poly-material pattern 222', in accordance with step S63 of FIG. 25. In some embodiments, the cap layer 202 is removed from the poly-material pattern 222', in accordance with step S64 of FIG. 25. In some embodiments, a metallic conductive layer 220M is formed over the substrate 200, in accordance with step S65 of FIG. 25. In some embodiments, the metallic conductive layer 220M is patterned to form the conductive elements 220A, in accordance with step S65 of FIG. 25. In some embodiments, the semiconductor layer 230 is formed over the substrate 200, in accordance with step S66 of FIG. 25. In some embodiments, the gate structure 260 is formed over the substrate 200, in accordance with step S67 of FIG. 25. In some embodiments, the pair of spacers 270 are formed on sidewalls of the gate structure 260 over the substrate 200, in accordance with step S68 of FIG. 25.

In some embodiments, the poly-material pattern 222' is extended along the direction X, where the second active region 222-2b is sandwiched between the first active portions 222-2a. In some embodiments, the gate structure 260 and the spacers 270 are individually extended along the direction Y. However, the disclosure is not limited thereto. In other embodiments, the poly-material pattern 222' may be extended along the direction Y, while the gate structure 260 and the spacers 270 may be individually extended along the direction X. In some embodiments, the conductive elements 220A are spaced apart to each other with a distance D4 therebetween, where the distance D4 is approximately ranging from 5 nm to 10 μm. In some embodiments, the conductive elements 220A each has a length L4 ranging approximately from 10 nm to 500 nm along the direction X, and a height H4 ranging approximately from 30 nm to 300 nm along the direction Z. In some embodiments, each of the conductive elements 220A has a width W4 (e.g. W4=W4a+2*W4b), where along the direction Y, a width W4a of each of the conductive elements 220A is approximately ranging from 5 nm to 500 nm, and along the direction Z, a width W4b of each of the conductive elements 220A is approximately ranging from 10 nm to 100 nm.

In such embodiment, the conductive elements 220A are respectively referred to as a source/drain element of the semiconductor device 60 depicted FIG. 23 and FIG. 24, where the semiconductor layer 230 sandwiched between the conductive elements 220A and overlapped with the gate electrode 264 is referred to as a channel (portion) of the semiconductor device 60, and a conduction status of the channel is controlled by a voltage applied onto the gate electrode 264. In other words, the gate electrode 264 serves as the gate of the semiconductor device 60 to provide a channel control of the semiconductor device 60 (e.g., turn on or turn off the channel of the semiconductor device 60). Owing to the conductive elements 220A (e.g. the inner portions), the adhesion strength between the source/drain elements (e.g. the conductive elements 220A) of the semiconductor device 60 and the dielectric layer 210 is greatly enhanced, thereby peeling issue occurring at an interface of the source/drain elements of the semiconductor device 60 and the dielectric layer 210 in a thermal treatment is suppressed; thus, the yield of the semiconductor devices 60 is increased. In addition, the conductive elements 220A serve as the seed layer to promote the formation of the semiconductor layer 230, the sulfidation in the source/drain elements of the semiconductor device 60 is greatly suppressed due to the presence of the inner portions; thus, the performance of the semiconductor device 60 is improved.

However, the disclosure is not limited thereto. In some embodiments, the semiconductor device of the disclosure may include more than one gate structure.

Figure 26:
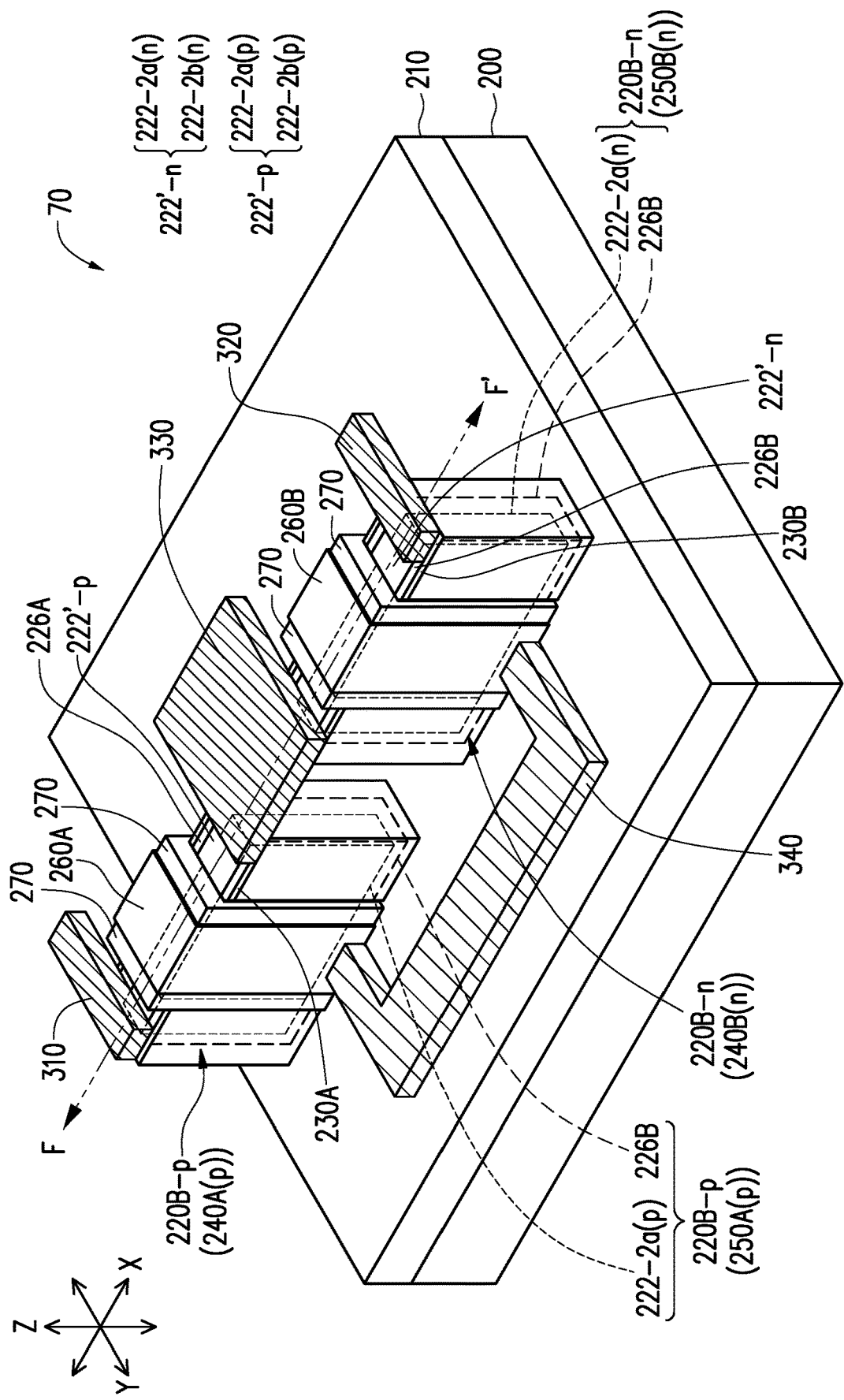
FIG. 26 is a schematic perspective view of a semiconductor device in accordance with some embodiments of the disclosure.
Figure 27:
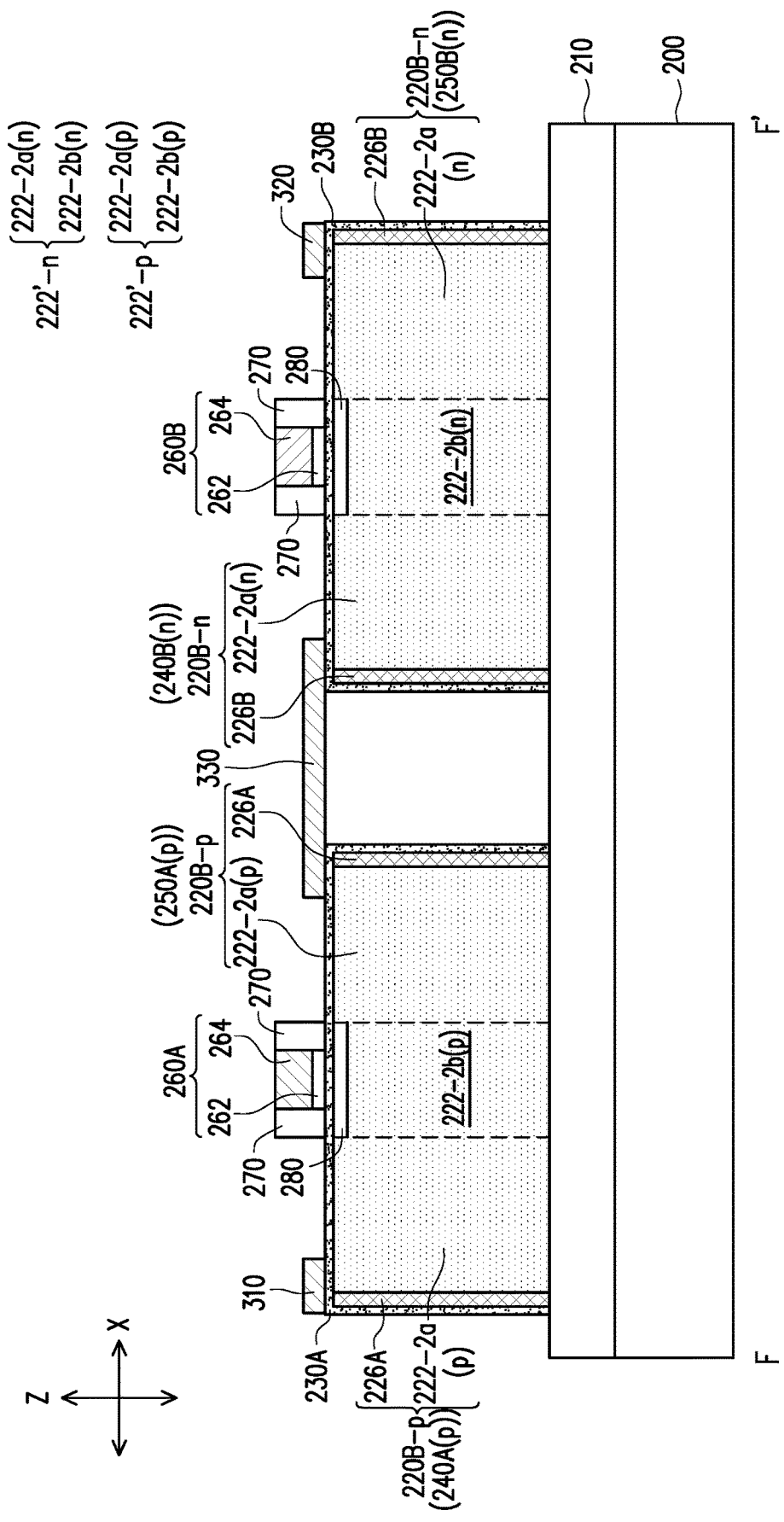
FIG. 27 is a schematic cross-sectional view illustrating different regions of a semiconductor device in accordance with some embodiments of the disclosure.

FIG. 26 is a schematic perspective view of a semiconductor device 70 in accordance with some embodiments of the disclosure. FIG. 27 is a schematic cross-sectional view illustrating different regions of the semiconductor device 70 depicted in FIG. 26 taken along a cross-sectional line FF'. The elements similar to or substantially the same as the elements described above will use the same reference numbers, and certain details or descriptions (e.g. materials and forming methods) of the same elements and the relationship thereof (e.g. the relative positioning configuration and electrical connection) will not be repeated herein.

As illustrated in FIG. 26, for example, the semiconductor device 70 incudes the substrate 200, the dielectric layer 210, poly-material patterns 222'-n and 222'-p, metallic conductive layers 226A and 226B, semiconductor layers 230A and 230B, gate structures 260A and 260B, and two pairs of spacers 270. In some embodiments, the semiconductor device 70 further includes a first electrode 310, a second electrode 320, a common output electrode 330, and a common gate electrode 340. In some embodiments, the poly-material pattern 222'-n is made of polysilicon materials (such as doped polysilicon), poly-germanium materials (such as doped poly-germanium), poly-silicon-germanium materials (such as doped poly-silicon-germanium) with n-type dopants, such as phosphorus (P) or arsenic (As), while the poly-material pattern 222'-p is made of polysilicon materials (such as doped polysilicon), poly-germanium materials (such as doped poly-germanium), poly-silicon-germanium materials (such as doped poly-silicon-germanium) with p-type dopants, such as boron (B) or BF2. For example, as shown in FIG. 27, the poly-material patterns 222'-n and 222'-p each are extended along the direction X, where the poly-material pattern 222'-n have two first active regions 222-2a(n) and one second active region 222-2b(n) sandwiched therebetween, and the poly-material pattern 222'-p have two first active regions 222-2a(p) and one second active region 222-2b(p) sandwiched therebetween. In some embodiments, the metallic conductive layer 226A is disposed on the sidewalls of the first active regions 222-2a(p) to form the conductive elements 220B-p while the metallic conductive layer 226B is disposed on the sidewalls of the first active regions 222-2a(n) to form the conductive elements 220B-n. However, the disclosure is not limited thereto; in other embodiments, the conductive elements 220B-p and the conductive elements 220B-n may be independently replaced with the conductive elements 220A or the conductive elements 220C as described above as long as the poly-material patterns thereof respectively have different types of dopants (e.g. either a n-type dopant or a p-type dopant).

In some embodiments, by thermal oxidation, the dielectric layer 280 is formed at an outer surface of the second active portion 222-2b(p) of the poly-material pattern 222'-p exposed by the metallic conductive layer 226A and an outer surface of the second active portion 222-2b(n) of the poly-material pattern 222'-n exposed by the exposed by the metallic conductive layer 226B. In some embodiments, the semiconductor layer 230A is formed over the second active portion 222-2b(p) of the poly-material pattern 222'-p and the metallic conductive layer 226A while the semiconductor layer 230B is formed over the second active portion 222-2b(n) of the poly-material pattern 222'-n and the metallic conductive layer 226B. In some embodiments, the gate structure 260A (including a gate dielectric layer 262 and a gate electrode 264 disposed on the gate dielectric layer 262) is disposed on the semiconductor layer 230A over the second active portion 222-2b(p) of the poly-material pattern 222'-p, while the gate structure 260B (including a gate dielectric layer 262 and a gate electrode 264 disposed on the gate dielectric layer 262) is disposed on the semiconductor layer 230B over the second active portion 222-2b(n) of the poly-material pattern 222'-n. In some embodiments, one pair of the spacers 270 are disposed at two opposite sides of the gate structure 260A along the direction X and located on the semiconductor layer 230A over the second active portion 222-2b(p) of the poly-material pattern 222'-p, while other one pair of the spacers 270 are disposed at two opposite sides of the gate structure 260B along the direction X and located on the semiconductor layer 230B over the second active portion 222-2b(n) of the poly-material pattern 222'-n.

In the semiconductor device 70, for example, the conductive elements 220B-p are respectively referred to as a source/drain element corresponding to the gate structure 260A, and the semiconductor layer 230A sandwiched between the conductive elements 220B-p and overlapped with the gate structure 260A is referred to as a channel (portion) corresponding to the gate structure 260A. On the other hand, the conductive elements 220B-n are respectively referred to as a source/drain element corresponding to the gate structure 260B, and the semiconductor layer 230B sandwiched between the conductive elements 220B-n and overlapped with the gate structure 260B is referred to as a channel (portion) corresponding to the gate structure 260B. The gate structures 260A and the 260B are electrically connected to the common gate electrode 340, and thus are together referred to as a gate of the semiconductor device 70, for example. In some embodiments, one of the source/drain elements (e.g. 240A(p)) corresponding to the gate structure 260A is electrically connected to the first electrode 310, other one of the source/drain elements (e.g. 250A(p)) corresponding to the gate structure 260A and one of the source/drain elements (e.g. 240B(n)) corresponding to the gate structure 260B are electrically connected to the common output electrode 330, and other one of the source/drain elements (e.g. 250B(n)) corresponding to the gate structure 260B is electrically connected to the second electrode 320. The first electrode 310 may, for example, provide power voltage (e.g. greater than 0 voltage (V)), and the second electrode 320 may, for example, provide a ground voltage (e.g. 0V); or vice versa.

In some embodiments, an input signal from an external device/element (not shown) to the semiconductor device 70 is transmitted to the gate structures 260A and 260B through the common gate electrode 340, while an output signal from the semiconductor device 70 to the external device/element is transmitted from the source/drain element 250A(p) and the source/drain element 240B(n) through the common output electrode 330. Owing to the source/drain elements 240A(p), 250A(p) and the source/drain element 240B(n), 250B(n), the semiconductor device 70 may be referred to as a complementary semiconductor device with high noise resistance and low power computation. Due to the poly-material pattern 222'-p and the poly-material pattern 222'-n not only serve as the seed layers to promote the formation of the semiconductor layers 230A, 230B but also the source/drain elements 240A(p), 250A(p) and the source/drain element 240B(n), 250B(n), the sulfidation in the source/drain elements of the semiconductor device 70 is greatly suppressed; thus, the performance of the semiconductor device 70 is improved. In addition, the adhesion strength between the source/drain elements of the semiconductor device 70 and the dielectric layer 210 is greatly enhanced, thereby peeling issue occurring at an interface of the source/drain elements of the semiconductor device 70 and the dielectric layer 210 in a thermal treatment is suppressed; thus, the yield of the semiconductor devices 70 is increased.

In accordance with some embodiments, a semiconductor device includes a substrate, a first poly-material pattern, a first conductive element, a first semiconductor layer, and a first gate structure. The first poly-material pattern is over and protrudes outward from the substrate, wherein the first poly-material pattern includes a first active portion and a first poly-material portion joined to the first active portion. The first conductive element is over the substrate, wherein the first conductive element includes the first poly-material portion and a first metallic conductive portion covering at least one of a top surface and a sidewall of the first poly-material portion. The first semiconductor layer is over the substrate and covers the first active portion of the first poly-material pattern and the first conductive element. The first gate structure is over the first semiconductor layer located within the first active portion.

In accordance with some embodiments, a semiconductor device includes a substrate, a gate structure, a semiconductor layer, and at least one conductive element. The gate structure is disposed over a substrate. The semiconductor layer is disposed over the substrate, and a portion of the semiconductor layer is overlapped with the gate structure. The at least one conductive element is disposed over the substrate and covered by the semiconductor layer, wherein the at least one conductive element includes a poly-material portion and a metallic conductive portion covering the poly-material portion.

In accordance with some embodiments, a method of manufacturing a semiconductor device includes the following steps, providing a substrate; forming at least one first conductive element over the substrate, the at least one first conductive element including a first poly-material portion and a first metallic conductive portion covering at least one of a top surface and a sidewall of the first poly-material portion; forming a first semiconductor layer on the at least one first conductive element; and disposing a first gate structure over the substrate, the first gate structure being overlapped with a portion of the first semiconductor layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
a substrate;
a poly-material pattern, over and protruding outward from the substrate, wherein the poly-material pattern comprises an active portion and a poly-material portion joined to the active portion;
a conductive element, over the substrate, wherein the conductive element comprises the poly-material portion and a metallic conductive portion covering the poly-material portion;
a semiconductor layer, over the substrate and covering the active portion of the poly-material pattern and the conductive element;
a gate structure, over a portion of the semiconductor layer located within the active portion; and
source/drain elements, located over the substrate and disposed at two opposite sides of the gate structure, wherein the portion of the semiconductor layer is between the source/drain elements, and the conductive element is offset from the source/drain elements in a projection on the substrate along the stacking direction of the gate structure and the substrate.

2. The semiconductor device of claim 1, wherein a material of the poly-material portion comprises a polysilicon material, a poly-germanium material, or a poly-silicon-germanium material, and a material of the metallic conductive portion comprises a metal or a metal silicide, and
the metallic conductive portion covers at least one of a top surface and a sidewall of the poly-material portion.

3. The semiconductor device of claim 1, further comprising:
a first dielectric layer, over the substrate and between the poly-material pattern and the substrate;
a second dielectric layer, over the active portion, wherein the active portion is located between the first dielectric layer and the second dielectric layer, and the semiconductor layer is located between the second dielectric layer and the gate structure; and
a pair of spacers, over the second dielectric layer and disposed at two opposite sides of the gate structure.

4. The semiconductor device of claim 3, further comprising:
wherein the source/drain elements is located over the second dielectric layer, and each of the source/drain elements is separated from the gate structure by one of the spacers.

5. The semiconductor device of claim 1, wherein the conductive element is completely covered by the semiconductor layer.

6. The semiconductor device of claim 3, wherein the poly-material pattern is completely enclosed between the first dielectric layer and the semiconductor layer.

7. A semiconductor device, comprising:
a gate structure, disposed over a substrate;
a semiconductor layer, disposed over the substrate, a portion of the semiconductor layer being overlapped with the gate structure;
at least one conductive element, disposed over the substrate and covered by the semiconductor layer, wherein the at least one conductive element comprises:
a poly-material portion; and
a metallic conductive portion covering the poly-material portion; and
source/drain elements, disposed over the substrate and covered by the semiconductor layer, wherein the portion of the semiconductor layer is between the source/drain elements, and the at least one conductive element is offset from the source/drain elements in a projection on the substrate along the stacking direction of the gate structure and the substrate.

8. The semiconductor device of claim 7, wherein a material of the poly-material portion comprises a polysilicon material, a poly-germanium material, or a poly-silicongermanium material, and a material of the metallic conductive portion comprises a metal or a metal silicide, and
   the metallic conductive portion covers at least one of a top surface and a sidewall of the poly-material portion.

9. The semiconductor device of claim 7, wherein the gate structure is located between the substrate and the source/drain elements.

10. The semiconductor device of claim 7,
   wherein the source/drain elements are located between the substrate and the gate structure.

11. The semiconductor device of claim 9, wherein the at least one conductive element is enclosed by the gate structure and the semiconductor layer.

12. The semiconductor device of claim 10, further comprising a dielectric layer on the substrate, wherein the at least one conductive element is enclosed by the dielectric layer and the semiconductor layer.

* * * * *